US006658375B1

(12) United States Patent
McQuarrie et al.

(10) Patent No.: US 6,658,375 B1
(45) Date of Patent: Dec. 2, 2003

(54) COMPENSATION MODEL AND REGISTRATION SIMULATION APPARATUS AND METHOD FOR MANUFACTURING OF PRINTED CIRCUIT BOARDS

(75) Inventors: W. Gray McQuarrie, Phoenix, AZ (US); Bradley A. Jones, Cary, NC (US)

(73) Assignee: Isola Laminate Systems, Inc., LaCrosse, WI (US)

( * ) Notice: Subject to any disclaimer, the term of this patent is extended or adjusted under 35 U.S.C. 154(b) by 0 days.

(21) Appl. No.: 09/270,303

(22) Filed: Mar. 15, 1999

(51) Int. Cl.[7] .................. G06F 7/60; G06F 17/10; G06F 101/00
(52) U.S. Cl. .............. 703/2; 703/7; 702/85; 716/4; 29/830
(58) Field of Search .............. 703/1–2, 7, 13–22; 716/1–16; 702/85; 408/1 R; 324/207.11; 29/830

(56) References Cited

U.S. PATENT DOCUMENTS

| | | | | |
|---|---|---|---|---|
| 5,196,087 A | | 3/1993 | Kerns ................. 216/20 |
| 5,529,441 A | * | 6/1996 | Kosmowski et al. ....... 408/1 R |
| 5,831,854 A | | 11/1998 | Yamamoto et al. ......... 700/95 |
| 6,000,124 A | * | 12/1999 | Saito et al. ............. 29/830 |
| 6,030,154 A | * | 2/2000 | Whitcomb et al. ........ 408/1 R |

FOREIGN PATENT DOCUMENTS

CN 86118576 12/1998

OTHER PUBLICATIONS

James, "Tracking The Right Clues With Exploratory Data Analysis", IEEE Spectrum, vol. 35 Issue 7, pp. 58–65 (Jul. 1998).*

Tatibana et al, "Novel Automatic PCB Inspection Technique Based on Connectivity", IEEE Proceedings of the Brazilian Symposium on Computer Graphics and Image Processing, pp. 187–194 (Oct. 1997).*

Brennemann et al, "Sensor Based Registration and Stacking of Electronic Substrate Layers", IEEE Robotics & Automation Magazine, vol. 2 Issue 4, pp. 30–35 (Dec. 1995).*

Davis, "A Tour Through the Board Manufacturing Process", Printed Circuit Design, vol. 10 Issue 8, p. 11 et seq (downloaded text version)(Aug. 1993).*

Kelley et al., "Multilayer Printed Circuits with Exacting Registration Requirements, Achieving Next Generation Design Capabilities", *Proceedings of IPC Printed Circuits Expo '98*, Long Beach, CA pp. S16–3–1 to S16–3–17 (1998).

Holmes et al., "Statistical Model for Internal Registration Yield," *Proceedings of IPC Techworks '96*, Naples, FLA, USA, pp. F15–1 to F15–9 (1996).

Wiley, "Registration Control for Multilayer Circuit Boards," *IBM Technical Disclosure Bulletin*, vol. 21, pp. 3976–3978 (1979).

* cited by examiner

*Primary Examiner*—Samuel Broda
(74) *Attorney, Agent, or Firm*—McDonnell Boehnen Hulbert & Berghoff

(57) ABSTRACT

Methods and apparatuses are provided for modeling the compensation error and simulating registration error of a multilayer printed circuit board. Experiments are conducted in order to model compensation error which factor one or a combination of the following: the dielectric layer, the position of the core in the stack, the circuit configuration, the assembly of the printed circuit board, and the interaction between the core and the dielectric layer. The registration simulator combines the sources of registration error in an interdependent manner so as to model overall registration error over the panel surface.

65 Claims, 43 Drawing Sheets

|  | signal/signal | | signal/plane | | plane/plane | | range | |
|---|---|---|---|---|---|---|---|---|
| core | Warp | Fill | Warp | Fill | Warp | Fill | Warp | Fill |
| 2 | 13.986 | -1.056 | 12.726 | -4.056 | 9.99 | -5.04 | 3.996 | 3.984 |
| 4 | 17.982 | -1.056 | 16.722 | -4.056 | 13.986 | -5.04 | 3.996 | 3.984 |
| 5 | 15.246 | 1.992 | 13.986 | -1.008 | 11.25 | -1.992 | 3.996 | 3.984 |
| 6 | 13.986 | 4.992 | 12.726 | 1.992 | 9.99 | 1.008 | 3.996 | 3.984 |
| 8 | 12.996 | 3 | 11.736 | 0 | 9 | -1.008 | 3.996 | 4.008 |
| 10 | 13.986 | 9.024 | 12.726 | 6.024 | 9.99 | 5.04 | 3.996 | 3.984 |
| range | 4.986 | 10.08 | 4.986 | 10.08 | 4.986 | 10.08 | | |

Figure 1

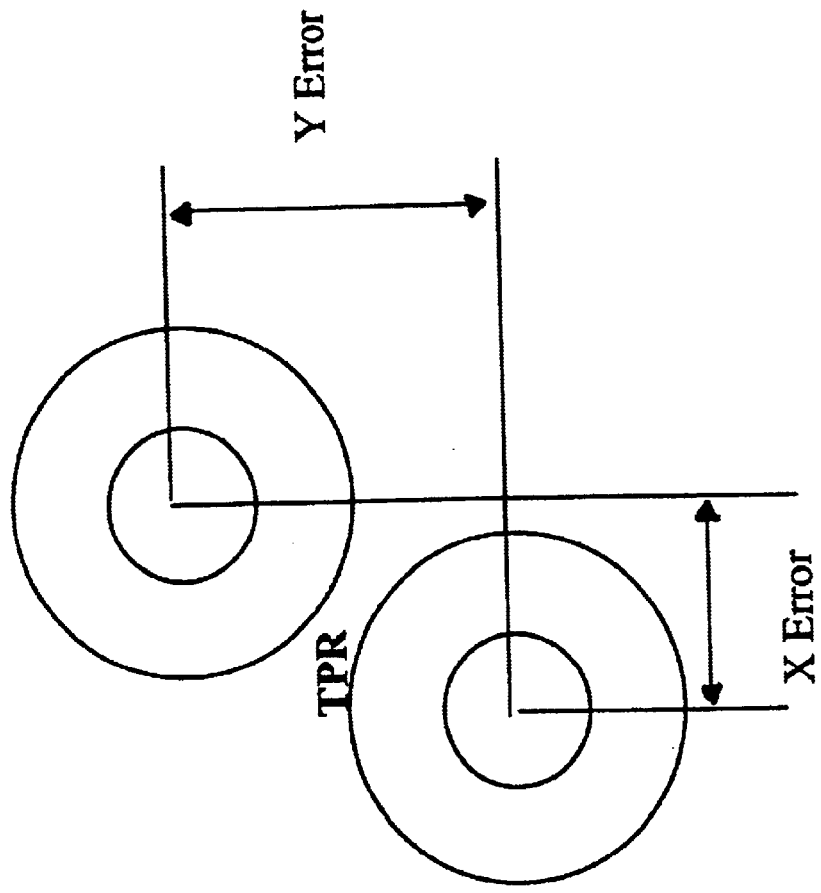
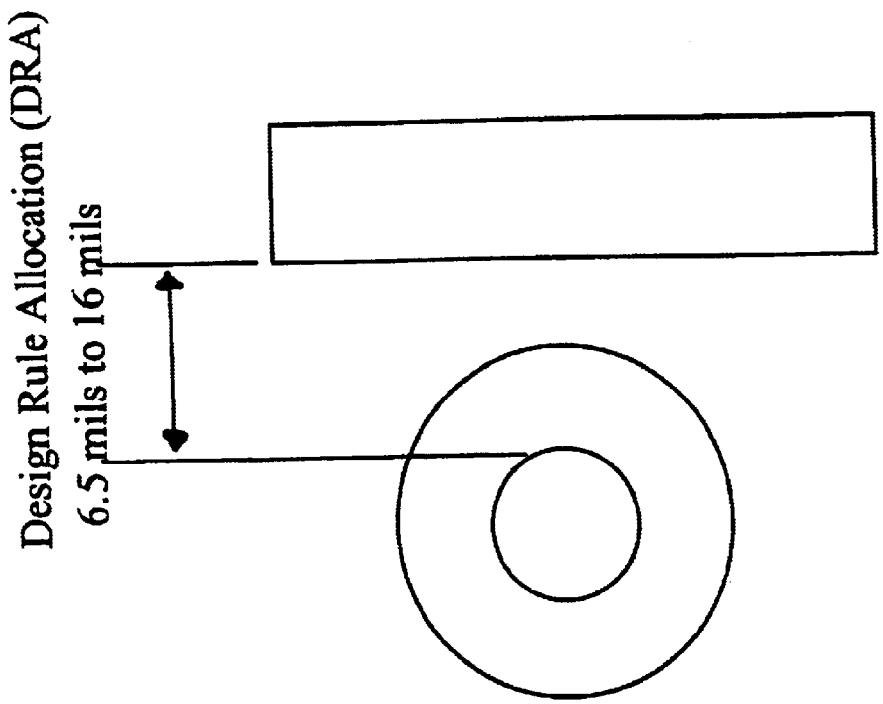
Figure 4a

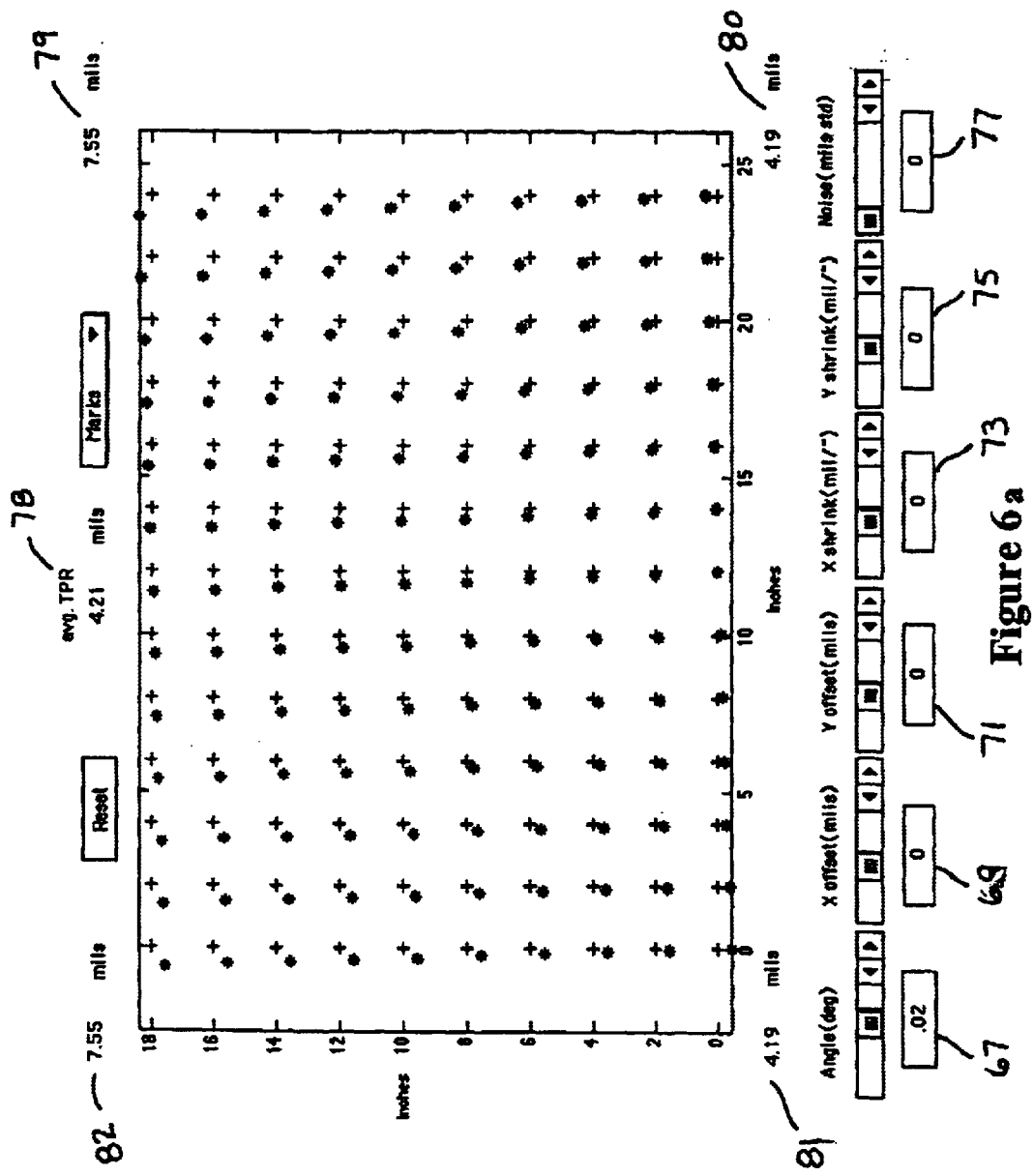

| config | Experimental Design | | | | Experimental Results | | | | | |
|---|---|---|---|---|---|---|---|---|---|---|
| | dielectric | time | machine | | m23x | m23y | m45x | m45y | m67x | m67y |
| 1 | 1 | 1 | 1 | | -16.9 | -1.69 | -11.61 | -6.395 | -14.94 | -8.8904 |
| 2 | 2 | 2 | 3 | | -10.825 | -6.58 | -13.85 | -7.335 | -9.77 | -6.13 |
| 3 | 3 | 3 | 4 | | -11.39 | -2.9781 | -19.25 | -0.3043 | -12.9 | -1.1336 |
| 4 | 4 | 4 | 2 | | -11.115 | -6.29 | -10.165 | -8.91 | -11.58 | -5.67 |
| 1 | 2 | 1 | 4 | | -13.45 | 1.707 | -9.265 | -3.4845 | -12.53 | 1.955 |
| 2 | 1 | 2 | 2 | | -13.6 | -4.68 | -16.35 | -6.25 | -11.8 | -4.45 |
| 3 | 4 | 3 | 1 | | -7.685 | -9.625 | -13.25 | -11.295 | -7.725 | -10.19 |
| 4 | 3 | 4 | 3 | | -12.45 | 0.2035 | -10.655 | -0.6865 | -12.15 | 0.0343 |
| 1 | 3 | 1 | 3 | | -17.18 | 4.325 | -11.95 | -1.2911 | -18.545 | 4.235 |
| 2 | 4 | 2 | 1 | | -3.695 | -7.93 | -8.65 | -9.755 | -3.2575 | -8.455 |
| 3 | 1 | 3 | 2 | | -16.1 | -4.805 | -21.75 | -4.127 | -16.3 | -5.04 |
| 4 | 2 | 4 | 4 | | -11.675 | -4.455 | -10.95 | -6.48 | -11.105 | -5.01 |
| 1 | 4 | 1 | 2 | | -13.085 | -5.8371 | -6.49 | -8.735 | -12.2055 | -4.5514 |
| 2 | 3 | 2 | 4 | | -12.7143 | -1.2569 | -17.0714 | -1.1134 | -11.2857 | -1.5143 |
| 3 | 2 | 3 | 1 | | -10.645 | -9.445 | -15.95 | -7.145 | -10.0535 | -6.2205 |
| 4 | 1 | 4 | 3 | | -14.1 | -1.032 | -12.4 | -4.2146 | -14.25 | -0.2491 |
| | Rsquare | | | | 0.87 | 0.91 | 0.9 | 0.78 | | |
| | Range | | | | 13.49 | 13.95 | 15.26 | 10.99 | 13.29 | 14.43 |
| | Average | | | | 12.29 | 3.77 | 13.1 | 5.47 | 11.77 | 3.83 |
| | GavgX | | | | 12.39 | | | | | |
| | GavgY | | | | 4.36 | | | | | | config:
1 = ss gg ss
2 = gg ss gg
3 = gs ss sg
4 = gs gg sg dielectric
1 = prepreg 1080
2 = prepreg 2113
3 = prepreg 2116
4 = prepreg 7628

Figure 10a

| config | Experimental Design | | | Experimental Results | | | | | | |
|---|---|---|---|---|---|---|---|---|---|---|
| | dielectric | time | machine | m23x | m23y | m45x | m45y | m67x | m67y |
| 1 | 1 | 1 | 1 | -14.466 | -4.081 | -13.316 | -7.2815 | -15.0405 | -5.5465 |
| 2 | 2 | 2 | 1 | -4.9 | -8.009 | -9.506 | -7.7765 | -4.3925 | -7.9685 |
| 3 | 3 | 3 | 1 | -9.1 | -2.127 | -15.354 | -3.542 | -9.973 | -2.328 |
| 4 | 4 | 4 | 1 | -5.7385 | -6.777 | -7.8975 | -6.036 | -4.2515 | -5.2935 |
| 1 | 2 | 2 | 2 | -14.4165 | -16.573 | -11.4265 | -8.7675 | -14.494 | -15.283 |
| 2 | 4 | 4 | 2 | -10.5935 | -4.7045 | -14.656 | -3.856 | -10.399 | -4.782 |
| 3 | 1 | 4 | 2 | 2.4085 | 4.3645 | -6.2685 | -8.1545 | 2.3755 | 3.9795 |
| 4 | 3 | 3 | 2 | -11.652 | -3.66 | -16.0735 | -0.6945 | -10.9895 | -1.5 |
| 1 | 3 | 2 | 3 | -19.665 | -11.8515 | -15.322 | -1.5405 | -18.706 | -9.294 |
| 2 | 4 | 4 | 3 | -6.4039 | -2.8306 | -9.4711 | -2.85 | -6.5878 | -3.2461 |
| 3 | 4 | 1 | 3 | -15.613 | -3.921 | -20.624 | -3.659 | -15.9545 | -3.4985 |
| 4 | 1 | 3 | 3 | -1.7265 | 0.245 | -6.5505 | -9.943 | -2.662 | -1.8405 |
| 1 | 4 | 3 | 4 | -7.263 | 2.398 | -8.5175 | -3.654 | -8.069 | 1.464 |
| 2 | 3 | 1 | 4 | -7.0725 | -3.17 | -14.4775 | -4.1425 | -6.9931 | -2.5906 |
| 3 | 2 | 2 | 4 | -9.4175 | -9.4119 | -13.5119 | -8.8994 | -9.4338 | -8.8594 |
| 4 | 1 | 1 | 4 | -13.739 | -7.063 | -17.158 | -3.406 | -12.8475 | -4.9925 |

Figure 10b config:
1 = ss gg ss
2 = gg ss gg
3 = gs ss sg
4 = gs gg sg dielectric
1 = prepreg 1080
2 = prepreg 2113
3 = prepreg 2116
4 = prepreg 7628

| config | Experimental Design | | | Experimental Results | | | | | |
|---|---|---|---|---|---|---|---|---|---|
| | dielectric | time | machine | m23x | m23y | m45x | m45y | m67x | m67y |
| 1 | 1 | 1 | 1 | -8.55 | -7.66 | -0.8 | -1.1 | -8.5 | -8.19 |
| 2 | 2 | 2 | 3 | -5.67 | -10.08 | -10.09 | -9.98 | -5.33 | -8.57 |
| 3 | 3 | 3 | 4 | -7.78 | -2.37 | -9.66 | -2.3 | -7.66 | -0.71 |
| 4 | 4 | 4 | 2 | -3.35 | -9.93 | -5.08 | -10.43 | -3.63 | -9.6 |
| 2 | 1 | 2 | 2 | -11.17 | -9.05 | -13.76 | -9.17 | -10.51 | -8.39 |
| 1 | 2 | 1 | 4 | -5.55 | -10.3 | 2.61 | -3.88 | -5.32 | -10.9 |
| 4 | 3 | 4 | 3 | -7.67 | -4.53 | -6.72 | -5.06 | -7.35 | -4.85 |
| 3 | 4 | 3 | 1 | -5.8 | -4.36 | -7.95 | -4.94 | -5.7 | -3.59 |
| 3 | 1 | 3 | 1 | -3.46 | -8.32 | -4.22 | -8.83 | -4.66 | -8.48 |
| 4 | 2 | 4 | 3 | -10.81 | -8.78 | -13.47 | -9.12 | -11.15 | -7.77 |
| 1 | 3 | 1 | 4 | -4.19 | -7.48 | -5.45 | -7.86 | -4.49 | -7.32 |
| 2 | 4 | 2 | 2 | -9.09 | -5.81 | -0.04 | 0.42 | -8.72 | -7.75 |
| 4 | 1 | 4 | 4 | -8.23 | -7.68 | -7.95 | -8.23 | -7.83 | -7.87 |
| 3 | 2 | 3 | 2 | -0.08 | -3.72 | -0.66 | -4.46 | 0.25 | -4.03 |
| 1 | 4 | 1 | 3 | -9.53 | -14.02 | -4.45 | -7.5 | -9.7 | -13.3 |
| 2 | 3 | 2 | 1 | -8.19 | -6.66 | -13.13 | -6.37 | -7.38 | -4.59 |

Figure 10c config:
1 = ss gg ss
2 = gg ss gg
3 = gs ss sg
4 = gs gg sg dielectric
1 = prepreg 1080
2 = prepreg 2113
3 = prepreg 2116
4 = prepreg 7628

Figure 11a

| 4mil - Warp | 98 | 99 pp1 | 99a | 99b pp2 | 100 | Outer pp3 | 101 | pp4 | 102 |
|---|---|---|---|---|---|---|---|---|---|
| intrcept | -12.288 | -12.288 | 1 | -12.288 | 1 | -12.288 | 1 | -12.288 | 1 |
| config(1) | -2.86567 | 0 | 0 | 0 | 0 | 0 | 0 | 0 | 0 |
| config(2) | 2.0795 | 2.0795 | 1 | 2.0795 | 1 | 2.0795 | 1 | 2.0795 | 1 |
| config(3) | 0.83308 | 0 | 0 | 0 | 0 | 0 | 0 | 0 | 0 |
| config(4) | -0.04691 | 0 | 0 | 0 | 0 | 0 | 0 | 0 | 0 |
| prepreg(1) | -2.88692 | 0 | 0 | 0 | 0 | -2.88692 | 1 | 0 | 0 |
| prepreg(2) | 0.63933 | 0.63933 | 1 | 0 | 0 | 0 | 0 | 0.63933 | 1 |
| prepreg(3) | -1.145491 | 0 | 0 | -1.145491 | 1 | 0 | 0 | 0 | 0 |
| prepreg(4) | 3.393081 | 0 | 0 | 0 | 0 | 0 | 0 | 0 | 0 |
| config(1)xprepreg(1) | 1.14067 | 0 | 0 | 0 | 0 | 0 | 0 | 0 | 0 |
| config(1)xprepreg(2) | 1.06442 | 0 | 0 | 0 | 0 | 0 | 0 | 0 | 0 |
| config(1)xprepreg(3) | -0.880759 | 0 | 0 | 0 | 0 | 0 | 0 | 0 | 0 |
| config(1)xprepreg(4) | -1.32433 | 0 | 0 | 0 | 0 | 0 | 0 | 0 | 0 |
| config(2)xprepreg(1) | -0.50451 | 0 | 0 | 0 | 0 | -0.50451 | 1 | 0 | 0 |
| config(2)xprepreg(2) | -1.255759 | -1.255759 | 1 | 0 | 0 | 0 | 0 | -1.255759 | 1 |
| config(2)xprepreg(3) | -1.36022 | 0 | 0 | -1.36022 | 1 | 0 | 0 | 0 | 0 |
| config(2)xprepreg(4) | 3.120489 | 0 | 0 | 0 | 0 | 0 | 0 | 0 | 0 |
| config(3)xprepreg(1) | -1.75808 | 0 | 0 | 0 | 0 | 0 | 0 | 0 | 0 |
| config(3)xprepreg(2) | 0.17067 | 0 | 0 | 0 | 0 | 0 | 0 | 0 | 0 |
| config(3)xprepreg(3) | 1.210491 | 0 | 0 | 0 | 0 | 0 | 0 | 0 | 0 |
| config(3)xprepreg(4) | 0.376919 | 0 | 0 | 0 | 0 | 0 | 0 | 0 | 0 |
| config(4)xprepreg(1) | 1.12192 | 0 | 0 | 0 | 0 | 0 | 0 | 0 | 0 |
| config(4)xprepreg(2) | 0.02067 | 0 | 0 | 0 | 0 | 0 | 0 | 0 | 0 |
| config(4)xprepreg(3) | 1.030488 | 0 | 0 | 0 | 0 | 0 | 0 | 0 | 0 |
| config(4)xprepreg(4) | -2.173078 | 0 | 0 | 0 | 0 | 0 | 0 | 0 | 0 |
|  | -0.601385 | -10.82 |  | -12.71 |  | -13.60 |  | -10.82 |  |

Figure 11a

4mil - Fill

| | | Outer | | | |
|---|---:|---:|---:|---:|---:|
| | (98) | pp1 (99) | pp2 (100) | pp3 (101) | pp4 (102) |
| Intrcept | -3.773 | 1 | 1 | 1 | 1 |
| config(1) | 3.399259 | 0 | 0 | 0 | 0 |
| config(2) | -1.338667 | 1 | 1 | 1 | 1 |
| config(3) | -2.94024 | 0 | 0 | 0 | 0 |
| config(4) | 0.879648 | 0 | 0 | 0 | 0 |
| prepreg(1) | 0.721285 | 1 | 0 | 0 | 0 |
| prepreg(2) | -0.920215 | 0 | 1 | 0 | 0 |
| prepreg(3) | 3.846421 | 0 | 0 | 1 | 0 |
| prepreg(4) | -3.64749 | 0 | 0 | 0 | 1 |
| config(1)xprepreg(1) | -2.03751 | 0 | 0 | 0 | 0 |
| config(1)xprepreg(2) | 3 | 0 | 0 | 0 | 0 |
| config(1)xprepreg(3) | 0.85235 | 0 | 0 | 0 | 0 |
| config(1)xprepreg(4) | -1.81484 | 0 | 0 | 0 | 0 |
| config(2)xprepreg(1) | -0.289571 | 1 | 0 | 0 | 0 |
| config(2)xprepreg(2) | -0.548071 | 0 | 1 | 0 | 0 |
| config(2)xprepreg(3) | 0.008437 | 0 | 0 | 1 | 0 |
| config(2)xprepreg(4) | 0.829205 | 0 | 0 | 0 | 1 |
| config(3)xprepreg(1) | 1.18699 | 0 | 0 | 0 | 0 |
| config(3)xprepreg(2) | -1.81151 | 0 | 0 | 0 | 0 |
| config(3)xprepreg(3) | -0.111246 | 0 | 0 | 0 | 0 |
| config(3)xprepreg(4) | 0.735766 | 0 | 0 | 0 | 0 |
| config(4)xprepreg(1) | 1.140091 | 0 | 0 | 0 | 0 |
| config(4)xprepreg(2) | -0.640419 | 0 | 0 | 0 | 0 |
| config(4)xprepreg(3) | -0.749541 | 0 | 0 | 0 | 0 |
| config(4)xprepreg(4) | 0.249869 | 0 | 0 | 0 | 0 |
| | -0.274165 | -6.58 | -1.26 | -4.68 | -6.58 |

Figure 11b

| 5mil - Warp | | pp1 | | pp2 | | pp3 | | pp4 | |
|---|---|---|---|---|---|---|---|---|---|
| intercept | -9.334899 | 1 | -9.334899 | 1 | -9.334899 | 1 | -9.334899 | 1 | -9.334899 |
| config(1) | -4.61773 | 0 | 0 | 0 | 0 | 0 | 0 | 0 | 0 |
| config(2) | 2.092427 | 1 | 2.092427 | 1 | 2.092427 | 1 | 2.092427 | 1 | 2.092427 |
| config(3) | 1.404399 | 0 | 0 | 0 | 0 | 0 | 0 | 0 | 0 |
| config(4) | 1.120904 | 0 | 0 | 0 | 0 | 0 | 0 | 0 | 0 |
| prepreg(1) | -4.267976 | 0 | 0 | 0 | 0 | 1 | -4.267976 | 0 | 0 |
| prepreg(2) | 1.719774 | 1 | 1.719774 | 0 | 0 | 0 | 0 | 1 | 1.719774 |
| prepreg(3) | -2.537476 | 0 | 0 | 1 | -2.537476 | 0 | 0 | 0 | 0 |
| prepreg(4) | 5.085678 | 0 | 0 | 0 | 0 | 0 | 0 | 0 | 0 |
| config(1)xprepreg(1) | 3.7546 | 0 | 0 | 0 | 0 | 0 | 0 | 0 | 0 |
| config(1)xprepreg(2) | -2.183649 | 0 | 0 | 0 | 0 | 0 | 0 | 0 | 0 |
| config(1)xprepreg(3) | -3.174899 | 0 | 0 | 0 | 0 | 0 | 0 | 0 | 0 |
| config(1)xprepreg(4) | 1.603948 | 0 | 0 | 0 | 0 | 0 | 0 | 0 | 0 |
| config(2)xprepreg(1) | 0.916948 | 0 | 0 | 0 | 0 | 1 | 0.916948 | 0 | 0 |
| config(2)xprepreg(2) | 0.622698 | 1 | 0.622698 | 0 | 0 | 0 | 0 | 1 | 0.622698 |
| config(2)xprepreg(3) | 2.707448 | 0 | 0 | 1 | 2.707448 | 0 | 0 | 0 | 0 |
| config(2)xprepreg(4) | -4.247094 | 0 | 0 | 0 | 0 | 0 | 0 | 0 | 0 |
| config(3)xprepreg(1) | -3.414524 | 0 | 0 | 0 | 0 | 0 | 0 | 0 | 0 |
| config(3)xprepreg(2) | -3.20677 | 0 | 0 | 0 | 0 | 0 | 0 | 0 | 0 |
| config(3)xprepreg(3) | 1.367976 | 0 | 0 | 0 | 0 | 0 | 0 | 0 | 0 |
| config(3)xprepreg(4) | 5.253318 | 0 | 0 | 0 | 0 | 0 | 0 | 0 | 0 |
| config(4)xprepreg(1) | -1.257024 | 0 | 0 | 0 | 0 | 0 | 0 | 0 | 0 |
| config(4)xprepreg(2) | 4.767721 | 0 | 0 | 0 | 0 | 0 | 0 | 0 | 0 |
| config(4)xprepreg(3) | -0.900525 | 0 | 0 | 0 | 0 | 0 | 0 | 0 | 0 |
| config(4)xprepreg(4) | -2.610173 | 0 | 0 | 0 | 0 | 0 | 0 | 0 | 0 |
| | -0.2722222 | | -4.90 | | -7.07 | | -10.59 | | -4.90 |

Outer

Figure 11c

| Smt - Fill | 98 | pp1 | 99 | pp2 | Outer 100 | pp3 | 101 | pp4 | 102 |
|---|---|---|---|---|---|---|---|---|---|
| intrcept | -4.8245 | 1 | -4.8245 | 1 | -4.8245 | 1 | -4.8245 | 1 | -4.8245 |
| config(1) | -2.70238 | 0 | 0 | 0 | 0 | 0 | 0 | 0 | 0 |
| config(2) | 0.14598 | 1 | 0.14598 | 1 | 0.14598 | 1 | 0.14598 | 1 | 0.14598 |
| config(3) | 2.05065 | 0 | 0 | 0 | 0 | 0 | 0 | 0 | 0 |
| config(4) | 0.50575 | 0 | 0 | 0 | 0 | 0 | 0 | 0 | 0 |
| prepreg(1) | -0.12288 | 1 | 0 | 0 | 0 | 0 | -0.12288 | 0 | 0 |
| prepreg(2) | -3.6127 | 1 | -3.6127 | 0 | 0 | 0 | 0 | 0 | -3.6127 |
| prepreg(3) | -0.37793 | 0 | 0 | 1 | -0.37793 | 0 | 0 | 0 | 0 |
| prepreg(4) | 4.11351 | 0 | 0 | 0 | 0 | 0 | 0 | 0 | 0 |
| config(1)xprepreg(1) | 3.568754 | 0 | 0 | 0 | 0 | 0 | 0 | 0 | 0 |
| config(1)xprepreg(2) | -5.4334 | 0 | 0 | 0 | 0 | 0 | 0 | 0 | 0 |
| config(1)xprepreg(3) | -3.946996 | 0 | 0 | 0 | 0 | 0 | 0 | 0 | 0 |
| config(1)xprepreg(4) | 5.811642 | 0 | 0 | 0 | 0 | 0 | 0 | 0 | 0 |
| config(2)xprepreg(1) | 0.09689 | 0 | 0 | 0 | 0 | 1 | 0.09689 | 0 | 0 |
| config(2)xprepreg(2) | 0.282237 | 1 | 0.282237 | 0 | 0 | 0 | 0 | 1 | 0.282237 |
| config(2)xprepreg(3) | 1.886143 | 0 | 0 | 1 | 1.886143 | 0 | 0 | 0 | 0 |
| config(2)xprepreg(4) | -2.26527 | 0 | 0 | 0 | 0 | 0 | 0 | 0 | 0 |
| config(3)xprepreg(1) | -1.024277 | 0 | 0 | 0 | 0 | 0 | 0 | 0 | 0 |
| config(3)xprepreg(2) | -3.02531 | 0 | 0 | 0 | 0 | 0 | 0 | 0 | 0 |
| config(3)xprepreg(3) | 1.02447 | 0 | 0 | 0 | 0 | 0 | 0 | 0 | 0 |
| config(3)xprepreg(4) | 3.025117 | 0 | 0 | 0 | 0 | 0 | 0 | 0 | 0 |
| config(4)xprepreg(1) | -2.641367 | 0 | 0 | 0 | 0 | 0 | 0 | 0 | 0 |
| config(4)xprepreg(2) | 8.176473 | 0 | 0 | 0 | 0 | 0 | 0 | 0 | 0 |
| config(4)xprepreg(3) | 10.36383 | 0 | 0 | 0 | 0 | 0 | 0 | 0 | 0 |
| config(4)xprepreg(4) | -6.571489 | 0 | 0 | 0 | 0 | 0 | 0 | 0 | 0 |
|  | -0.333708 |  | -8.01 |  | -3.17 |  | -4.70 |  | -8.01 |

Figure 11d

Outer

| 8 mil - Warp | 98 | pp1 (99) | | pp2 (100) | | pp3 (101) | | pp4 (102) | |
|---|---|---|---|---|---|---|---|---|---|
| intrcept | -6.82 | 1 | -6.82 | 1 | -6.82 | 1 | -6.82 | 1 | -6.82 |
| config(1) | -1.36 | 0 | 0 | 0 | 0 | 0 | 0 | 0 | 0 |
| config(2) | -0.485 | 1 | -0.485 | 1 | -0.485 | 1 | -0.485 | 1 | -0.485 |
| config(3) | 0.7025 | 0 | 0 | 0 | 0 | 0 | 0 | 0 | 0 |
| config(4) | 1.1425 | 0 | 0 | 0 | 0 | 0 | 0 | 0 | 0 |
| prepreg(1) | -2.87 | 0 | 0 | 0 | 0 | 1 | -2.87 | 0 | 0 |
| prepreg(2) | 3.13 | 1 | 3.13 | 0 | 0 | 0 | 0 | 1 | 3.13 |
| prepreg(3) | -1.3625 | 0 | 0 | 1 | -1.3625 | 0 | 0 | 0 | 0 |
| prepreg(4) | 1.1025 | 0 | 0 | 0 | 0 | 0 | 0 | 0 | 0 |
| config(1)xprepreg(1) | 2.5 | 0 | 0 | 0 | 0 | 0 | 0 | 0 | 0 |
| config(1)xprepreg(2) | -0.5 | 0 | 0 | 0 | 0 | 0 | 0 | 0 | 0 |
| config(1)xprepreg(3) | 0.4525 | 0 | 0 | 0 | 0 | 0 | 0 | 0 | 0 |
| config(1)xprepreg(4) | -2.4525 | 0 | 0 | 0 | 0 | 0 | 0 | 0 | 0 |
| config(2)xprepreg(1) | -0.995 | 0 | 0 | 0 | 0 | 1 | -0.995 | 0 | 0 |
| config(2)xprepreg(2) | -1.495 | 1 | -1.495 | 0 | 0 | 0 | 0 | 1 | -1.495 |
| config(2)xprepreg(3) | 0.4775 | 0 | 0 | 1 | 0.4775 | 0 | 0 | 0 | 0 |
| config(2)xprepreg(4) | 2.0125 | 0 | 0 | 0 | 0 | 0 | 0 | 0 | 0 |
| config(3)xprepreg(1) | -1.8225 | 0 | 0 | 0 | 0 | 0 | 0 | 0 | 0 |
| config(3)xprepreg(2) | 2.9075 | 0 | 0 | 0 | 0 | 0 | 0 | 0 | 0 |
| config(3)xprepreg(3) | -0.3 | 0 | 0 | 0 | 0 | 0 | 0 | 0 | 0 |
| config(3)xprepreg(4) | -0.785 | 0 | 0 | 0 | 0 | 0 | 0 | 0 | 0 |
| config(4)xprepreg(1) | 0.3175 | 0 | 0 | 0 | 0 | 0 | 0 | 0 | 0 |
| config(4)xprepreg(2) | -0.9125 | 0 | 0 | 0 | 0 | 0 | 0 | 0 | 0 |
| config(4)xprepreg(3) | -0.63 | 0 | 0 | 0 | 0 | 0 | 0 | 0 | 0 |
| config(4)xprepreg(4) | 1.225 | 0 | 0 | 0 | 0 | 0 | 0 | 0 | 0 |
|  | -0.315 |  | -5.67 |  | -8.19 |  | -11.17 |  | -5.67 |

Figure 11e

Outer

| 8mil - Fill | 98 | pp1 (99) | | pp2 (100) | | pp3 (101) | | pp4 (102) | |
|---|---|---|---|---|---|---|---|---|---|
| Intercept | -7.546875 | 1 | -7.546875 | 1 | -7.546875 | 1 | -7.546875 | 1 | -7.546875 |
| config(1) | -1.9 | 0 | 0 | 0 | 0 | 0 | 0 | 0 | 0 |
| config(2) | -0.7706 | 1 | -0.7706 | 1 | -0.7706 | 1 | -0.7706 | 1 | -0.7706 |
| config(3) | 2.739375 | 0 | 0 | 0 | 0 | 0 | 0 | 0 | 0 |
| config(4) | -0.068775 | 0 | 0 | 0 | 0 | 0 | 0 | 0 | 0 |
| prepreg(1) | -0.74562 | 1 | -0.558125 | 0 | 0 | 0 | 0 | 0 | 0 |
| prepreg(2) | -0.558125 | 0 | 0 | 1 | 2.704375 | 0 | 0 | 0 | 0 |
| prepreg(3) | 2.704375 | 0 | 0 | 0 | 0 | 1 | -0.74562 | 0 | 0 |
| prepreg(4) | -1.40063 | 0 | 0 | 0 | 0 | 0 | 0 | 1 | -0.558125 |
| config(1)xprepreg(1) | 2.533125 | 0 | 0 | 0 | 0 | 0 | 0 | 0 | 0 |
| config(1)xprepreg(2) | -0.294375 | 0 | 0 | 0 | 0 | 0 | 0 | 0 | 0 |
| config(1)xprepreg(3) | 0.933125 | 0 | 0 | 0 | 0 | 0 | 0 | 0 | 0 |
| config(1)xprepreg(4) | -3.171875 | 0 | 0 | 0 | 0 | 0 | 0 | 0 | 0 |
| config(2)xprepreg(1) | 0.013125 | 1 | -1.204375 | 0 | 0 | 0 | 0 | 0 | 0 |
| config(2)xprepreg(2) | -1.204375 | 0 | 0 | 1 | -1.046875 | 0 | 0 | 0 | 0 |
| config(2)xprepreg(3) | -1.046875 | 0 | 0 | 0 | 0 | 1 | 0.013125 | 0 | 0 |
| config(2)xprepreg(4) | 2.238125 | 0 | 0 | 0 | 0 | 0 | 0 | 1 | -1.204375 |
| config(3)xprepreg(1) | -3.226875 | 0 | 0 | 0 | 0 | 0 | 0 | 0 | 0 |
| config(3)xprepreg(2) | 1.645625 | 0 | 0 | 0 | 0 | 0 | 0 | 0 | 0 |
| config(3)xprepreg(3) | -0.266875 | 0 | 0 | 0 | 0 | 0 | 0 | 0 | 0 |
| config(3)xprepreg(4) | 1.848125 | 0 | 0 | 0 | 0 | 0 | 0 | 0 | 0 |
| config(4)xprepreg(1) | 0.680625 | 0 | 0 | 0 | 0 | 0 | 0 | 0 | 0 |
| config(4)xprepreg(2) | -0.146875 | 0 | 0 | 0 | 0 | 0 | 0 | 0 | 0 |
| config(4)xprepreg(3) | 0.380625 | 0 | 0 | 0 | 0 | 0 | 0 | 0 | 0 |
| config(4)xprepreg(4) | -0.914375 | 0 | 0 | 0 | 0 | 0 | 0 | 0 | 0 |
|  | -0.419999 |  | -10.08 |  | -6.66 |  | -9.05 |  | -10.08 |

Figure 11f

| 4mil - Warp | (98) | pp1 (99) | | pp2 (100) | | pp3 (101) | | pp4 (102) | |
|---|---|---|---|---|---|---|---|---|---|
| intercept | -13.1004 | 1 | -13.1004 | 1 | -13.1004 | 1 | -13.1004 | 1 | -13.1004 |
| config(1) | 3.27165 | 0 | 0 | 0 | 0 | 0 | 0 | 0 | 0 |
| config(2) | -0.87995 | 1 | -0.87995 | 1 | -0.87995 | 1 | -0.87995 | 1 | -0.87995 |
| config(3) | -4.44959 | 0 | 0 | 0 | 0 | 0 | 0 | 0 | 0 |
| config(4) | 2.05789 | 0 | 0 | 0 | 0 | 0 | 0 | 0 | 0 |
| prepreg(1) | -2.427098 | 0 | 0 | 0 | 0 | 1 | -2.427098 | 0 | 0 |
| prepreg(2) | 0.5966518 | 1 | 0.5966518 | 0 | 0 | 0 | 0 | 1 | 0.5966518 |
| prepreg(3) | -1.631205 | 0 | 0 | 0 | 0 | 0 | 0 | 0 | 0 |
| prepreg(4) | 3.4616512 | 0 | 0 | 1 | 3.4616512 | 0 | 0 | 0 | 0 |
| config(1)xprepreg(1) | 0.6458482 | 0 | 0 | 0 | 0 | 0 | 0 | 0 | 0 |
| config(1)xprepreg(2) | -0.032902 | 0 | 0 | 0 | 0 | 0 | 0 | 0 | 0 |
| config(1)xprepreg(3) | -0.490045 | 0 | 0 | 0 | 0 | 0 | 0 | 0 | 0 |
| config(1)xprepreg(4) | -0.122901 | 0 | 0 | 0 | 0 | 0 | 0 | 0 | 0 |
| config(2)xprepreg(1) | 0.0574554 | 0 | 0 | 0 | 0 | 1 | 0.0574554 | 0 | 0 |
| config(2)xprepreg(2) | -0.466295 | 1 | -0.466295 | 0 | 0 | 0 | 0 | 1 | -0.466295 |
| config(2)xprepreg(3) | -1.459866 | 0 | 0 | 0 | 0 | 0 | 0 | 0 | 0 |
| config(2)xprepreg(4) | 1.8687056 | 0 | 0 | 1 | 1.8687056 | 0 | 0 | 0 | 0 |
| config(3)xprepreg(1) | -1.772902 | 0 | 0 | 0 | 0 | 0 | 0 | 0 | 0 |
| config(3)xprepreg(2) | 1.0033482 | 0 | 0 | 0 | 0 | 0 | 0 | 0 | 0 |
| config(3)xprepreg(3) | -0.068795 | 0 | 0 | 0 | 0 | 0 | 0 | 0 | 0 |
| config(3)xprepreg(4) | 0.8383488 | 0 | 0 | 0 | 0 | 0 | 0 | 0 | 0 |
| config(4)xprepreg(1) | 1.0695984 | 0 | 0 | 0 | 0 | 0 | 0 | 0 | 0 |
| config(4)xprepreg(2) | -0.504151 | 0 | 0 | 0 | 0 | 0 | 0 | 0 | 0 |
| config(4)xprepreg(3) | 2.018706 | 0 | 0 | 0 | 0 | 0 | 0 | 0 | 0 |
| config(4)xprepreg(4) | -2.584153 | 0 | 0 | 0 | 0 | 0 | 0 | 0 | 0 |
| | -0.769444 | | -13.85 | | -8.65 | | -16.35 | | -13.85 |

Inner

|  | 98 |  | pp1 (99) |  | pp2 (100) |  | pp3 (101) |  | pp4 (102) |
|---|---|---|---|---|---|---|---|---|---|
| 4mil - Fill |  |  |  |  | Inner |  |  |  |  |
| Intercept | -5.470089 | 1 | -5.470089 | 1 | -5.470089 | 1 | -5.470089 | 1 | -5.470089 |
| config(1) | 0.4936893 | 0 | 0 | 0 | 0 | 0 | 0 | 0 | 0 |
| config(2) | -0.643268 | 1 | -0.643268 | 1 | -0.643268 | 1 | -0.643268 | 1 | -0.643268 |
| config(3) | -0.247736 | 0 | 0 | 0 | 0 | 0 | 0 | 0 | 0 |
| config(4) | 0.3973147 | 0 | 0 | 0 | 0 | 0 | 0 | 0 | 0 |
| prepreg(1) | 0.2234393 | 0 | 0 | 0 | 0 | 1 | 0.2234393 | 0 | 0 |
| prepreg(2) | -0.641036 | 1 | -0.641036 | 0 | 0 | 0 | 0 | 1 | -0.641036 |
| prepreg(3) | 4.6212571 | 0 | 0 | 0 | 0 | 0 | 0 | 0 | 0 |
| prepreg(4) | -4.203668 | 0 | 0 | 1 | -4.203668 | 0 | 0 | 0 | 0 |
| config(1)xprepreg(1) | -1.642039 | 0 | 0 | 0 | 0 | 0 | 0 | 0 | 0 |
| config(1)xprepreg(2) | 2.1329357 | 0 | 0 | 0 | 0 | 0 | 0 | 0 | 0 |
| config(1)xprepreg(3) | -0.880759 | 0 | 0 | 0 | 0 | 0 | 0 | 0 | 0 |
| config(1)xprepreg(4) | 0.3896623 | 0 | 0 | 0 | 0 | 0 | 0 | 0 | 0 |
| config(2)xprepreg(1) | -0.360082 | 0 | 0 | 0 | 0 | 1 | -0.360082 | 0 | 0 |
| config(2)xprepreg(2) | -0.580607 | 1 | -0.580607 | 0 | 0 | 0 | 0 | 1 | -0.580607 |
| config(2)xprepreg(3) | 0.3786714 | 0 | 0 | 0 | 0 | 0 | 0 | 0 | 0 |
| config(2)xprepreg(4) | 0.5620176 | 0 | 0 | 1 | 0.5620176 | 0 | 0 | 0 | 0 |
| config(3)xprepreg(1) | 1.3673657 | 0 | 0 | 0 | 0 | 0 | 0 | 0 | 0 |
| config(3)xprepreg(2) | -0.786139 | 0 | 0 | 0 | 0 | 0 | 0 | 0 | 0 |
| config(3)xprepreg(3) | 0.7922679 | 0 | 0 | 0 | 0 | 0 | 0 | 0 | 0 |
| config(3)xprepreg(4) | -1.373515 | 0 | 0 | 0 | 0 | 0 | 0 | 0 | 0 |
| config(4)xprepreg(1) | 0.6347353 | 0 | 0 | 0 | 0 | 0 | 0 | 0 | 0 |
| config(4)xprepreg(2) | -0.76619 | 0 | 0 | 0 | 0 | 0 | 0 | 0 | 0 |
| config(4)xprepreg(3) | -0.29018 | 0 | 0 | 0 | 0 | 0 | 0 | 0 | 0 |
| config(4)xprepreg(4) | 0.4216347 | 0 | 0 | 0 | 0 | 0 | 0 | 0 | 0 |
|  | -0.305625 |  | -7.34 |  | -9.75 |  | -6.25 |  | -7.34 |

Figure 11h

| 5mil - Warp | (98) | pp1 (99) | pp2 (100) | pp3 (101) | pp4 (102) |
|---|---|---|---|---|---|
| intrcept | -12.50816 | 1 | 1 | 1 | 1 |
| config(1) | 0.362655 | 0 | 0 | 0 | 0 |
| config(2) | 0.4805026 | 1 | 1 | 1 | 1 |
| config(3) | -1.431438 | 0 | 0 | 0 | 0 |
| config(4) | 0.5882804 | 0 | 0 | 0 | 0 |
| prepreg(1) | -3.930345 | 0 | 0 | 1 | 0 |
| prepreg(2) | 2.2594366 | 1 | 0 | 0 | 1 |
| prepreg(3) | -2.798595 | 0 | 0 | 0 | 0 |
| prepreg(4) | 4.4695034 | 0 | 1 | 0 | 0 |
| config(1)xprepreg(1) | 2.7598446 | 0 | 0 | 0 | 0 |
| config(1)xprepreg(2) | -1.540437 | 0 | 0 | 0 | 0 |
| config(1)xprepreg(3) | -0.3779 | 0 | 0 | 0 | 0 |
| config(1)xprepreg(4) | -0.841508 | 0 | 0 | 0 | 0 |
| config(2)xprepreg(1) | 1.3019974 | 0 | 0 | 1 | 0 |
| config(2)xprepreg(2) | 0.2622161 | 1 | 0 | 0 | 1 |
| config(2)xprepreg(3) | 0.3487474 | 0 | 0 | 0 | 0 |
| config(2)xprepreg(4) | -1.912961 | 0 | 1 | 0 | 0 |
| config(3)xprepreg(1) | -2.754062 | 0 | 0 | 0 | 0 |
| config(3)xprepreg(2) | -1.881718 | 0 | 0 | 0 | 0 |
| config(3)xprepreg(3) | 1.3841884 | 0 | 0 | 0 | 0 |
| config(3)xprepreg(4) | 3.2515916 | 0 | 0 | 0 | 0 |
| config(4)xprepreg(1) | -1.30778 | 0 | 0 | 0 | 0 |
| config(4)xprepreg(2) | 3.1599389 | 0 | 0 | 0 | 0 |
| config(4)xprepreg(3) | -1.355036 | 0 | 0 | 0 | 0 |
| config(4)xprepreg(4) | -0.497123 | 0 | 0 | 0 | 0 |
|  | -0.528111 | -9.51 | -9.47 | -14.66 | -9.51 |

Inner

Figure 11i

Inner

| 5mil - Fill | | pp1 | | pp2 | | pp3 | | pp4 | |
|---|---|---|---|---|---|---|---|---|---|
| intrcept | -5.26268 | 1 | -5.26268 | 1 | -5.26268 | 1 | -5.26268 | 1 | -5.26268 |
| config(1) | -0.048195 | 0 | 0 | 0 | 0 | 0 | 0 | 0 | 0 |
| config(2) | 0.6064297 | 1 | 0.6064297 | 1 | 0.6064297 | 1 | 0.6064297 | 1 | 0.6064297 |
| config(3) | -0.801039 | 0 | 0 | 0 | 0 | 0 | 0 | 0 | 0 |
| config(4) | 0.2428043 | 0 | 0 | 0 | 0 | 0 | 0 | 0 | 0 |
| prepreg(1) | 0.7120547 | 0 | 0 | 0 | 0 | 1 | 0.7120547 | 0 | 0 |
| prepreg(2) | -3.583914 | 1 | -3.583914 | 0 | 0 | 0 | 0 | 1 | -3.583914 |
| prepreg(3) | 2.7828047 | 0 | 0 | 0 | 0 | 0 | 0 | 0 | 0 |
| prepreg(4) | 0.0890546 | 0 | 0 | 1 | 0.0890546 | 0 | 0 | 0 | 0 |
| config(1)xprepreg(1) | -2.68268 | 0 | 0 | 0 | 0 | 0 | 0 | 0 | 0 |
| config(1)xprepreg(2) | 0.1272891 | 0 | 0 | 0 | 0 | 0 | 0 | 0 | 0 |
| config(1)xprepreg(3) | 0.9875703 | 0 | 0 | 0 | 0 | 0 | 0 | 0 | 0 |
| config(1)xprepreg(4) | 1.5878206 | 0 | 0 | 0 | 0 | 0 | 0 | 0 | 0 |
| config(2)xprepreg(1) | 0.0881953 | 0 | 0 | 0 | 0 | 1 | 0.0881953 | 0 | 0 |
| config(2)xprepreg(2) | 0.4636641 | 1 | 0.4636641 | 0 | 0 | 0 | 0 | 1 | 0.4636641 |
| config(2)xprepreg(3) | -2.269055 | 0 | 0 | 0 | 0 | 0 | 0 | 0 | 0 |
| config(2)xprepreg(4) | 1.7171956 | 0 | 0 | 1 | 1.7171956 | 0 | 0 | 0 | 0 |
| config(3)xprepreg(1) | 1.6926641 | 0 | 0 | 0 | 0 | 0 | 0 | 0 | 0 |
| config(3)xprepreg(2) | 0.7482578 | 0 | 0 | 0 | 0 | 0 | 0 | 0 | 0 |
| config(3)xprepreg(3) | -0.261086 | 0 | 0 | 0 | 0 | 0 | 0 | 0 | 0 |
| config(3)xprepreg(4) | -2.179836 | 0 | 0 | 0 | 0 | 0 | 0 | 0 | 0 |
| config(4)xprepreg(1) | 0.9018206 | 0 | 0 | 0 | 0 | 0 | 0 | 0 | 0 |
| config(4)xprepreg(2) | -1.339211 | 0 | 0 | 0 | 0 | 0 | 0 | 0 | 0 |
| config(4)xprepreg(3) | 1.5425707 | 0 | 0 | 0 | 0 | 0 | 0 | 0 | 0 |
| config(4)xprepreg(4) | -1.10518 | 0 | 0 | 0 | 0 | 0 | 0 | 0 | 0 |
| | -0.324021 | | -7.78 | | -2.85 | | -3.86 | | -7.78 |

| | | pp1 | | pp2 | | pp3 | | pp4 | |
|---|---|---|---|---|---|---|---|---|---|
| 8 mil - Warp | | | | | Inner | | | | |
| intrcept | -6.299444 | | | | | | | | |
| config(1) | 5.636667 | 1 | -6.299444 | 1 | -6.299444 | 1 | -6.299444 | 1 | -6.299444 |
| config(2) | -4.308056 | 0 | 0 | 0 | 0 | 0 | 0 | 0 | 0 |
| config(3) | -1.635556 | 1 | -4.308056 | 1 | -4.308056 | 1 | -4.308056 | 1 | -4.308056 |
| config(4) | 0.3069453 | 0 | 0 | 0 | 0 | 0 | 0 | 0 | 0 |
| prepreg(1) | -2.895556 | 1 | 3.2094444 | 0 | 0 | 0 | 0 | 0 | 0 |
| prepreg(2) | 3.2094444 | 0 | 0 | 0 | 0.5668446 | 0 | -2.695556 | 1 | 3.2094444 |
| prepreg(3) | -1.080833 | 0 | 0 | 0 | 0 | 0 | 0 | 0 | 0 |
| prepreg(4) | 0.5668446 | 0 | 0 | 0 | 0 | 0 | 0 | 0 | 0 |
| config(1)xprepreg(1) | 2.5583333 | 0 | 0 | 0 | 0 | 0 | 0 | 0 | 0 |
| config(1)xprepreg(2) | 0.063333 | 0 | 0 | 0 | 0 | 0 | 0 | 0 | 0 |
| config(1)xprepreg(3) | 1.7325 | 0 | 0 | 0 | 0 | 0 | 0 | 0 | 0 |
| config(1)xprepreg(4) | -4.354166 | 0 | 0 | 0 | 0 | 0 | 0 | 0 | 0 |
| config(2)xprepreg(1) | -0.456944 | 1 | -2.691944 | 0 | 0 | 1 | -0.456944 | 1 | -2.691944 |
| config(2)xprepreg(2) | -2.691944 | 0 | 0 | 1 | 4.590555 | 0 | 0 | 0 | 0 |
| config(2)xprepreg(3) | -1.441667 | 0 | 0 | 0 | 0 | 0 | 0 | 0 | 0 |
| config(2)xprepreg(4) | 4.590556 | 0 | 0 | 0 | 0 | 0 | 0 | 0 | 0 |
| config(3)xprepreg(1) | -2.839444 | 0 | 0 | 0 | 0 | 0 | 0 | 0 | 0 |
| config(3)xprepreg(2) | 4.0655556 | 0 | 0 | 0 | 0 | 0 | 0 | 0 | 0 |
| config(3)xprepreg(3) | -0.644167 | 0 | 0 | 0 | 0 | 0 | 0 | 0 | 0 |
| config(3)xprepreg(4) | -0.581945 | 0 | 0 | 0 | 0 | 0 | 0 | 0 | 0 |
| config(4)xprepreg(1) | 0.7380547 | 0 | 0 | 0 | 0 | 0 | 0 | 0 | 0 |
| config(4)xprepreg(2) | -1.436945 | 0 | 0 | 0 | 0 | 0 | 0 | 0 | 0 |
| config(4)xprepreg(3) | 0.353334 | 0 | 0 | 0 | 0 | 0 | 0 | 0 | 0 |
| config(4)xprepreg(4) | 0.3455559 | 0 | 0 | 0 | 0 | 0 | 0 | 0 | 0 |
| | -0.560556 | | -10.09 | | -5.45 | | -13.76 | | -10.09 |

Inner

| 8mil - Fill | (98) | pp1 (99) | | pp2 (100) | | pp3 (101) | | pp4 (102) | |
|---|---|---|---|---|---|---|---|---|---|
| intrcept | -6.165764 | 1 | -6.165764 | 1 | -6.165764 | 1 | -6.165764 | 1 | -6.165764 |
| config(1) | 3.1902083 | 0 | 0 | 0 | 0 | 0 | 0 | 0 | 0 |
| config(2) | -2.179236 | 1 | -2.179236 | 1 | -2.179236 | 1 | -2.179236 | 1 | -2.179236 |
| config(3) | 0.9607639 | 0 | 0 | 0 | 0 | 0 | 0 | 0 | 0 |
| config(4) | -1.971736 | 0 | 0 | 0 | 0 | 0 | 0 | 0 | 0 |
| prepreg(1) | -0.739236 | 0 | 0 | 0 | 0 | 1 | -0.739236 | 0 | 0 |
| prepreg(2) | -0.621736 | 1 | -0.621736 | 0 | 0 | 0 | 0 | 1 | -0.621736 |
| prepreg(3) | 2.8777 | 0 | 0 | 0 | 0 | 0 | 0 | 0 | 0 |
| prepreg(4) | -1.516728 | 0 | 0 | 1 | -1.516728 | 0 | 0 | 0 | 0 |
| config(1)xprepreg(1) | 2.6147817 | 0 | 0 | 0 | 0 | 0 | 0 | 0 | 0 |
| config(1)xprepreg(2) | -0.282708 | 0 | 0 | 0 | 0 | 0 | 0 | 0 | 0 |
| config(1)xprepreg(3) | 0.675625 | 0 | 0 | 0 | 0 | 0 | 0 | 0 | 0 |
| config(1)xprepreg(4) | -3.007709 | 0 | 0 | 0 | 0 | 0 | 0 | 0 | 0 |
| config(2)xprepreg(1) | -0.085764 | 0 | 0 | 0 | 0 | 1 | -0.085764 | 0 | 0 |
| config(2)xprepreg(2) | -1.013264 | 1 | -1.013264 | 0 | 0 | 0 | 0 | 1 | -1.013264 |
| config(2)xprepreg(3) | -0.902708 | 0 | 0 | 0 | 0 | 0 | 0 | 0 | 0 |
| config(2)xprepreg(4) | 2.001736 | 0 | 0 | 1 | 2.001736 | 0 | 0 | 0 | 0 |
| config(3)xprepreg(1) | -3.175764 | 0 | 0 | 0 | 0 | 0 | 0 | 0 | 0 |
| config(3)xprepreg(2) | 1.3667361 | 0 | 0 | 0 | 0 | 0 | 0 | 0 | 0 |
| config(3)xprepreg(3) | 0.0272817 | 0 | 0 | 0 | 0 | 0 | 0 | 0 | 0 |
| config(3)xprepreg(4) | 1.7817362 | 0 | 0 | 0 | 0 | 0 | 0 | 0 | 0 |
| config(4)xprepreg(1) | 0.6467363 | 0 | 0 | 0 | 0 | 0 | 0 | 0 | 0 |
| config(4)xprepreg(2) | -0.070764 | 0 | 0 | 0 | 0 | 0 | 0 | 0 | 0 |
| config(4)xprepreg(3) | 0.1997813 | 0 | 0 | 0 | 0 | 0 | 0 | 0 | 0 |
| config(4)xprepreg(4) | -0.775764 | 0 | 0 | 0 | 0 | 0 | 0 | 0 | 0 |
| | -0.415833 | | -9.98 | | -7.86 | | -9.17 | | -9.98 |

| Process Step/Input | Potential Failure Mode | Potential Failure Effects | S E V | Potential Causes | O C C | Current Controls | D E T | R P N |
|---|---|---|---|---|---|---|---|---|
| What is the process step/ Input under investigation? | In what ways does the Key Input go wrong? | What is the Impact on the Key Output Variables (Customer Requirements) or Internal requirements? | | What causes the Key Input to go wrong? | | What are the existing controls and procedures (inspection and test) that prevent eith the cause or the Failure Mode? Should include an SOP number. | | |
| Using different PEP machines to punch a single lot. | This creates a mixture of punched hole locations within a lot. | The mixutre of settings and machine conditions within PEP causes random angle and offset errors within a lot. | 10 | The offset adjustments made by untrained operators and the lack of a machine service schedule means the machines will punch differently. Production pressures | 10 | No controls. | 10 | 1000 |
| Improper offset adjustments made in process. | The machine is incorrectly aligned causing the punched holes to be incorrectly placed. | The offset adjustments effect both the angle errors and the offset errors. | 10 | Improper procedures allowing unskilled operators to make adjustments. Improper measurement tools. Improper panel sampling. | 10 | The current controls are for the process engineer to write the procedure for the operator. | 8 | 800 |
| Panel flatness on the machine table. | The panel isn't flat under the camera causing poor alignment with the target patterns. | Poor alignment of the targets will cause the true punch locations to be off. This will produce angle errors and offset errors. | 10 | Differential copper weight from one side of the panel to another side of the panel. Unbalanced constructions. | 8 | Indicate the core side of the panel that will reduce curling with stamp. | 5 | 400 |

COMPENSATION MODEL AND REGISTRATION SIMULATION APPARATUS AND METHOD FOR MANUFACTURING OF PRINTED CIRCUIT BOARDS

NOTICE REGARDING COPYRIGHT

A portion of the disclosure of this patent document contains matter subject to copyright protection. The copyright owner has no objection to the facsimile reproduction by anyone of the patent disclosure document as it appears in the Patent and Trademark Office files and records but otherwise retains all copyrights whatsoever.

BACKGROUND OF THE INVENTION

1. Field of the Invention

The present invention relates to multilayer printed circuit boards and, more particularly, to registration of multilayer printed circuit boards (MLB) prior to lamination.

2. Description of Related Art

There are few problems as challenging or as important in the printed circuit board industry as registration. Examination of the MLB scrap pile at drill or electrical testing sites can be mysterious and aggravating. One circuit out of a lot or on a panel may be perfect and the next circuit may be a confusing pattern of errors. If the scrap amount is significant, then there is need for immediate circuit board design modifications. Often the modifications required to correct the registration problems are not apparent so that the modifications that are implemented often give unsatisfactory results.

Multilayer printed circuit board registration errors come from a variety of sources including: (1) offset error; (2) angle error; (3) random noise; (4) compensation error. Compensation errors arise from mistakes in estimating the shrinking or expanding of the MLB due to material movement experienced following multilayer lamination of the cores and dielectric.

Unfortunately, in estimating the required compensation, the prior art merely suggests considering the amount of copper on an individual core by image, and the thickness of the core with no regard to the overall multilayer board design and construction. The data used to generate the matrix in the prior art is based on historical production information. These prior art models fail to precisely estimate the required compensation, and at times, produce as much as a ±15 mil error between the model and the actual production. One example of a prior art compensation matrix is shown in FIG. 1. The matrix is for 24"×18" panels where the warp (X-direction) direction is 18" and the fill (Y-direction) direction is 24". The prior art matrix is based solely on the amount of copper on the core by image and the thickness of the core, dramatically limiting the usefulness in reducing compensation error.

In practice, use of the prior art compensation matrix disrupts the processing of multilayer printed circuit boards. FIG. 2 shows a flow chart of a simplified process map for a compensation process for a large printed circuit board shop. Arrows 30 in FIG. 2 indicate areas of the process that are very unstable. In a feedback process, which FIG. 2 describes, adding the wrong information will cause small mistakes that create large registration errors. This occurs when the feedback information is wrong or the feedback happens after a long lag period. Unfortunately, the nature of printed circuit board shops with large amounts of work in process greatly limits the ability to remove the detrimental lag time. Incomplete information and delay of input also limits the ability to make compensation changes on the fly. Making compensation changes after full production lots have been released is nothing more than process tampering, which often leads to escalating scrap rates. One way to improve compensation error is by improving the accuracy of compensation predictions for a job prior to production. Prior art strategies based on historical production data sets lack the required design combinations to detect the important variables and interactions that control the material movement. Therefore, the prior art compensation matrices do not accurately predict the error prior to production, thereby requiring costly modifications during production.

At block 32 of FIG. 2, the initial compensation values are selected from the sizing matrix of FIG. 1. At block 34, the test books (which typically 10 or more MLBs stacked on top of one another) and first production lots are "released" (started) to production. Due to time pressures, it is typically not feasible to first run tests to determine whether there will be production problems (i.e., whether the predicted compensation values were, in fact, correct) and then run the actual production. Instead, the test books and the production lots must be prepared for production simultaneously. At block 36, the test books are measured for errors and the production is run. Thereafter, at block 38, the overages (which are additional cores that have layers etched on them) are collected in the core inventory. Because some of the printed circuit boards are expected to fail, overages of additional cores with layers are manufactured. These overages are stored in the event that they are needed.

At block 40 of FIG. 2, based on the measurements of the test books in block 42, the artwork is changed in order to reduce compensation errors. However, due to old lots still being in the production pipeline, the old lots are still being used, as shown in block 44, which cause an unstable lag in terms of correcting the problems in the production. And, due to time pressures, the old cores are still used in the production, as shown at block 46.

The present methods of determining and correcting MLB registration errors are ineffective and unpredictable, resulting in large volumes of scrap. Thus, there remains a need to determine registration errors and in particular compensation error before production begins rather than during production.

In addition, the prior art fails to appreciate the interaction between the different sources of registration error. Typically, the prior art merely adds the variances which comprise the sources of registration error in an attempt to compute the total registration error. For example, compensation error from artwork, offset error and angle error from a post etch punch machine, and random noise from a drill machine cannot be combined by using the sum of the squares. However, this one-dimensional analysis does not provide insight on how the errors flow over the panel surface and how the sources of registration error are interdependent, combining to produce complex and seemingly unexplainable registration error patterns. There remains a need to account for the interaction of all types of errors in order to improve MLB registration.

SUMMARY OF THE INVENTION

In a first aspect of the invention, a method for modeling compensation during registration of a printed circuit board is provided. The method comprises the step of providing a plurality of printed circuit boards with multiple cores which use at least one dielectric layer in between the cores. The method also comprises the step of measuring the movement of least one core of each printed circuit board due to fabrication. And, the method comprises the step of generating a compensation model based on the core movement and based on the at least one dielectric layer.

In a second aspect of the invention, a method for modeling compensation during registration of a printed circuit board is provided. The method comprises the step of providing printed circuit boards with multiple cores with dielectric layers in between the cores, the cores having positions in the printed circuit boards. The method also comprises the step of measuring the movement of the cores due to fabrication of the printed circuit boards. And, the method comprises the step of generating a compensation model based on the core movement and based on the position of the cores in the printed circuit board.

In a third aspect of the invention, a method for modeling compensation during registration of a printed circuit board is provided. The method comprises the step of providing printed circuit boards having at least a first core and a second core, with circuit layouts on at least one side of the first core and on at least one side of the second core. The method also comprises the step of measuring the cores of the printed circuit boards after fabrication in order to measure movement of each core. And, the method comprises the step of generating a compensation model based on the measuring of the cores of the printed circuit boards and based on the circuit layouts on at least one side of the first core and on at least one side of the second core.

In a fourth aspect of the invention, a method for reducing compensation error during processing of a multilayer printed circuit board having multiple cores, circuits on the cores and dielectric layers in between the circuits is provided. The method comprises the step of identifying at least one characteristic of the multilayer printed circuit board selected from the group consisting of position of the core in the multilayer printed circuit board, the dielectric layer, and circuits on adjacent cores. The method also comprises the step of generating at least one compensation factor based on the at least one characteristic from a compensation model. And, the method comprises the step of modifying the circuits based on the at least one compensation factor.

In a fifth aspect of the invention, a simulator for determining compensation error in a multilayer printed circuit board having at least one dielectric layer, multiple cores, circuit configurations on the multiple cores is provided. The simulator comprises a processor and a memory device electrically connected to the processor, the memory device including a matrix of compensation error data comprising X and Y error measurements based on at least one characteristic of the multilayer printed circuit board selected from the group consisting of the at least one dielectric layer, position of the core in the stack, the circuit configurations on the multiple cores, assembly of the multilayer printed circuit board, and interaction between the core and the dielectric layer.

In a sixth aspect of the invention, a method of simulating errors during registration of a printed circuit board is provided. The method comprises the step of compiling at least a plurality of points on a layer in the multilayer printed circuit board. The method also comprises the step of modifying the position of the plurality of points based on an offset model, an angle model, a compensation model and a random noise model in order to created a modified position of the plurality of points. And, the method comprises the step of outputting a comparison of the position of the plurality of points with the modified position of the plurality of points.

In a seventh aspect of the invention, a method of simulating errors during registration of a printed circuit board is provided. The method comprises the step of determining true positions necessary to achieve perfect registration. The method also comprises the step of identifying at least two sources of errors which occur during registration. The method further comprises the step of combining the at least two sources of errors which occur during registration in an interdependent manner. And, the method comprises the step of comparing the combining of the at least two sources of errors with the true positions.

It is an object of the present invention to provide a method and apparatus for properly estimating the required compensation after lamination of a printed circuit board.

It is a further object of the present invention to provide a method and apparatus for simulating the registration errors in order to better design the circuit panel layout and understand the required production process controls.

BRIEF DESCRIPTION OF THE DRAWINGS

FIG. 1 is a prior art compensation matrix;

FIG. 4a is a graphical representation of the Design Rule Allocation (DRA) and the True Position Radius (TPR);

FIG. 6a is an output from the registration simulator for an angle error;

FIG. 8b is a contour plot of FIG. 8a;

FIGS. 10a–c are tables of the results of experiments to generate compensation matrices for cores with thickness of 4 mil, 5 mil and 8 mil, respectively;

FIGS. 11a–f are coefficients of equations of the compensation model for outer cores with thickness of 4 mil warp and fill, 5 mil warp and fill and 8 mil warp and fill, respectively;

FIGS. 11g–l are coefficients of equations of the compensation model for inner cores with thickness of 4 mil warp and fill, 5 mil warp and fill and 8 mil warp and fill, respectively;

FIG. 18 is a table of the Failure Modes and Effects Analysis (FMEA) on a Post Etch Punch Machine;

DETAILED DESCRIPTION OF THE INVENTION

A multilayer printed circuit board (MLB) is composed of multiple layers of circuits. The circuits, composed of a conductive material or a metal such as copper, are etched onto a core as a layer. The core may be any shape.

Typically, a core is rectangular in shape with a width of 18" (x-direction) and a height of 24" (y-direction). In addition, cores come in a variety of thickness (z-direction), including 4 mils, 5 mils and 8 mils. To reduce the size of electronics, circuit boards are being miniaturized. In order to reduce circuit board size and thickness, at least, two things are done: (1) circuits are etched on both sides of a core to form a layer pair and (2) the cores are stacked on top of one another. Thus, a typical MLB may have 3, 4, 5, 10 or more stacked layer pair cores.

In order to assemble an MLB, a boundary layer is required that both binds the circuit images on the individual cores together and serves as insulation to prevent individual circuit layers from interfering with each other. Typically, the boundary layer is a dielectric layer such as prepreg. A prepreg is typically formed from a glass fabric that is impregnated with a resin. A prepreg is considered a b-stage material in which the resin is partially cured. The core, with the etched circuit pairs, is typically a c-stage material which is fully cured. During processing, sheets of prepreg are placed in between the layered cores, and cured by pressing and heating. Thus, the prepreg is sandwiched between the cores and acts as a binding agent and dielectric insulator.

Dielectric layers other than prepregs may be used in between the layers of the cores. Alternative dielectric layers include resin coated foil or any other resin or epoxy coated material or layer used to laminate cores together.

In order to electrically connect the circuits on the different levels, vias or holes are drilled perpendicularly through the various levels of the cores. The vias connect the circuit layers at precise predetermined locations (e.g., contacts) on the core circuitry. The vias must, therefore, line up multiple circuits on multiple layers within certain tolerances; otherwise, the vias will not connect the proper circuits and they may interfere with the unintended circuitry, causing circuit failures. Designing the MLB so that the vias line up with the correct circuits is a process known as registration. However, due to variables in the manufacturing or fabricating of printed circuit boards, registration errors occur causing the vias to line up improperly with the contacts and also to interfere with existing circuitry. This registration failures are not apparent until circuit testing following MLB fabrication.

Figure 3:
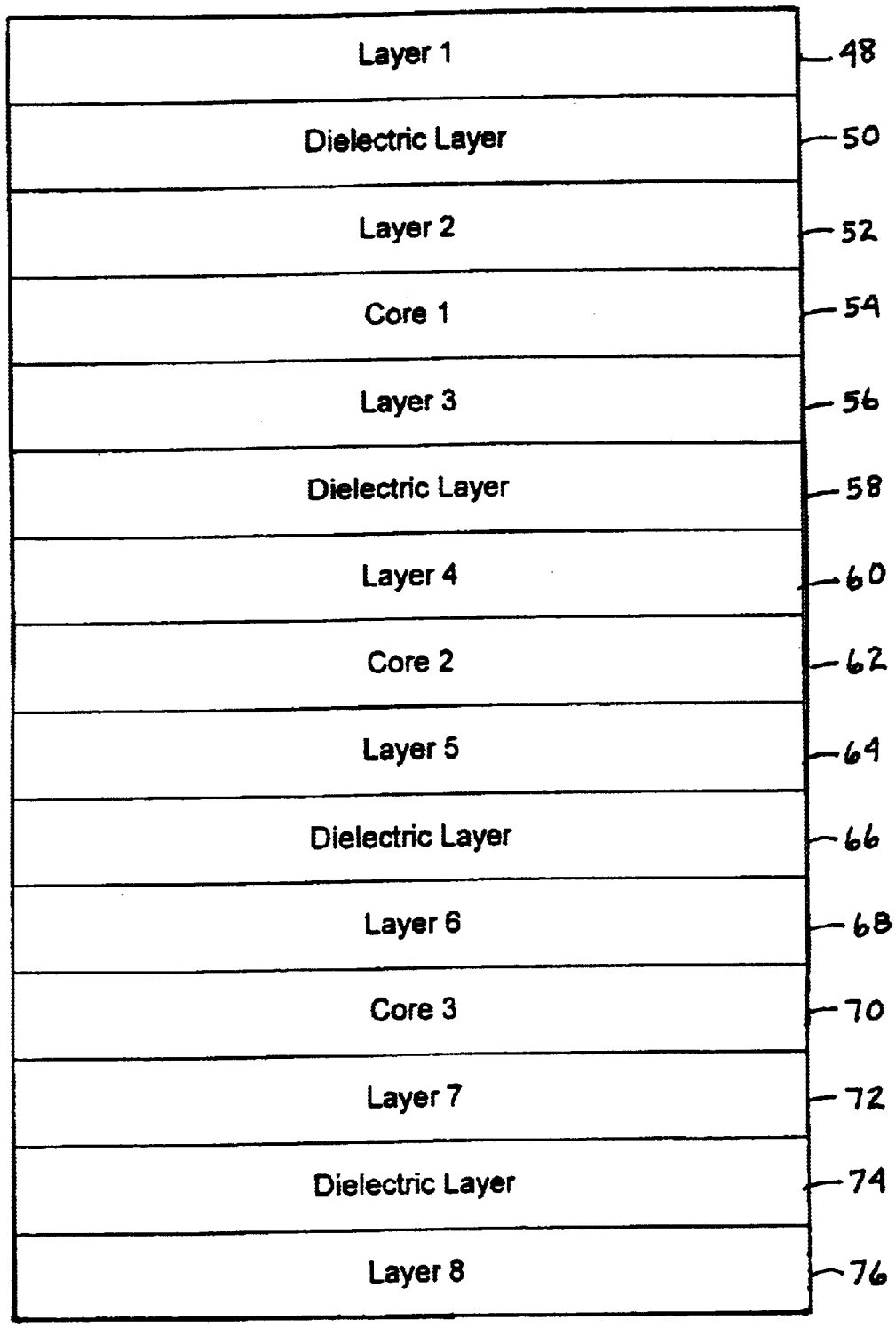
FIG. 3 is an example of a multilayer board.

FIG. 3 is a schematic which illustrates an 8-layer MLB. FIG. 3 is provided for discussion purposes and does not represent the relative thicknesses of the layers of the printed circuit board. As discussed subsequently, the Dielectric Layers (50, 58, 66, 74 in FIG. 3) may be composed of prepreg (including multiple layers of prepreg in one dielectric layer, prepregs with different resin percentages and prepregs with different degrees of cure). Layers 2–7 (52, 56, 60, 64, 68, 72 in FIG. 3) may contain different circuit configurations of signal, ground or a mix of signal and ground. The Cores (54, 62, 70 in FIG. 3) may be a variety of thicknesses including 4 mil, 5 mil and 8 mil. Layers 1 and 8 (48, 76 in FIG. 3) are the outer foil conductive material, placed on the dielectric layer just prior to printed circuit board lamination. The outer foil layers allow for circuits to be imaged on the printed circuit board. These outer layer circuit images do not create registration errors since they do not move significantly after fabrication.

MLB registration errors are characterized by the Design Rule Allocation (DRA) and the True Position Radius (TPR). The DRA refers to the distance between the edge of the via at the true position (needed to achieve perfect registration) to the edge of the next portion of the circuit on the layer. The TPR is the radial error about the true position and thus is a measurement of the registration error. Referring to FIG. 4a, there is graphically shown the DRA and TPR.

The DRA includes spacing of features between all layers. Typically this information can be obtained from a Computer Aided Design (CAD) file where programs look at every feature on every MLB layer and calculate the DRA. For some boards, there are annular ring requirements to prevent the drilled hole or via from approaching the edge of the board. This is not universally true for all printed circuit boards. The DRA represents the limits of tolerance because violating the DRA will create electrical shorts. Typically, the DRA is between 6.5 mils to 16 mils where 6.5 mils is considered a minimum registration tolerance.

As shown in FIG. 4a, TPR is the measurement of the registration error. Using the square root of the sum of the squares combines the errors in the X and Y direction to produce the TPR. The TPR and the DRA are typically compared and the TPR must be less than the DRA in order to avoid registration scrap (i.e., a failure in the printed circuit board).

Figure 5:
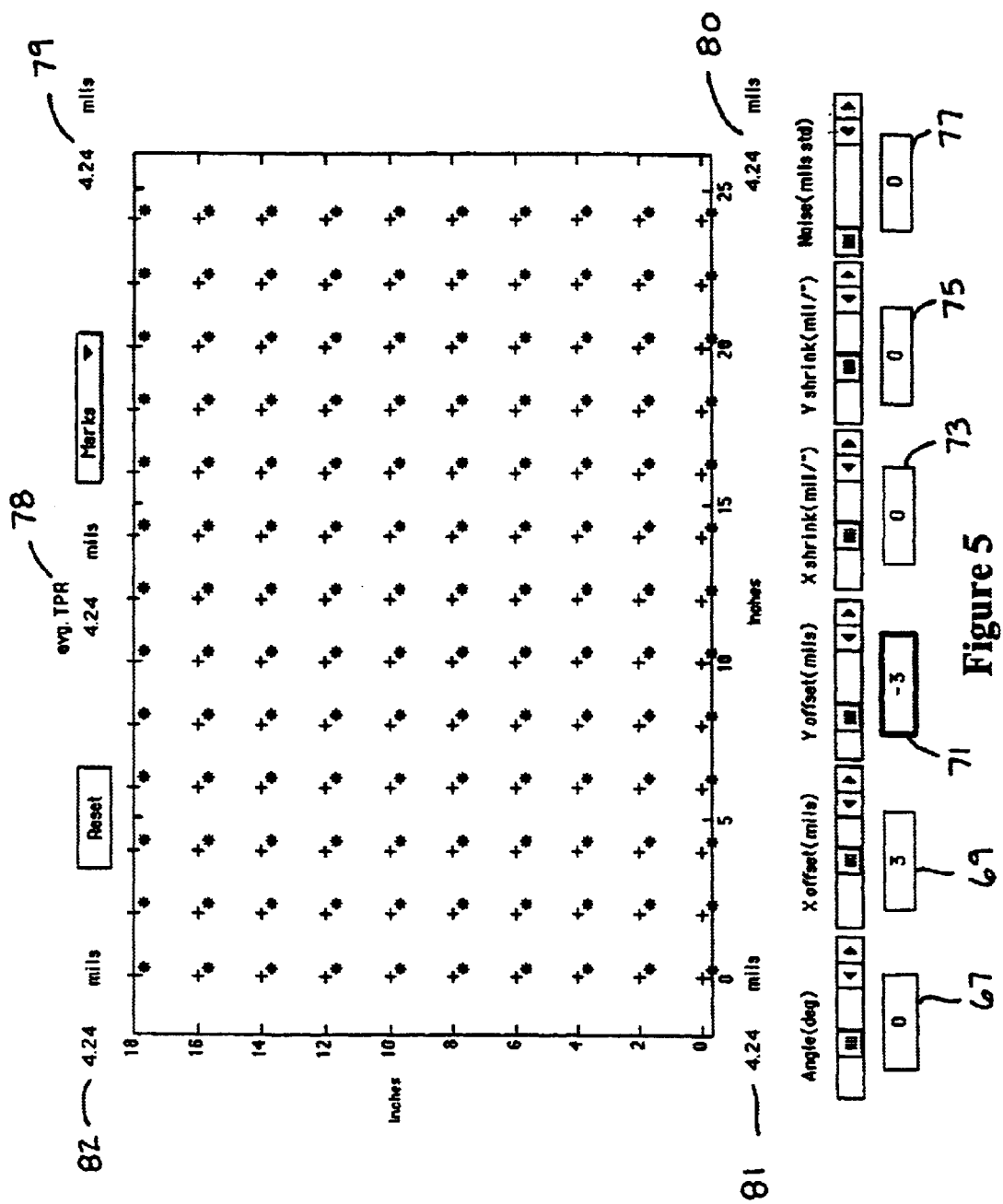
FIG. 5 is an output from the registration simulator for an X (horizontal) and Y (vertical) offset error.

Sources of registration errors that contribute to the TPR include: (1) offset error; (2) angle error; (3) random noise; (4) compensation error. Machines used to register the printed circuit board and the printed circuit board itself contributes to the registration error. Offset errors are typically errors associated with MLB tooling such as punch, pinning, printing and drilling. Referring to FIG. 5, there is shown an output from the registration simulator of this invention where the registration error is based on an X (horizontal) and Y (vertical) offset error. The X offset and Y offset error may be obtained empirically and are input into the registration simulator at blocks 69 and 71, respectively. In FIG. 5 and subsequent figures, the crosses (+) show the true position of a feature needed to achieve perfect registration. The stars (*) in the figures indicate the position of a feature when registration error is accounted for. FIG. 5 represents an 18"×24" panel where there are 130 graphic plots showing the true position and registration error at each 2 inch interval over the panel. The boxes at each corner of the figure (79, 80, 81 and 82) indicate the amount of error as represented by the radius about the true position (TPR). The TPR is computed by taking the sum of the squares of the X offset error (3 mils) and the Y offset error (−3 mils) and taking the square root (4.24 mils). The average TPR from all of the points on the plot is indicated in the upper center portion of block 78 in FIG. 5. As seen in FIG. 5, an offset error is uniform across the panel surface. One example of a cause for a uniform offset error is misalignment of the post etch punch machine. In preparation for pressing the layers of the printed circuit board, the post etch punch machine punches holes into the cores. If the machine is not lined up correctly, an offset error can occur. Another example of an offset error is the misalignment of the layers around a core. As shown in FIG. 3, Layer 4 and Layer 5 are etched onto core 2. However, if there is an error in the printing process prior to the etching process, Layer 4 may be offset from Layer 5, causing an offset error.

Figure 6B:
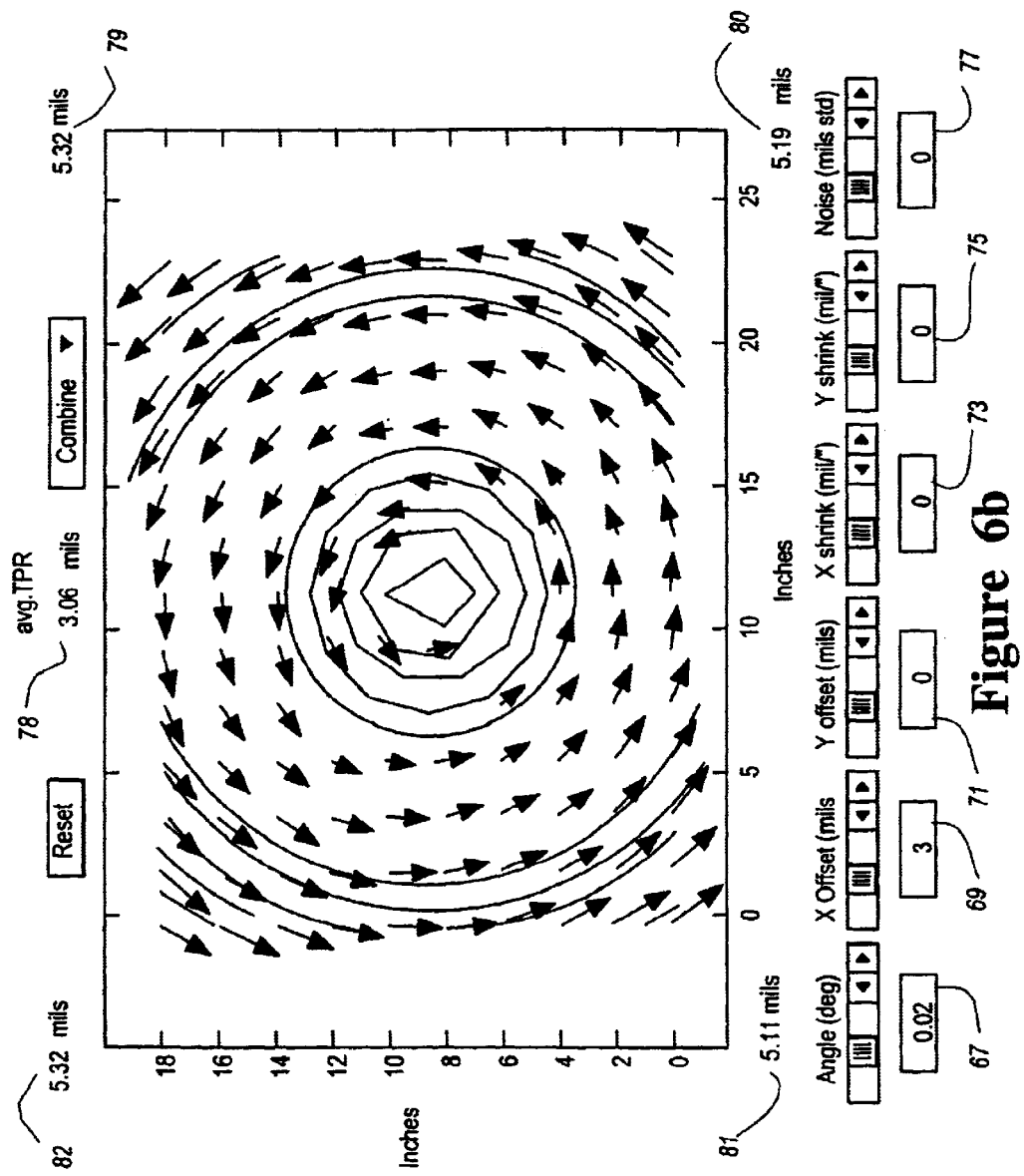
FIG. 6b is an output from the registration simulator for an offset and angle error.

A second type of registration error is angle error. Angle errors, similar to offset errors, are also associated with MLB tooling such as punch, pinning, and drilling. Angle errors have a center of angle rotation and a degree of angle error. For purposes of analysis, the center of the angle of rotation is along the center of the bottom 24" edge. This choice of the center of angle of rotation is merely for convenience and can be "moved" based on modifying the offset error. For example, as shown in FIG. 6b, the center of the angle of rotation is moved to the approximate center of the layer by modifying the x offset error. Angle error is one example of a proportional error. Angle errors are often discounted in printed circuit board shops, because they are difficult to measure and small angles aren't thought to contribute much to overall registration error. In order to appreciate why small angles of rotation are problematic, visualize a triangle 12" long by 9 mils high. The resulting angle is only about 0.04 degrees, which may often be discounted, yet which produces a significant error. Referring to Table 1, there is shown the TPR as a function of angle along the bottom panel edge. When the entire panel surface (e.g., 18" by 24") is considered, the far corners produce even larger errors, as shown by the TPR in Table 1.

TABLE 1

TPR as a Function of Angle

| Radians | Degrees | TPR (mils) |
|---------|---------|------------|
| 0.0001  | 0.00572958 | 1.20 |
| 0.0002  | 0.01145916 | 2.40 |
| 0.0003  | 0.01718873 | 3.60 |
| 0.0004  | 0.02291831 | 4.80 |
| 0.0005  | 0.02864789 | 6.00 |
| 0.0006  | 0.03437747 | 7.20 |

TABLE 1-continued

TPR as a Function of Angle

| Radians | Degrees | TPR (mils) |
|---------|---------|------------|
| 0.0007  | 0.04010705 | 8.40 |
| 0.0008  | 0.04583662 | 9.60 |

Referring to FIG. 6a, there is shown an angle error output from the registration simulator of this invention. The angle error may be obtained by examining the output of the machines used during MLB manufacture, including the output of the post etch punch machine. The angle error is input to the registration simulator at block 67. As indicated in FIG. 6a, a small rotation of 0.02 degrees (angle(deg)) about the center of the lower 24" edge will produce an average TPR of 4.21 mils with a lower left and lower right TPR of 4.19 mils and an upper left and upper right TPR of 7.55 mils. In optimization processes, such as punching of cores following etching, angle errors can be produced by small calibration errors to the targets. State of the art post etch punch machines have the targets located close to the centerline of the panel. An improved way to punch tooling holes (or vias) is to have the targets located at the four corners so that small calibration errors have less of an effect on the angle error.

Examining FIG. 6a, angle errors alone produce some potentially strange registration errors. For example, the bottom half of the panel is much better registered than the top half of the panel. The registration error in the upper right corner is to the left and up and the upper left corner is to the left and down. The rotation is clear in FIG. 6a because of the 130 plot array. However, when examining production panels, the angle error is less clear and it is common to mistake an angle error for a compensation error. This is more apparent if only the left or right half of the panel is considered. Efforts to compensate for angle errors can produce a larger compensation error with no significant change in the angle error. The increase in TPR from a false compensation change can be surprising. Therefore, a the model and simulator of this invention provide a measurement system that can separate angle error and offset error from compensation error in order to avoid erroneous corrective actions that cause process yields to decrease.

A third source of registration error is random noise, which may occur from a variety of sources. One example of random noise is in drilling of the via holes. A drill bit may wander randomly and produce a population of points scattered about the true position. Other examples of random noise include differences in individual panel movement after lamination, random tooling errors, and random measurement noise.

Figure 7:
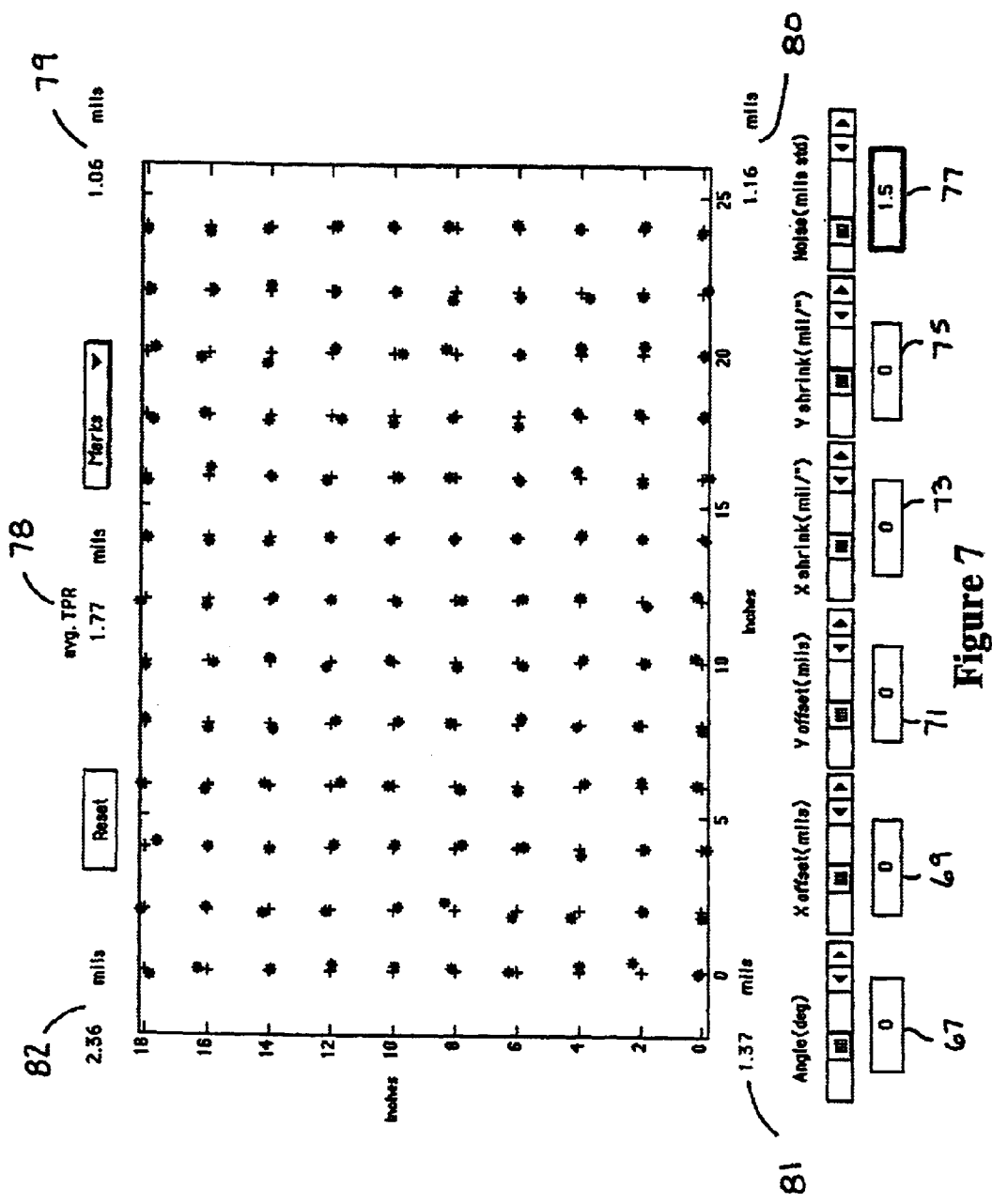
FIG. 7 is an output from the registration simulator for random noise over the panel surface.

Referring to FIG. 7, there is shown an output from the registration simulator of this invention that graphically depicts random noise errors over the panel surface. The registration simulator assumes a normal distribution of the random error component with equal standard deviations in the X and Y directions. FIG. 7 shows a standard deviation setting of 1.5 mils as shown at block 77. Typically, random errors are regarded as serious and there are usually procedures in place in a number of printed circuit board manufacturing facilities that attempt to reduce random noise. However, efforts to reduce random noise errors are not always fruitful because of the magnitude of the other three error modes. In particular, what is often not appreciated is that when offset error, compensation error, and angle error are reduced, then more random error can be tolerated. However, with higher circuit density, more layers with more copper, and the need for improved MLB productivity, create conditions that are not favorable to reduce random noise.

Another type of error is compensation error. Compensation error is caused by MLB material movement, such as the material of the cores, the circuit layout, and the dielectric layers during MLB fabrication. Examples of MLB fabrication may include sandwiching the cores with dielectric layers, and pressing heating the composite together. Material movement refers to the relative expansion or contraction of the various MLB layers experienced during MLB manufacture. Any material movement causes the circuit layouts to become distorted or changed in relation to their expected X, Y location. Because of the distortion and movement, the circuit design, which is etched onto the cores, is out of register and must be corrected. In order to correct for registration errors caused by distortion and movement, printed circuit boards, with tight design tolerances are stretched or shrunk to compensate for material movement seen after lamination. For example, if a layer is estimated to shrink proportionally by 10.0 mils due to compensation error, the circuit should be modified by proportionally expanding the circuit by 10.0 mils. Therefore, expanding the circuit can compensate for shrinkage caused by the compensation error.

Figure 8A:
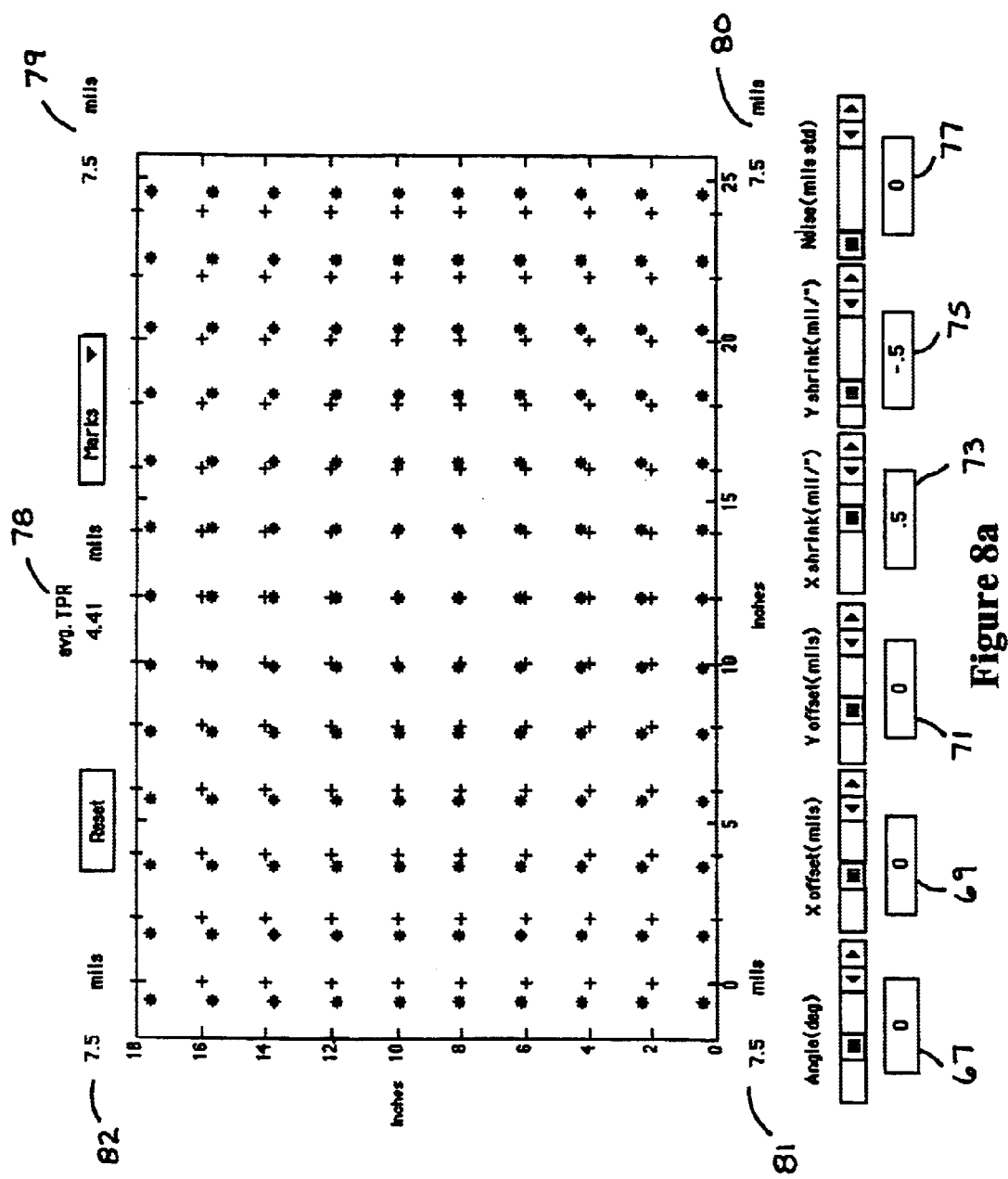
FIG. 8a is an output from the registration simulator for X and Y compensation errors.

Referring to FIG. 8a, there is shown an output from the registration simulator of this invention which identifies X and Y compensation errors. The X and Y compensation errors are entered into the registration simulator at blocks 73 and 75, respectively. The compensation error is proportional, as shown in FIG. 8a. The X component of the error of 0.5 mils/inch produces an X error of 6 mils at the corner (0.5×24/2). The Y component of the error of −0.5 mils/inch produces an Y error of 4.5 mils at the corner. Combining the X and Y components gives a TPR corner error of 7.5 mils. Proportional errors in some part can be centered or optimized. For example, a post etch punch machine is an example of a piece of tooling equipment that is designed to try to minimize errors that are proportional from the center of the panel outward. There are targets on the panel surface which the post etch punch machine identifies prior to punch. If the targets have moved due to shrinkage, the post etch punch machine adjusts in order to minimize the error. FIG. 8a shows a compensation error that has been perfectly optimized over the panel surface.

Figure 8B:
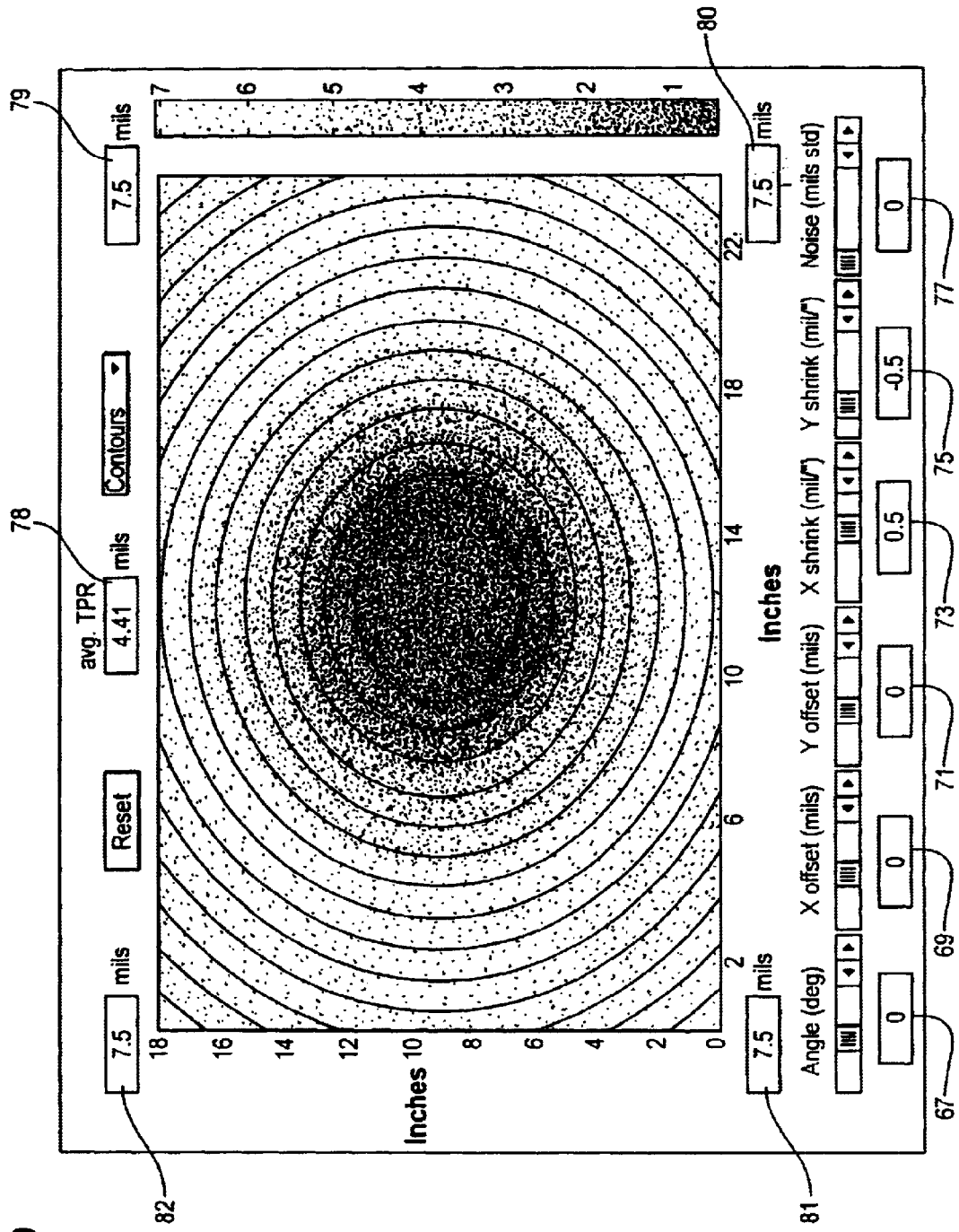
Figure 8C:
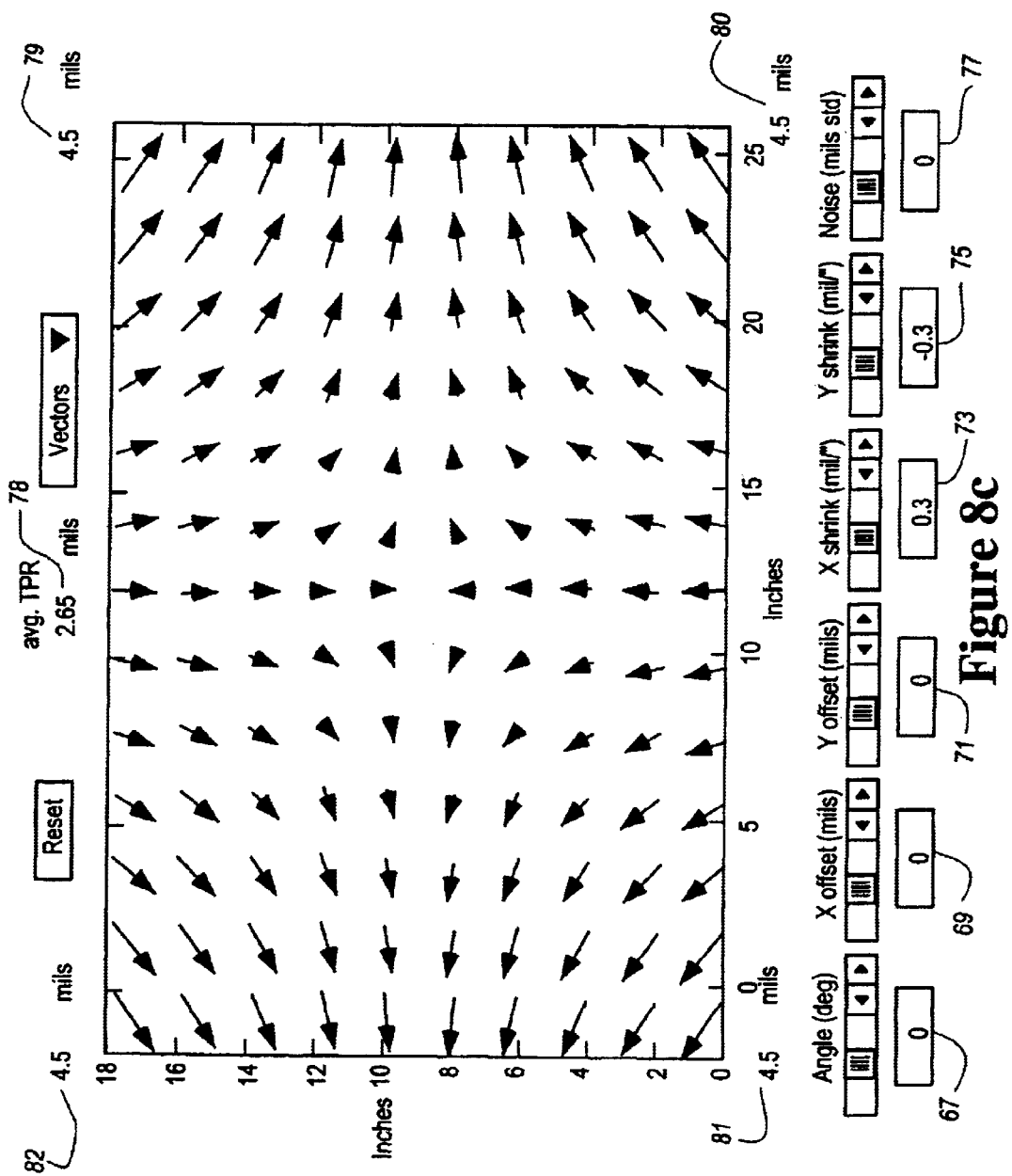
FIG. 8c is a vector plot from the registration simulator for X and Y compensation errors.

For proportional errors, the MLB corner TPRs will be greater than the average MLB TPR. This is dramatically displayed in the contour plot in FIG. 8b and in the vector plot in FIG. 8c, each of which are produced by simulation of this invention. In FIG. 8b, the dark areas represent good registration and the light areas represent poor registration. In FIG. 8c, the vectors with the shorter lengths represent good registration the longer lengths represent poor registration.

It is not uncommon for proportional errors to be mistaken for material movement, slippage, or rotation during pressing. Therefore, in order to stabilize the movement, one might believe that pins should be mounted at the corners during lamination. Whether the corner instability is due to movement or slippage in a specific instance is a question that can be answered by the simulation method of this invention, which produces plots such as shown in FIG. 8a–c, which, in this instance shows that the corners are poorly registered because of compensation errors.

MODELING COMPENSATION ERRORS

Angle error, offset error, and random noise all well-understood mechanical registration error sources. The least understood registration error is compensation error, which has both mechanical and material sources. The need to compensate MLB CAD design file data for compensation errors and the inability to predict the compensation values prior to production necessitates a complex compensation process. When a printed circuit board shop is loaded with dense board designs, the complexities of the compensation process and the burden of managing numerous compensation changes becomes more complicated and can cause periods of manufacturing instability with high scrap rates that greatly reduce productivity.

In order to minimize compensation error prior to and during MLB manufacture, the compensation model of this invention provides an accurate and thorough prediction of compensation error. The compensation model of this invention evaluates a variety of variables not considered in the prior art including: (1) combination of conductive circuit layers (e.g., circuit layers on adjacent cores); (2) Type of dielectric material around the core (e.g., different types of prepreg); (3) Combinations of types of dielectric material around the core (e.g., one core being in between two different types of prepreg); (4) Interaction between the dielectric layer, the core and the conductive material on the core; (5) The position of the core in the multilayer stack (e.g., whether the core is in an inner or outer position to the stack of cores in the multilayer board); (6) The amount of bonding material in the dielectric (e.g., percentage of resin in the prepreg); (7) The number of plies of dielectric material; (8) The number of cores (or layers) in the multilayer board; (9) Different conductive material thickness used on cores; (10) Multitude of core thickness combinations in the multilayer board; (11) the assembly of the multilayer board; and (12) the cure degree of the board.

In one embodiment of this invention is a method for MLB manufacturing to minimize compensation error using a compensation model that considers one or more of the eleven characteristics listed above. In this embodiment of the invention, the method follows the flow chart of FIG. 9 wherein experiments are conducted on experimental boards which have variations in one or more of the 11 characteristics. Through these experiments, a compensation model may be generated. In addition, through extrapolation, the model may be applied to predict compensation error in a variety of MLB configurations.

Figure 9:
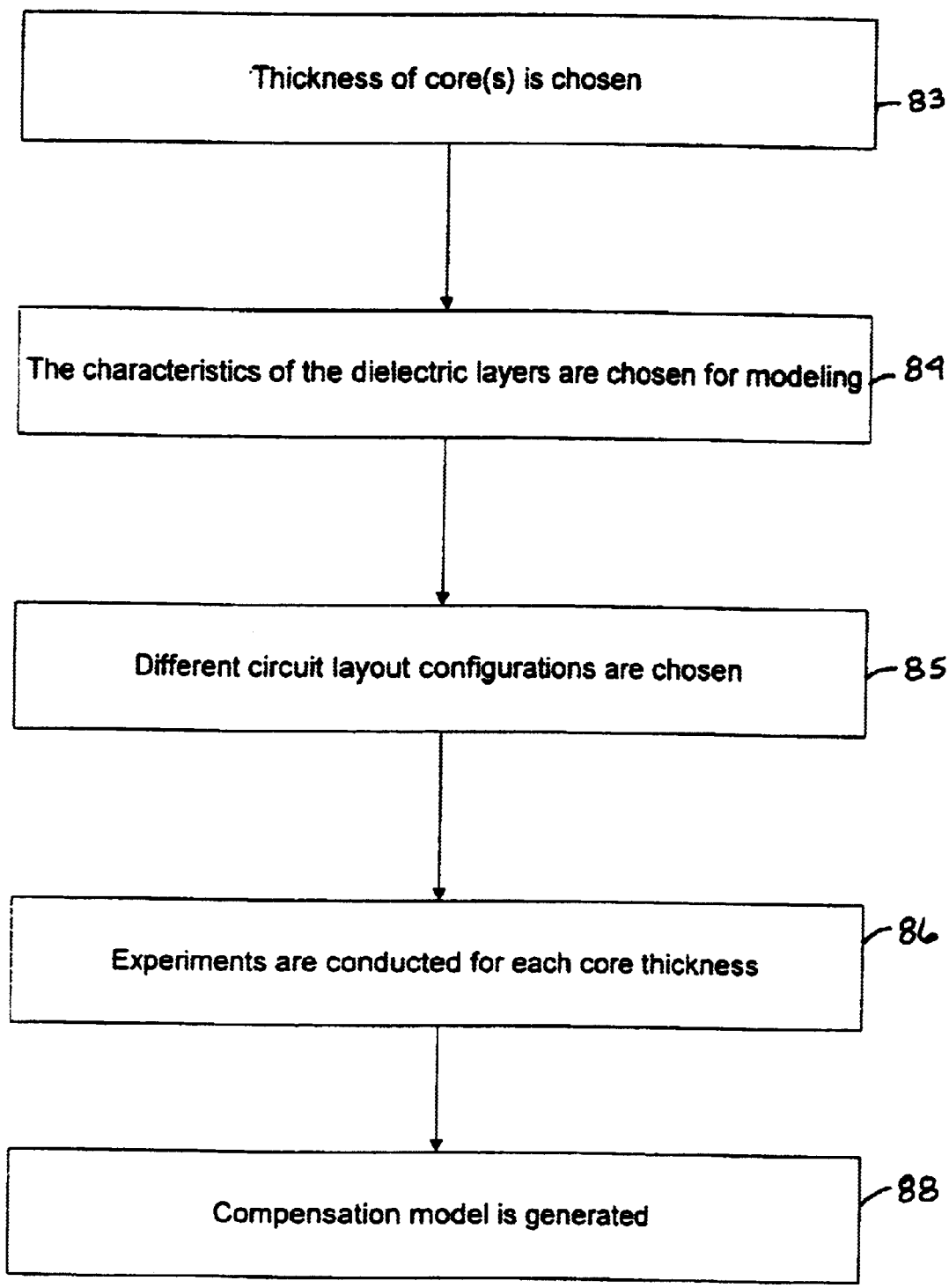
FIG. 9 is a flow chart for modeling of the compensation error according to an embodiment of the invention.

At block 83 of FIG. 9, at least one core thickness is chosen. In a preferred embodiment, multiple core thicknesses are used. As described subsequently, compensation models, which are shown in FIGS. 10a, 10b and 10c, are those generated for three cores: 4 mil; 5 mil and 8 mil.

At least one characteristic of the dielectric layers is chosen for modeling, as shown at block 84 of FIG. 9. Exemplary dielectric layers characteristics include the type of dielectric (i.e., different types of prepreg), the type of bonding material (i.e., different resin percentages), and the type of cure percentage (i.e., high or low cure percentages). The "Dielectric" variable 90 as shown in FIGS. 10a–c, represents variations in the dielectric layer material used. For example, different types of prepregs may be used as the dielectric layer. In the embodiment shown in FIGS. 10a–c, 4 types of "prepregs" 102 are used (Dielectric=1, 2, 3 and 4 which corresponds to prepreg 1080, prepreg 2113, prepreg 2116, and prepreg 7628, respectively). Additional prepreg characteristics may be combined. For example, Dielectric=1 represents prepreg material 1080 with standard resin. Dielectric=5 may represent prepreg material 1080 with high resin. In addition, the dielectric characteristics such as cure rate, high or low cure, etc. may be incorporated into the dielectric designations used. Thus, each number listed in "Dielectric" column 90 refers to a material having one or more characteristics of the dielectric layer.

In addition, typically, the boards can be built with one or two or more plies or sheets of prepreg. It is recommended that for thin glasses such as prepeg 106, 1080, 2113 and 2116, 2 plies of prepreg around each core be used. For prepreg 7628, it is recommended that one ply of prepreg be used. These recommended numbers of plies reflect standard industry practice.

As shown at block 85 of FIG. 9, different circuit layout configurations can be chosen. In a preferred embodiment, "Config," column 89 in FIGS. 10a–c, includes numerals that represent variations in the combinations of circuit layers on the cores. There are a variety of circuit layouts that are possible on a core of a printed circuit board. In one embodiment, modeling of the circuit layout is based on the different percentages of conductive material (such as copper) on the core. Under this factor, there are three possible circuit layouts: signal, ground, or mixed (some signal and some ground on the same layer). The amount of conductive material comprising a circuit layout will depend upon the circuit layout type. For a circuit layout that is designated as a "signal" layout (s), it is estimated that 20% of the core has a conductive material, such as copper. For a circuit layout that is designated as a "ground" layout (g), it is estimated that 80% of the core has a conductive material. And, for a circuit layout designated as a "mixed" layout (m), the amount of conductive material is estimated to be between 20% and 80%. In alternative embodiments, different variables may be used to factor in the amount of conductive material on a layer in the printed circuit board or factor in different circuit configurations.

Further, as shown in FIGS. 10a–c, the factor "Config" represents different combinations of circuit configurations. For example, Config=1 corresponds to ss/gg/ss, wherein there are signal circuit layouts for the layers around the top outer core, ground circuit layouts for the layers around the inner core, and signal circuit layouts for the layers around the bottom outer core. In the context of the example in FIG. 3, Layers 2 and 3 are signal circuits, Layers 4 and 5 are ground circuits, and Layers 6 and 7 are signal circuits. To fully model the majority of circuit configurations, only a small subset of circuit layouts (or "Config" variables) need to be incorporated into experimental MLBs. For example, only 4 combinations of the "Config" variable need to be used including ss/gg/ss; gg/ss/gg; gs/ss/sg; and gs/gg/sg. The remaining layouts are preferably extrapolated based on the model.

Moreover, other factors, in addition to "Config" and "Dielectric," may be used, but are not required, to develop the compensation model. For example, "Time" 91 and "Machine" 92 may be evaluated experimentally and used in the compensation simulation. Prior art compensation models do not consider compensation errors associated with the assembly of the multilayer printed circuit board. However, machines which assemble the boards may vary in performance from one press to the next, and over time. In order to account for these manufacturing variations in performance, the model can be prepared to include "Machine" type as a correction factor. One may also include "Time" in the compensation model. For example, Time=1 (93) may be the first day of construction of the MLBs, Time=2 (94) may be the second day of construction of the MLBs. Comparing the output from Time=1, Time=2, Time=3 or Time=4 may indicate that the compensation model is or is not time dependent. Also, analyzing the compensation model for different machines (i.e., Machine=1 is a different press than Machine=2) may determine whether the compensation model is dependent on the specific machine used. Thus, the manner of assembly of the printed circuit board may be factored into the compensation model.

After the desired factors are chosen, experimental printed circuit boards are prepared for each core thickness desired, as shown at block 86. In order to obtain valuable experimental results, it is preferred that each experimental printed circuit board include at least one uniform property. Examples of desirable uniform properties include the use of a single type of dielectric layer (e.g., prepreg 1080, standard resin, low cure), the use of a single thickness of core (e.g., 4 mil core), the use of one pressed book of 10 or more eight layer printed circuit boards, or a combination thereof. It is most preferred to select the use of one pressed book of 10 or more eight layer printed circuit boards as a uniform property as heat transfer effects circuit movement so that mixed books or books with a large amount of dummy panels do not reflect true processing conditions.

In order to obtain information about the movement of the layers, the cores, upon which the layers are placed, are measured following printed circuit board lamination and prior to drill. The cores should be measured with an instrument with a precision between 0.1 to 0.3 mils. This level of precision may be obtained from high quality x-ray equipment. Each layer preferably has a plurality of targets that are used as movement measuring points. The targets are preferably located on each of the four corners of the printed circuit board. For example, for core 1, as shown in FIG. 3, there will be two measurements in the warp direction on the layer 2 and 2 measurements in the warp direction on the layer 3. For 10 panels (which preferably comprises 1 experimental run), there will be 40 readings per core in one direction. The readings are averaged to provide one data entry point in the experimental results table. For example, in FIG. 10a, the value for m23×(95) (the movement of the core around layer 2 and layer 3 (i.e., Core 1)) for Configuration=1, Dielectric=1, Time=1 and Machine=1 is −16.90. This represents the mean of the readings (which is designated by "m" in m23x). And, this means that the artwork which is used to layout the circuit on the layer should be grown in order to compensate for 16.9 mils of shrinkage in the x direction. Similarly, the values for column m45y are the movement of the core (i.e., Core 2) around layers 4 and 5 in the y direction. And, the values for column m67x are the movement of the core around layers 6 and 7 (i.e., Core 3) in the x direction.

Experimental printed wiring boards are fabricated for each condition or combination of conditions chosen. The data is averaged and tabulated according to FIGS. 10a–c. The model is then generated, as shown at block 88. FIGS. 10a–c show the results of experiments to generate compensation matrices for cores 4 mil, 5 mil and 8 mil respectively. Data is derived from experimental printed wiring boards along with some process characteristics were precisely varied. Each row in FIGS. 10a–c describes the setting of the variables and the average result for the run on each core and core direction. T data in the columns under "Experimental Results" represent the movement in the X and Y direction of the various layers of the printed circuit board.

Comparing FIG. 1 which is a prior art modeling method with FIGS. 10a–c reveals a substantial source of compensation error not identified by the prior art method. For example, a signal/signal 4 mil core in FIG. 1 in the warp direction has 17.982 mils of compensation. A signal/signal internal 4 mil core, as shown in FIG. 10a (96), has 8.65 mils of compensation (Config=2, Dielectric=4). The difference between these two values is a compensation error of 9.3 mils or 0.518 mils/inch or 518 PPM. This compensation error alone would produce on a 24"×18" panel an average TPR of 2.6 mils and 4.7 mils at each corner provided there was perfect optimization. When the Y error is added to this same example we have an error of −1.056 mils minus 9.76 mils or 10.82 mils or 450 PPM. The combined effect of the X and Y compensation error yields an average compensation TPR of 4.21 mils with 7.13 mils at the corners.

The statistical validity of the model is shown with the Rsquare label in FIG. 10a. The Rsquare values are close to 1.0, indicating that the a significant amount of compensation error can be explained by the compensation model. For the 2–3 core and the 4–5 core there was a high degree of statistical validity. As described subsequently, core 3 is considered a mirror image of core 1. Therefore, the data from core 3 is not used in building the compensation model; however, data for core 3 provides a measure of consistency (i.e., the data from core 3 is compared with the data from core 1 to determine whether the data is consistent).

FIG. 10a shows that the prior art compensation matrix shown in FIG. 1 is too simple to be effective in making accurate compensation error predictions. The maximum range seen in FIG. 10a was (21.75 mils −3.70 mils) 18.05 mils in the X(warp) direction and 15.63 mils in the Y(fill) direction. The ranges for just the 4 mil core well exceed the ranges seen on all of the cores listed in FIG. 1.

Moreover, the compensation model prepared according to this invention may be expressed in a variety of formats including tabular form, as shown in FIGS. 10a–c, in equation format, as shown in FIGS. 11a–l, for cores 4 mil, 5 mil and 8 mil respectively, in correction factor format, as discussed subsequently, or in graph format, as shown in FIGS. 8a and 8b. From FIGS. 10a–c, coefficients for a polynomial equation may be generated, as shown in FIGS. 11a–l. Referring to FIGS. 11a–f, there are shown coefficients of equations of the compensation model for outer cores with thickness of 4 mil warp and fill, 5 mil warp and fill and 8 mil warp and fill, respectively. Referring to FIGS. 11g–l, there are shown coefficients of equations of the compensation model for inner cores with thickness of 4 mil warp and fill, 5 mil warp and fill and 8 mil warp and fill, respectively. These coefficients were generated using a least squares regression analysis using the data in FIGS. 10a–c. The least squares regression analysis have predictor variables (e.g., dielectric, configuration, time machine, etc.) that are categorical, wherein the variables have discrete values and no particular ordering of values. For example, for the coefficients of FIG. 11a, which is for an outer 4 mil warp compensation model, column m23x is examined in FIG. 10a. Similarly, for the coefficients of FIG. 11b, which is for an outer 4 mil fill compensation model, column m23y is examined in FIG. 10a. From the coefficients, it is evident that the compensation model is based upon the dielectric layer, the circuit layout and the interaction between the dielectric layout and the circuit layout, as shown in column 97 of FIGS. 11a–l wherein the coefficients relate to the configuration, the dielectric and the configuration*dielectric.

An example of the estimating the compensation error using the equations of FIGS. 11a–l is as follows. FIG. 11g shows the coefficients for the 4 mil core in the warp direction for an inner core. Depending on the configuration and the type of dielectrics, different coefficients are factored in. For the example of FIG. 11g, the configuration=2 (gg/ss/gg), and four dielectric layers are used. The first dielectric layer, which is designated as pp1, as shown by column 99, is prepreg(2), which is prepreg 2113. Because there is one ply of prepreg(2), column 99a equals 1, so that the total in column 99b is equal to 1*0.5966518. The second dielectric layer, which is designated as pp2, as shown by column 100, is prepreg(4), which is prepreg 7628. The third dielectric layer, which is designated as pp3, as shown by column 101, is prepreg(1), which is prepreg 1080. The fourth dielectric layer, which is designated as pp4, as shown by column 102, is prepreg(2), which is prepreg 2113. In addition, the coefficients for configurations*dielectric must be taken into account. In the particular example, configuration=2 must be factored in with the two plies of prepreg(2), one ply of prepreg(1) and one ply of prepreg(4). Calculating the compensation error is as follows. First, the totals in the columns are added together. For example, the total for column 99b is determined. Second, a weighted average is taken for the totals in the columns. For example, in FIG. 11g, each of the totals in the columns is multiplied by 25%. Thereafter, the mils/" is determined by dividing the weighted average by the total inches in the warp direction (which in this case is 18").

Each of FIGS. 11a–g determines the compensation error for an outer core with configuration=1 and 2 plies of Dielectric=2, 1 ply of Dielectric=1 and 1 ply of Dielectric=3. FIG. 11 1a determines that the compensation error −0.601 mils/inch for a 4 mil core in the warp direction. FIG. 11b determines that the compensation error −0.274 mils/inch for a 4 mil core in the fill direction. FIG. 11c determines that the compensation error −0.272 mils/inch for a 5 mil core in the warp direction. FIG. 11d determines that the compensation error −0.334 mils/inch for a 5 mil core in the fill direction. FIG. 11e determines that the compensation error −0.315 mils/inch for a 8 mil core in the warp direction. FIG. 11f determines that the compensation error −0.420 mils/inch for a 8 mil core in the fill direction.

Extrapolations of the Compensation Model

The experimental MLB data used to prepare the models shown in FIGS. 10a–c and 11a–f is a subset of the myriad of possible printed circuit board configurations. The compensation simulation of this invention may, however, be applied to a variety of printed circuit board configurations, through extrapolation of the experimental MLB data, based on (1) different circuit configurations; (2) different dielectric layers; (3) different thicknesses of cores; (4) position of core in the stack; (5) thicknesses of conductive material in the circuit; (6) time dependence of compensation error; and (7) machine dependence of compensation error. Therefore, it is an aspect of this invention to provide a simulator that can model all possible printed circuit board configurations. In an alternate embodiment, all possible printed circuit board configurations may be modeled, thereby obviating the need for extrapolation.

1. Circuit Configurations

The models of this invention can be modified to estimate the compensation error for a multitude of circuit configurations. In a preferred embodiment, as shown in FIGS. 10a–c, only a subset of the circuit configurations are actually fabricated and measured. Modeling all possible circuit configurations is unfeasible due to the sheer number of combinations. Referring to Appendix A, there is shown various combinations of different MLB configurations and different dielectric layers. The total number of possible combinations shown is 147,456, which is far too high to model by individual experiments. However, experimenting on a subset of these combinations and extrapolating the results to model the warping, expansion and contraction behavior of the remainder allows the compensation model to be practically implemented.

As shown in FIGS. 10a–c, for each experimental run, there is an average result generated, as shown in columns m23x, m23y, m45x, m45y, m67x and m67y. As described previously, a subset of the circuit configurations are manufactured and tested. In order to obtain results for other circuit configurations, one can extrapolate the data from the experimental circuit configurations in the table. For example, the following Table shows how unevaluated circuit configurations may be calculated based on circuit configurations 1–4.

TABLE 2

Extrapolation of Circuit Configurations

| Configuration | Description | Outer (position of core) | Inner (position of core) |
| --- | --- | --- | --- |
| 1 | ss/gg/ss | ss | gg |
| 2 | gg/ss/gg | gg | ss |
| 3 | gs/ss/sg | gs | ss |
| 4 | gs/gg/sg | gs | gg |
| 5 | ss/ss/ss | Configuration = 1 | Configuration = 3 |
| 6 | gg/gg/gg | Configuration = 2 | Configuration = 4 |
| 7 | gs/gs/sg | Avg. of Configuration = 3, Configuration = 4 | Avg. of Configuration = 3, Configuration = 4 |
| 8 | ss/gs/ss | Configuration = 2 | Avg. of Configuration = 3, Configuration = 4 |
| 9 | gg/sg/sg | Configuration = 1 | Avg. of Configuration = 2, Configuration = 4 |

As shown in Table 2, unevaluated circuit configuration errors can be determined using the simulator of this invention from the original experimental results. For example, the outer layer for Configuration=5 is ss. This outer layer is similar to the outer configuration for Configuration=1. Thus, the results for m23x and m23y may be used for the outer layer for Configuration=5. In an alternative embodiment, additional accuracy may be attained through more complex analysis. For example, the compensation error in the outer layer of Configuration=5 is dependent, in part, on the inner layout (e.g., ss/ss/ss). However, using the outer layer measurements for Configuration=1 may not fully model the compensation error since Configuration=1 has a layout of ss/gg/ss. If additional precision is required, additional experiments may be run on a similar configuration. Alternatively, more complex extrapolation of the existing experiments may be performed.

In addition, two configurations may be averaged in order to obtain a third configuration. For example, for the inner layer of Configuration=7 (gs), the inner layers of Configuration=3 (ss) and Configuration=4 (gg) are averaged. In alternative embodiments, more complex mathematical operations may be performed in order to obtain more precise results for unevaluated circuit configurations.

2. Dielectric Layers

In addition to extrapolating the experimented circuit layouts to obtain the compensation results of additional circuit layouts, different dielectric layers may likewise be extrapolated from the model. As shown in FIGS. 10a–c, there are four values of prepreg which are the subject of the experiments. For example, in FIG. 10a, Configuration=1, Dielectric=2, Time=2 and Machine=4, the Dielectric used throughout the MLB is prepreg 2113. In practice, there can be many different types of prepreg materials used in printed circuit boards. For example, different dielectric layers may be used around one core. As one example, consider an inner core of 5 mils (with a Configuration=1) in which one side of the core has prepreg 1080 (Dielectric=1) and the other side of the core has prepreg 2116 (Dielectric=3). According to FIG. 10b, the movement in the X direction for Configuration=1 and Dielectric=1 (without dependence on time and machine) is a shrinkage of 13.316 mils. Similarly, the movement for Configuration=1 and Dielectric=3 (without dependence on time and machine) is a shrinkage of 15.322 mils. In order to calculate a compensation error based on the mixed dielectric layer in the example, the average of the compensation errors is calculated so that the compensation error is −14.319.

Further, the compensation error can be estimated for multiple layers of prepreg around a core. As a modification of the previous example, consider around an inner core of 5 mils (with a Configuration=1) in which one side of the core has two dielectric layers: 1 sheet of prepreg 1080 (Dielectric=1) and 1 sheet of prepreg 2113 (Dielectric=2) and the other side of the core has two dielectric layers: 1 sheet of prepreg 2116 (Dielectric=3) and 1 sheet of prepreg 7628 (Dielectric=4). In order to estimate the compensation error, based on the compensation model, for multiple layers of prepreg around the core, a weighted average can be used. In a preferred embodiment, a weighted average is used in which the "weights" for each of the prepregs around the core is based on the number of sheets of prepreg used. In the example above, one sheet is used for each of the prepregs, so that each prepreg is weighted at 25%. Therefore, the weighted average is taken so that the compensation error is:

$$(-13.316*.25)+(-11.4265*.25)+(-15.322*.25)+(-8.5175*.25)=-12.15$$

Figure 14A:
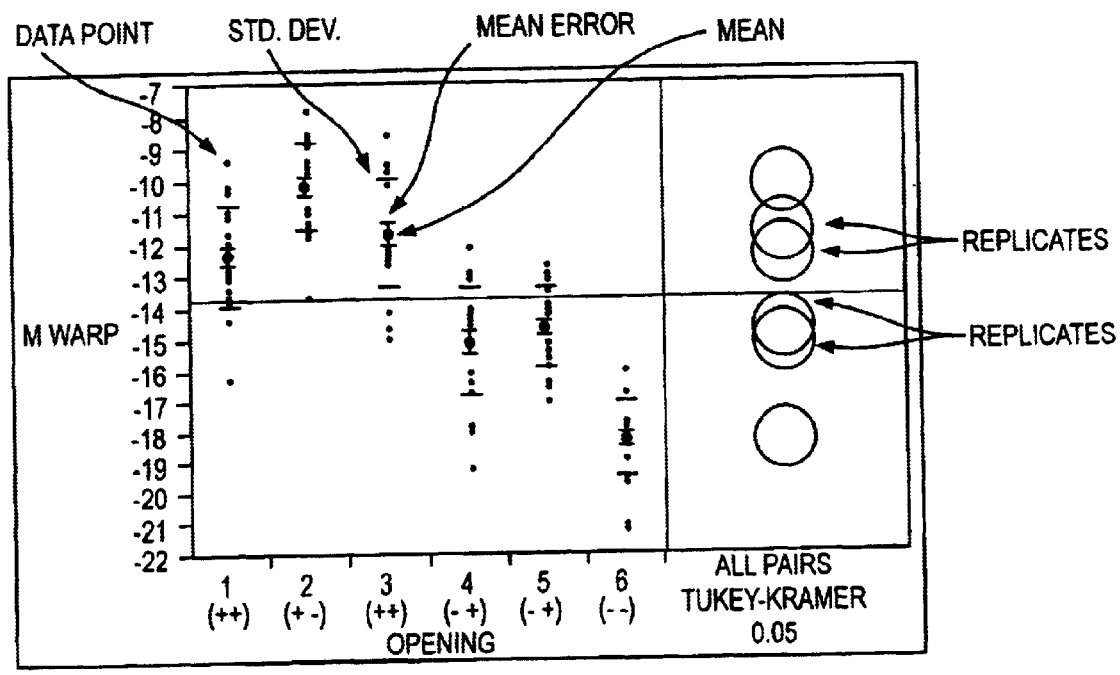
FIGS. 14a and 14b are graphs of the results of experiments of the movement for the warp and fill, respectively, for a 6 mil core when the resin percentage and the cure percentage are varied.
Figure 14B:
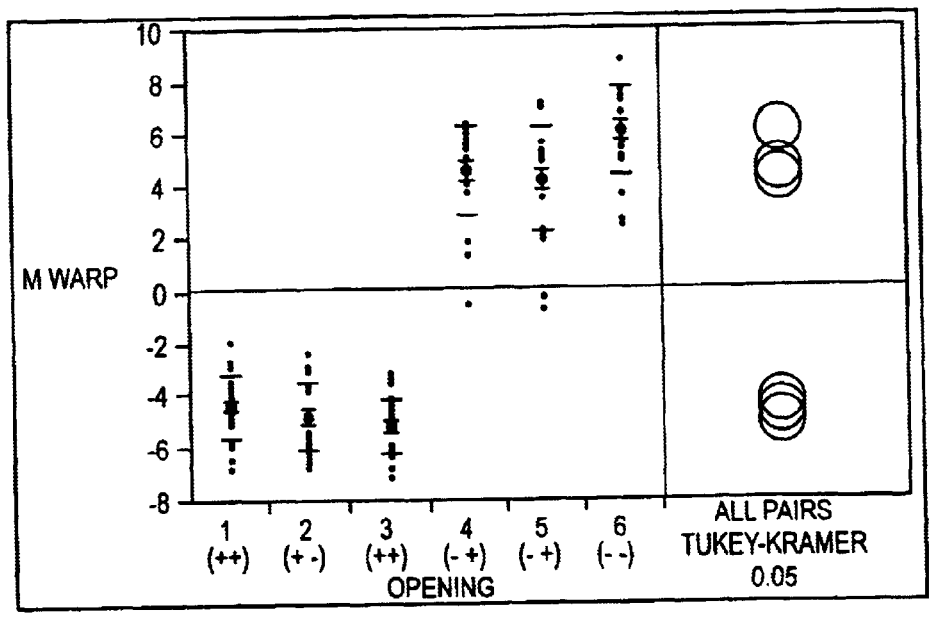

Moreover, the compensation error may be estimated for different prepreg resin percentages. As discussed previously, FIGS. 10a–c show dielectric layers with either standard or high resin content. In the event that the model does not specifically disclose the dielectric layer with the same resin percentage, one may extrapolate based on the previous experimental results. Referring to FIGS. 14a and 14b, there are shown a graph of the results of experiments of the movement for the warp and fill for a 6 mil core when the resin percentage and the cure percentage are varied. The MLB was a six layer board with signal/signal configurations on both cores and 2 plies of prepreg 1080 surrounding each core. In particular, in FIGS. 14a and 14b, (++) represents high resin %, high cure %; (+−) represents high resin %, low cure %; (−+) represents low resin %, high cure %; (−−) represents low resin %, low cure %. And, the difference, percentagewise, between the high resin % and low resin % is 10%. Based on these experiments, one may derive a correction factor. For example, examining FIG. 14b, one can determine that for experiments under (++), the mean fill movement is approximately 4 mils. Similarly, for (−+), the mean fill movement is approximately +5 mils. Thus, to calculate a correction factor based on the % change in resin, one may calculate the following:

(movement of the high % resin—movement of the low % resin)/(% difference) (4 mils−5 mils)/10%=−0.9 mils/%

Thus, the correction factor for a resin percentage which is different from the model is −0.9 mils/% in the fill direction for a 6 mil board with signal/signal configurations on both cores and 2 plies of 1080 prepreg surrounding each core.

Finally, from examining FIGS. 14a and 14b, it is evident that the effect from changes in the cure % is less than the effect from changes from the resin %. As discussed previously, prepreg is considered a b-stage material since it is not fully cured. Depending on whether the prepreg is more or less cured is indicated by the cure percentage. As shown in FIG. 14a, the movement in the warp direction varied based upon the percentage of cure. In particular, for the (++) experiment (high cure %), the mean movement was approximately −12.2 mils whereas the mean movement for the (+−) experiment (low cure %) was approximately −10.1 mils. In addition, for the (−+) experiment (high cure %), the mean movement was approximately −15.0 mils whereas the mean movement for the (−−) experiment (low cure %) was approximately −18.5 mils. Based on this information, a correction factor may be generated based on the cure percentage.

Figure 14C:
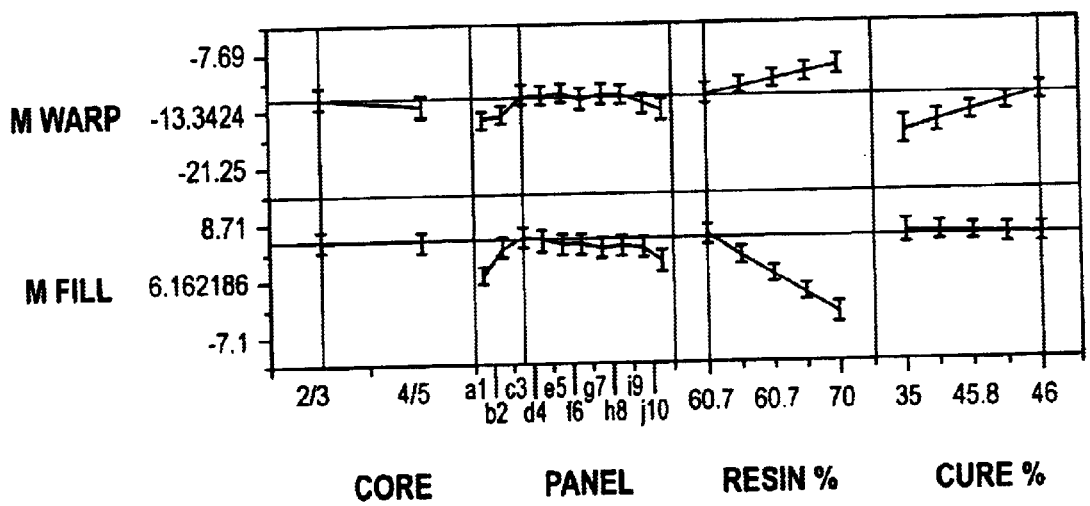
FIGS. 14c and 14d are graphs of the compensation error in warp and fill when varying the resin percentage and the degree of cure for a 6 mil core.
Figure 14D:
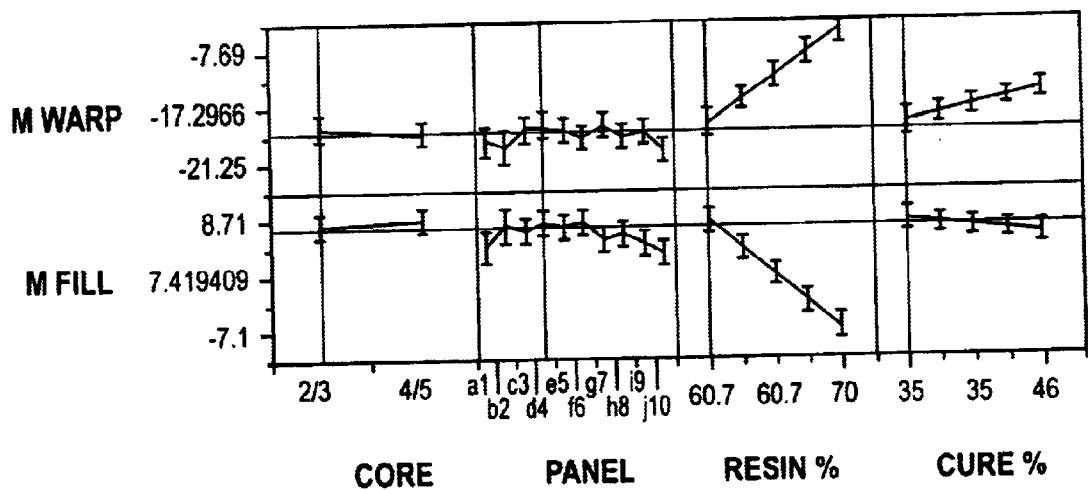

Referring to FIGS. 14c and 14d, there are shown graphs of the compensation error in warp and fill when varying the resin percentage and the degree of cure. Additional graphs are shown in order to determine whether other factors might be contributing to the compensation error. For example, both the inner and outer cores were examined (i.e., ⅔ (outer core) and ⅕ (inner core) for the core graph) showing that the position of the core was not significant in terms of calculating the compensation error for changes in resin % or cure % Similarly, the different panels in the book were examined. As discussed previously, during experimental modeling, a book of 10 or more MLBs are stacked on top of one another for testing. From the graph, it appears that the position of the MLB in the book is likewise not significant. However, the range of compensation error for warp and fill for changes in resin from 60.7% to 70% are from −13 to −8 and 8 to −7 mils, respectively. In addition, the range of compensation error for warp and fill for changes in cure from 35% to 46% are from −17 to −12 and −8 to −7 mils, respectively. From these results, it is clear that resin percentage is an important factor in both the warp and fill direction. To a much lesser extent, the cure percentage might have an effect in the warp direction.

3. Thicknesses of Cores

FIGS. 10a–c are compensation models for a printed circuit board with a uniform core thickness throughout (e.g., 4 mil cores used throughout the stack in FIG. 10a). However, there are times when cores with different thicknesses are used in an MLB. One example of a printed circuit board configuration is shown in FIG. 3. Using different core thicknesses, a 4 mil core is used in the outer cores and a 5 mil core is used in the inner core. In a preferred embodiment, when seeking the movement in either the outer cores or the inner cores, the tables corresponding to the thickness of the core are only examined (i.e., in the example, FIG. 10a is examined for the movement for the outer 4 mil core and FIG. 10b is examined for the movement for the inner 5 mil core). In an alternate embodiment, an extrapolation based on the results in the tables is performed. For example, the movement of the inner 5 mil core may be the weighted average of the compensation model for the 5 mil core and the 4 mil core.

4. Position of Core in the Stack

As shown in FIGS. 10a–c, the position of the core in the stack is one of the factors to determine compensation error. The position affects the movement due to compensation error, wherein different values for compensation error are given, for example, for m23x, m45x, m23y and m45y. In a preferred embodiment, the cores used in the model are designated as inner or outer cores. An inner core is inside the multilayer printed circuit board, such as the Core 2 in FIG. 3, and the inner core is adjacent to an outer core. As shown in FIGS. 10a–c, the compensation model for the inner core is m45x and m45y. Examples of outer cores, as shown in FIG. 3, are Core 1 and Core 3. In a preferred embodiment, the compensation model for the outer cores is designated by m23x and m23y, as shown in FIGS. 10a–c. The results for the movement of core 3 (m67x and m67y) are used to determine whether the results for m23x and m23y are acceptable.

While the experimental MLBs had 8 layers and 3 cores, the compensation simulator may be applied to MLBs with more or less layers and cores. For example, for an MLB with 4 cores (and 10 layers), in one embodiment, no extrapolation is necessary. For example, for cores of thickness of 4 mils, FIG. 10a may be used directly for estimates of compensation error. The estimate for the outer cores [core 1 (layers 2 and 3) and core 4 (layers 8 and 9)] corresponds to column m23x and m23y. Because each of the inner cores (cores 2 and 3) for the 10 layer board are adjacent to an outer core (cores 1 and 4, respectively), the compensation movement of the inner cores for the 10 layer board is similar to the compensation movement for the inner core for the 8 layer board (wherein the inner core is also adjacent to an outer core). Thus, the estimate for the inner cores [core 2 (layers 4 and 5) and core 3 (layers 6 and 7)] correspond to column m45x and m45y.

For an MLB with 5 cores, there are two outer cores [core 1 (layers 2 and 3) and core 5 (layers 10 and 11)]. The estimate for compensation error for the outer cores is m23x and m23y. The estimate for compensation errors for the inner cores adjacent to an outer core [core 2 (layers 4 and 5) and core 4 (layers 8 and 9)] is m45x and m45y. The estimate for an inner core adjacent to another inner core should be extrapolated from the model.

5. Thicknesses of Conductive Material in the Circuit

Conductive material in the circuit may vary in the thickness. For example, when the conductor is copper it is common for the thickness to be either 1.2 mils or 0.5 mils. The thickness is likewise a factor which contributes to compensation error, which may be determined empirically, similar to determining the correction factor based on resin percentage.

6. Time Variable Compensation Error

As shown in FIGS. 10a–c, the experimental design shown matrix has up to four variables, two of which are associated with noise in the system (Time and Machine). The compensation error for each of the four times and for each of the four machines can be computed with a standard deviation. From this, a statistical difference between the averages can be determined. If there is a difference in the averages, further analysis is required. For example, if there is a statistical difference in the results for Time=1 and Time=4, this indicates that the compensation error is time dependent. With this information, one may proceed attempt to examine the printed circuit board processes to determine the source of the time dependent variation. Alternatively, one may accept the time dependence of the compensation error so that the model may include a time dependent variable.

7. Machine Variable Compensation Error

Similar to the potential time dependence of the compensation error, if there is a statistical difference between Machine=1 and Machine=3, the specific machines should be examined to determine whether there is a fault in the machine (such as a faulty lamination press, operator error, or faulty measurement machine). Alternatively, the compensation error can be specifically tailored to individual machines in the printed circuit board machine shop.

Applying the Compensation Model

Figure 4B:
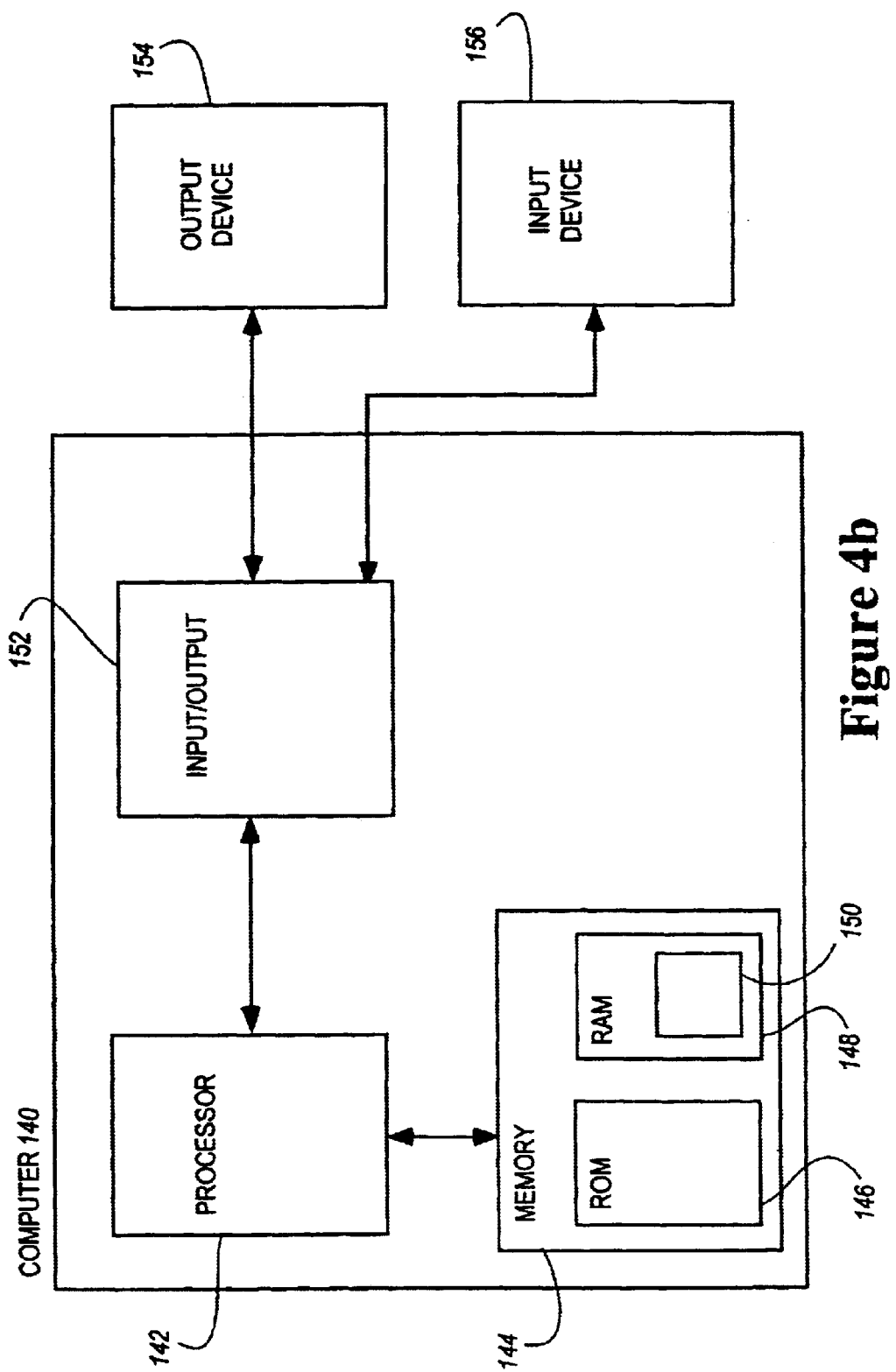
FIG. 4b is a block diagram of a general purpose computer, input device and output device.

The compensation model may be executed by using a general purpose computer as shown in FIG. 4b. Referring to FIG. 4b, there is shown a block diagram of a general purpose computer, input device and output device. The computer 140 has a processor 142 which is connected to a memory 144. The memory 144 includes a read only memory (ROM) 146 and a random access memory (RAM) 148. The RAM includes tables 150, such as the tables as shown in FIGS. 10a–c. Processor 142 is also connected to input/output driver 152 which is connected to an output device 154, such as a printer or a monitor and an input device 156, such as a keyboard or a mouse. Resident in memory 144 is software to execute the compensation model. Also resident in memory 144 is the CAD file which contains the layouts for the circuits on the layers. Based on the compensation model, which is located in memory 144, the processor 142 determines the amount of shrinkage or stretching due to compensation error. The processor 142 may then modify the CAD file. For example, the processor 142 may scale the CAD file (e.g., by multiplying or dividing the components in the CAD file) in order to alter the circuit layouts. In addition, the processor may perform the extrapolations of the compensation model, such as averaging or combining different aspects of the model.

Figure 2:
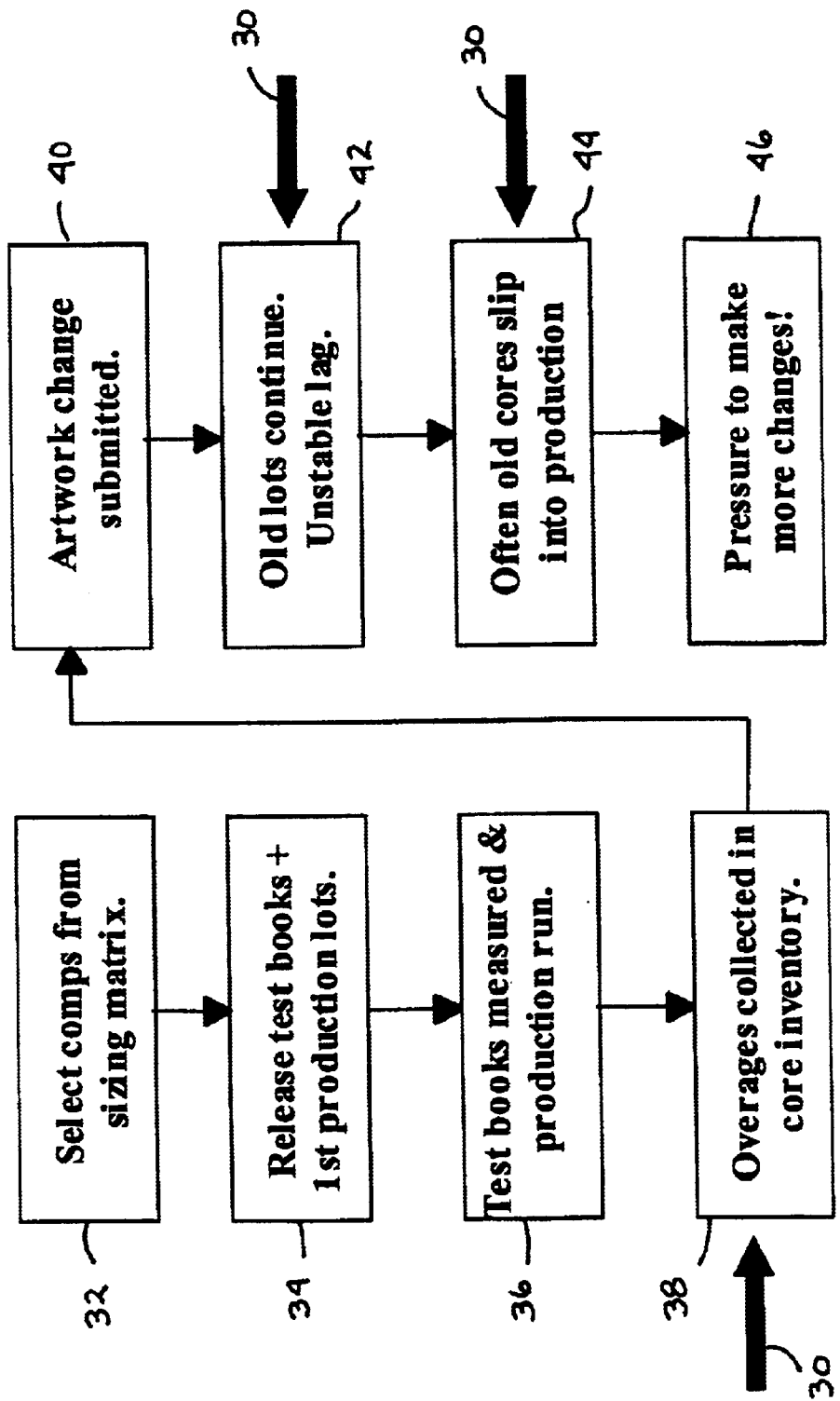
FIG. 2 is a flow chart of a simplified process map for a compensation process for a large printed circuit board shop.

The compensation model may be used in a variety of situations, both before and during production. For example, the compensation model may be used to determine potential errors during registration of the MLB prior to production. As shown in FIG. 2, registration errors are best corrected before the start of production. Thus, in order to minimize disruption of manufacturing, the compensation model assists in minimizing registration errors before production begins.

Typically, a printed circuit board manufacturer receives orders to manufacture MLBs with certain factors (such as number of cores, circuit layouts, types of dielectrics, etc.). With the compensation model, the manufacturer may determine whether the registration of the MLBs will be within tolerance prior to the start of production. If the registration is not within tolerance, the circuit layouts may be altered as discussed above (by shrinking or stretching the circuit layouts to cancel out the material movement and reduce the compensation error).

Figure 12:
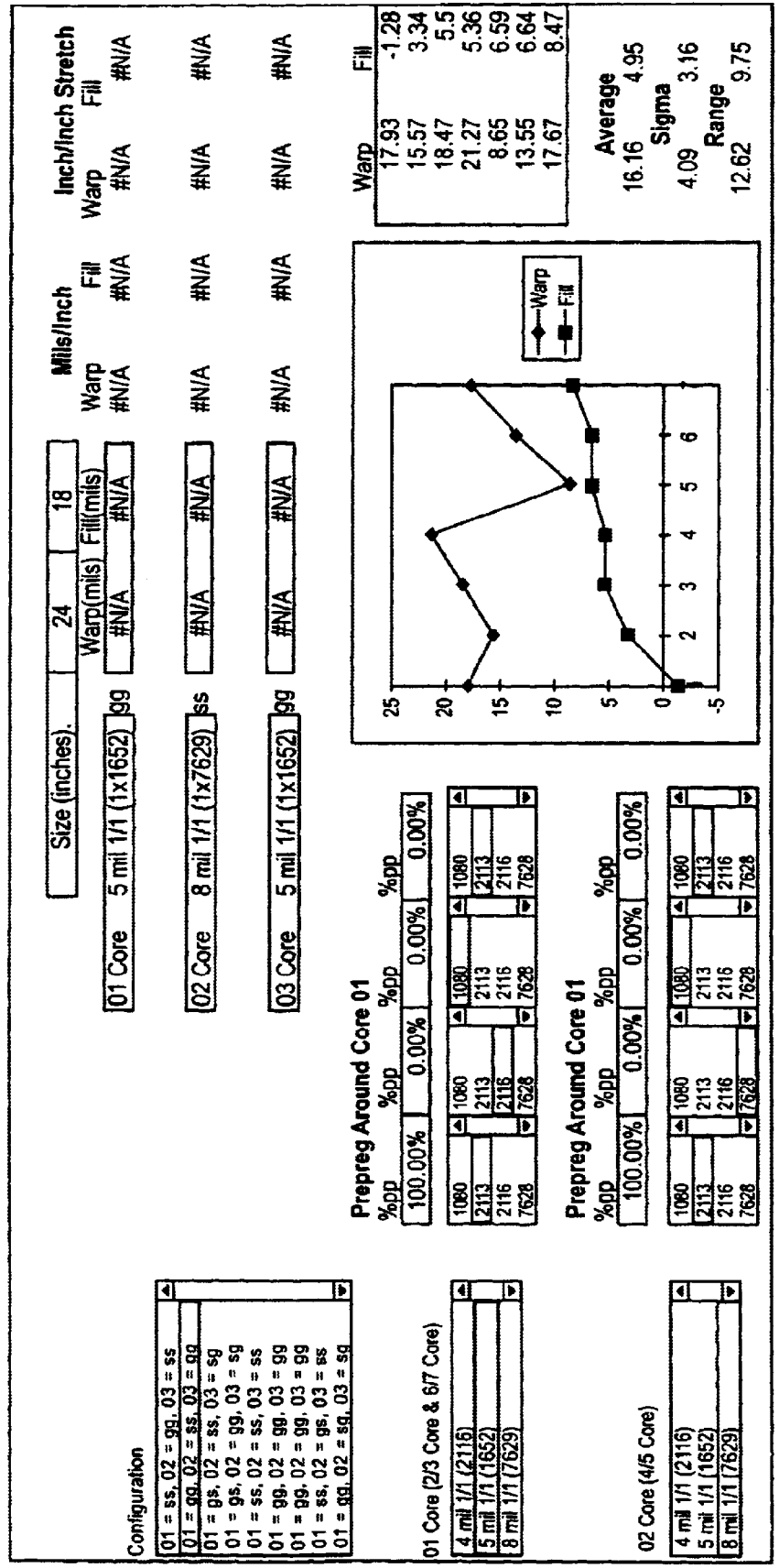
FIG. 12 is a plot of warp and fill compensation errors for various configurations of multilayer printed circuit boards.

For example, as shown in FIG. 12, one may modify the factors and determine the warp and fill movement. As shown in the plot in FIG. 12, the prepregs are modified using 7 different configurations (as shown on the x-axis) and different compensation errors (as shown on the y-axis). In addition, as shown in FIG. 2, there are points at which artwork is changed during production in order to minimize compensation errors, as shown at block 40 of FIG. 2.

Figure 13:
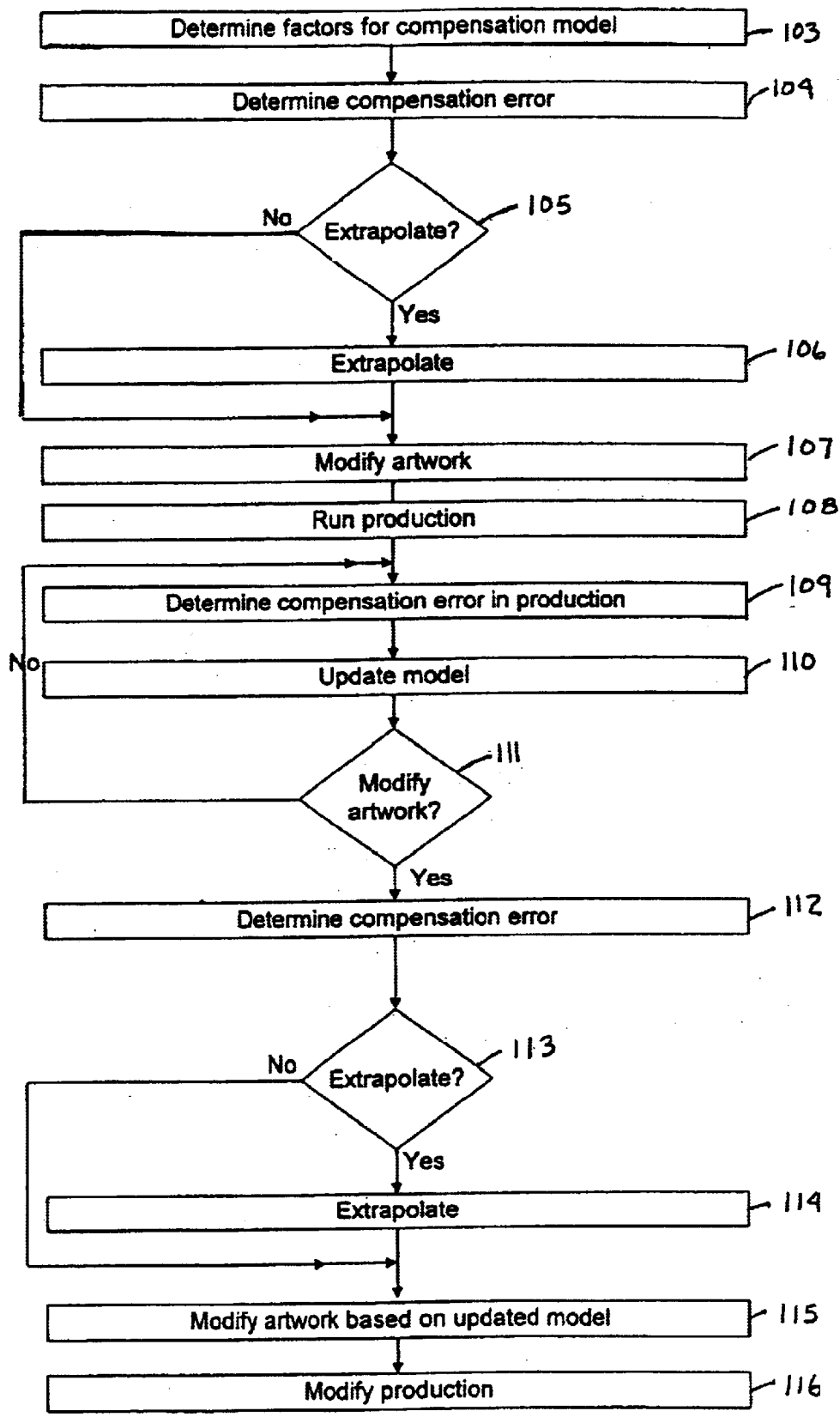
FIG. 13 is a flow chart of an example of the use of the compensation is model prior to and during production.

Referring to FIG. 13, there is shown a flow chart of an example of the use of the compensation model prior to and during production. As shown at block 103, the factors are determined for the compensation model. Based on these factors, the compensation error is determined from the compensation model, as shown at block 104. Depending on the factors and the compensation model, extrapolation may be necessary, as shown at blocks 105 and 106. The artwork in the CAD file is modified, as shown at block 107, in order to counterbalance the compensation error. Thereafter, the production is run, as shown at block 108.

During production, the compensation error may be checked, as shown at block 109. This may be accomplished, for example, by inspecting the layers after lamination. In addition, the compensation model is periodically updated if necessary, as shown at block 110. For example, the compensation model is examined periodically to ensure that the model is still valid. Moreover, the model may be supplemented with additional circuit configurations, dielectric types, etc. based on new productions. For example, if a production includes configurations which are not addressed in the model, the results of the final production may be examined and used to update the model.

Depending on the amount of compensation error in the production, the artwork is modified, as shown at block 111. Similar to modifying the artwork prior to production, the compensation error is determined from the updated compensation model, as shown at block 112. Depending on the factors and the updated compensation model, extrapolation may be necessary, as shown at blocks 113 and 114. The artwork in the CAD file is modified, as shown at block 115, in order to counterbalance the compensation error. Thereafter, the production is modified, as shown at block 116.

MODELING REGISTRATION ERRORS

Registration errors occur in both single and multilayer printed circuit boards. Registration errors come from a variety of sources including, but not limited to offset error, angle error, random noise error and compensation error. When the error modes combine they do so in a dependent and interactive way. Therefore, it is incorrect to add the variances, since the errors are not independent. For example, compensation error from artwork, offset error and angle error from post etch punch machines, and random noise such as from drills cannot be combined by using the sum of the squares, as is done in the prior art. Moreover, this one-dimensional analysis of producing a number for the overall registration error does not provide insight on how the errors flow over the panel surface. A graphical registration model is necessary to fully appreciate how the errors vary over the surface of the both a single and multilayer printed circuit board.

In one embodiment, all sources of registration error, including offset, angle, compensation, and random noise errors, are factored into the registration simulator. In alternate embodiments, subsets of all the sources of registration error may be examined separately. For example, the registration simulator may factor in one source of error such as offset error (as shown in FIG. 5), angle error (as shown in FIG. 6a), random noise error (as shown in FIG. 7), and compensation error (as shown in FIGS. 8a and 8b). In addition, the registration simulator may factor in combinations of errors such as offset and angle error (as shown in FIG. 6b); angle and compensation error; offset and compensation error; offset, angle and compensation error; etc. One may thus analyze the individual sources of error and the interaction of sources of error through examination of these subsets of the sources of registration error.

Calculations for the Registration Simulator

Attached at Appendix B is the software code for the registration simulator written in Matlab language code (in Function M file format) to be used with the Matlab program on a personal computer. In a preferred embodiment, the movement of discrete positions on the various cores on the MLB is simulated. Matrices are used to represent the discrete positions on the printed circuit board. Xp=the true x positions, Xe1=matrix locations after the X offset errors have been added to Xp, Xe2=matrix locations after the X compensation error has been added to Xe1, Xe3=matrix locations after the X angle component has been added to Xe3, and Xe4 is the random noise added to each element of Xe3. In an alternate embodiment, the movement of areas of the cores or the entire core of the MLB may be simulated.

Figure 15A:
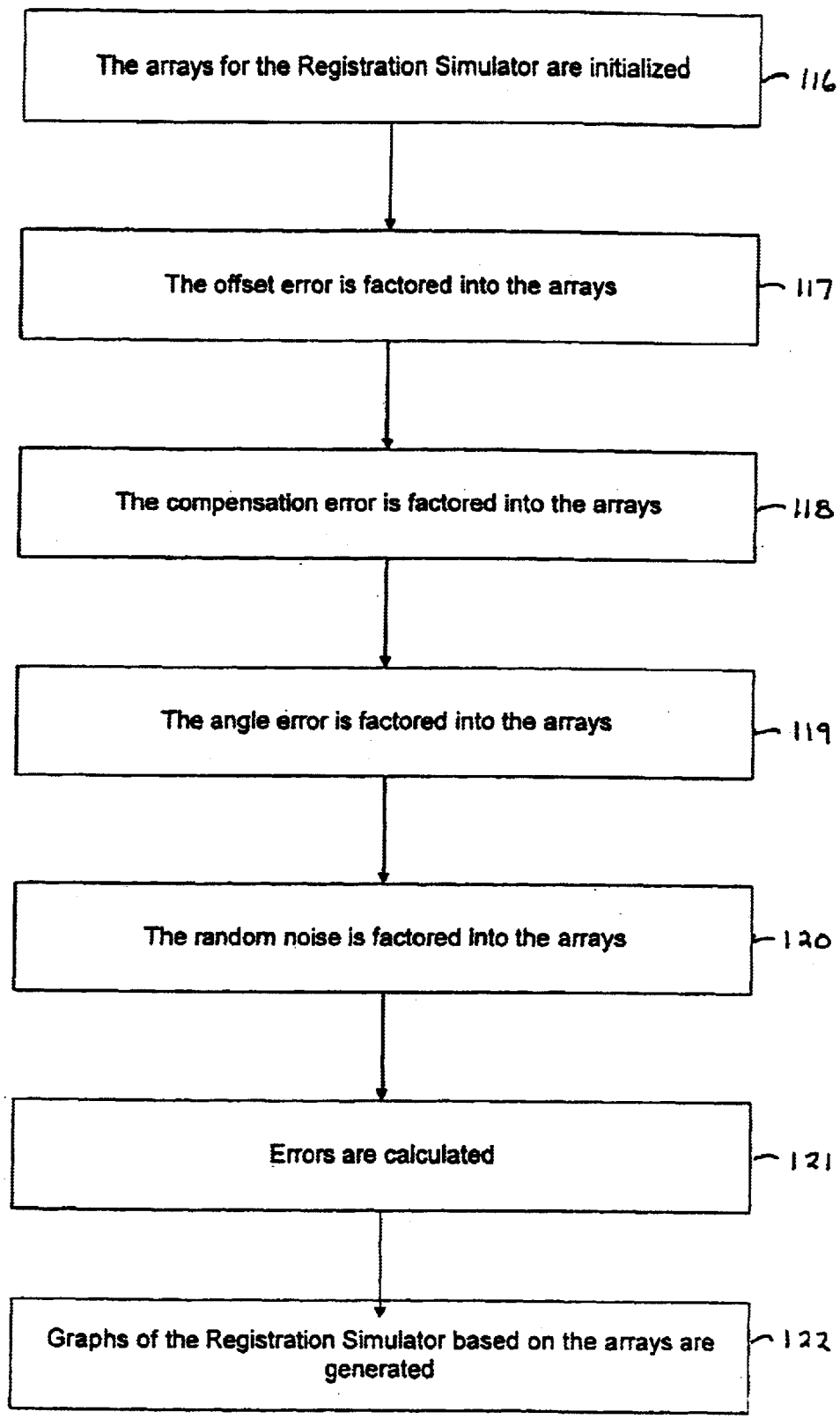
FIG. 15a is a flow chart for calculating and simulating Registration error according to an embodiment of the invention.

In a preferred embodiment, a method of using the registration simulator of this invention follows the flow chart as shown in FIG. 15a. As shown at block 116, the arrays for the registration simulator are initialized. In one embodiment, the printed circuit board is a 18" high and 24" long rectangle. This rectangle is divided by 130 elements with the (x,y) pairs of 13 columns and 10 rows as follows:

(0,18) (24,18)

. . .

. . .

(0,6) (2,6)
(0,4) (2,4)
(0,2) (2,2) (4,2) (6,2) . . .
(0,0) (2,0) (4,0) (6,0) (8,0) (10,0) (12,0) . . . (24,0)

In a preferred embodiment, the bottom left hand corner is designated as (0,0), the lower right corner is designated as (24,0), the upper left corner is designated as (0,18), and the upper right corner is designated as (24,18). The values above represent the true registration positions (i.e., the positions to achieve perfect registration). This initial array of x and y locations is divided into two matrices: (1) Xp which includes all of the initial x values; and (2) Yp which includes all of the y values. For example Xp is represented:

$$Xp = \begin{matrix} 0 & 2 & 4 & 6 & \ldots & 24 \\ 0 & 2 & 4 & 6 & \ldots & 24 \\ \ldots & & & & & \\ \ldots & & & & & \\ 0 & 2 & 4 & 6 & \ldots & 24 \end{matrix}$$

where Xp has 13 columns and 11 rows. Similarly Yp is represented:

$$Yp = \begin{matrix} 0 & 0 & 0 & 0 & \ldots & 0 \\ 0 & 2 & 2 & 2 & \ldots & 2 \\ \ldots & & & & & \\ \ldots & & & & & \\ 18 & 18 & 18 & 18 & \ldots & 18 \end{matrix}$$

Yp has 13 columns and 11 rows. Plotting Yp versus Xp produces the initial 130-point grid seen on the simulator (e.g., the "+" as shown in FIG. 3). The Xp and Yp matrices are stored in the program so that error computations can be computed and so that the true registration positions may be graphed. The separation of the (x,y) airs into two separate matrices allows error to be added that is different in the X direction and Y direction. In addition, Xp and Yp have rows and columns that represent the panel flipped vertically from the initial array of true positions. For example, Xp(1,1) {row 1, column 1 of Xp} and Yp(1,1) taken as an (x,y) pair represent the lower right hand corner. Likewise, Xp(13,10) and Yp(13,10) taken as an (x,y) pair represent the upper right hand corner.

As discussed previously, registration error may come from a variety of sources, such as angle, offset, compensation and random noise error. The order in which the registration simulator factors the errors is unimportant. In one embodiment, the offset, compensation, angle, and random noise errors are analyzed, in that order, to determine the movement of the discrete positions. For example, as described subsequently, four sets of matrices are used to calculate the error movement of the discrete positions: Xe1 and Ye1 (factors offset error); Xe2 and Ye2 (factors offset and compensation error); Xe3 and Ye3 (factors offset, compensation and angle error); and Xe4 and Ye4 (factors offset, compensation, angle and random noise error). Alternatively, the order in which the errors are analyzed may vary depending on the preference of the operator.

As shown at block 117 of FIG. 15a, the offset error is factored into the arrays. In one embodiment, the X offset error and the Y offset error are specified by the user. In an alternate embodiment, the X offset error and the Y offset error may be determined empirically, as described subsequently. The X offset error is added to every component of the Xp matrix and forms the first X error matrix, which is called Xe1. Similarly the Y offset error is added to every component of the Yp matrix and forms the first Y error matrix Ye1.

As one example of determining the movement of the discrete positions based on the offset error, let Cx=a constant matrix of 130 values of 10 rows and 13 columns of the specified X offset error. Then:

$$Xe1 = Xp + Cx$$

The Xe1 and Ye1 matrices are used subsequently in other error manipulations that lead to the final registration error. In order to generate plots of the effect, the "matrix plot" of the offset error matrices are scaled by 100. For example, if there were only an X offset error and it was 2 mils, then the following Xe1 matrix against Yp would be plotted:

$$Xe1(plot) = 0 + .002 \times 100 \quad 2 + .002 \times 100 \ldots 24 + .002 \times 100 \text{ Etc} \ldots$$

For the matrix plot, all of the errors are scaled by a factor of 100 in order to view the error graphically.

As shown at block 118, the compensation error is factored into the arrays. In particular, the compensation error is added to the result from the offset error calculation. Each of the 130 elements in the offset data arrays can be labeled and identified by row number and column number, which is also identified as an index. In order to add the compensation error, the Xe1 matrix is divided into a left and right half and the Ye1 matrix is divided into a upper and lower half by using the index values. The Xe1lh (left half) is defined by rows 1 through 13 (all rows) and columns 1 through 6 of Xe1. The Xe1rh (right half) is defined by rows 1 through 13 and columns 8 through 13 of Xe1. Compensation error does not affect the center of the panel (i.e., no shrinkage or expansion in the center index, as shown in FIG. 8a and 8b). Since the compensation error occurs from the center index (column 7 for the X and between row 5 and row 6), column 7 of the Xe1 do not change. The Xe2rh elements are computed below were d=2" (spacing between elements), l=number of elements away from the $7^{th}$ column, xce= compensation error in mils/" (which may be of + or − sign, representing over and under compensation, respectively), and xe1=the offset error in the X direction):

$$Xe2rh=(2+xe1)+2*1*xce$$

for all columns 1 through 6 and all rows 1 through 10. The first row of Xe1 rh preferably resembles the following:

$$2(1+1*xce)+xe1\ 2(1+2*xce)+xe1\ \ldots\ 2(1+12*sce)+xe1$$

The left half would be computed in a similar manner. In order to obtain the entire Xe2 matrix:

$$Xe2=[Xe2lh,\ \text{Column 7},\ Xe2rh]$$

The same procedure may be used for the Ye2 matrix. For the Ye2bh (bottom half), the first row would be computed as ½ of the spacing since the center of the elements is between row 5 and row 6 of the Ye1 matrix. The other rows would use the full 2"+1" spacing. For ye1 equal to the Y offset error and yce equal to the Y compensation error, the equation is as follows:

$$Ye2bh(1^{st}\ \text{row})=1+yce+ye1\ \ldots\ 1+yce+ye1$$

$$Ye2bh(2^{nd}\ \text{row})=(2(1)+1)(1+yce)+ye1\ \ldots$$

$$\ldots$$

$$Ye2bh(5^{th}\ \text{row})=(2(4)+1)(1+yce)+ye1$$

The bottom half and the right half are combined to yield the Ye2 matrix:

$$Ye2 = \begin{matrix}[Ye2uh\\ Ye2bh]\end{matrix}$$

As shown at block 119, the angle error is factored into the arrays. Angle error is computed from the Xe2 and Ye2 matrices. In one embodiment, the center of the axis of rotation for the angle error is the center of the bottom edge of the panel. As discussed previously, this choice of the center of the axis of rotation is a matter of choice of the operator.

In order for the simulator to work correctly with the mathematics of the base Matlab program, the angle error specified in degrees is converted to radians. The component to be added to Xe2 and Ye2 is computed from the given length of the radius arm, the angle, and taking the cos(angle) for X and the sin(angle) for Y. For example, defining Xe3rh similar to Xe2rh, one would compute the following for the 1st row of Xe3rh:

$$Xe3rh(\text{row1})=xe2(1,8)*(1+\cos(\text{angle}))\ \ldots\ xe2(1,13)*(1+\cos(\text{angle}))$$

In order to compute the second row, the rotation of the vertical axis must be factored in. This will produce a staggering of the x values in the direction of rotation by an amount of:

$$x\text{add}(\text{row2})=(y\ \text{distance})*\sin(\text{angle})$$

where for the second row the y distance=2", for the $3^{rd}$ row the y distance=4" and so on. Hence, for the second row of Xe3rh, it is:

$$Xe3rh(\text{row2})=x\text{add}(\text{row2})+xe2(2,8)*(1+\cos(\text{angle}))\ \ldots$$

The left half would be computed in a similar way with the exception that the sign of the angle (+,−) would be reversed.

Column 7 would also have to be shifted started with the second row. The amount of the shift would be the current position in the column plus the xadd for the specific row. The Xe3 matrix is then:

[Xe3lh, column7 adjusted with xadd, Xe3rh]

The shift in Y resulting from the rotation may be determined from the sine of the angle. To compute the Y rotation error, one should account for the position of the center of rotation, which is at the bottom 24" edge. Due to the choice of centering the rotation at the bottom edge, the Ye3 matrix is not split into an upper and lower half for computation purposes. The Y positions may be computed from Ye2. For example, the first row of Ye3 would be:

$$Ye2(0,0)+2*6*\sin(-1*\text{angle});\ Ye2(0,1)+2*5*\sin(-1*\text{angle});\ \ldots\ Ye2(0,7);\ \ldots\ Ye2(0,13)+2*6*\sin(\text{angle})$$

Subsequent rows of Ye3 are computed in a similar fashion.

As shown at block 120, the random noise is factored into the matrices. The random noise is added to the Xe3 and Ye3 matrix. In one embodiment, a random number is selected from a normal distribution with a mean of zero and a standard deviation as specified by the operator. The random number may be selected from a random number generator such as the (normrand) function in Matlab. The program computes a noise value for each of the 130 elements in Xe3 and each of the 130 elements in Ye3. The noise values are thereafter added to the Xe3 and Ye3. In particular, a noise matrix is constructed for Xe3 and Ye3, where Nx=X noise and Ny=Y noise. Then:

$$Xe4=Xe3+Nx;\ Ye4=Ye3+Ny$$

Thus, Xe4 and Ye4 contain the error locations of the 130 elements and are subsequently compared to the true positions (positions with perfect registration).

As shown at block 121 of FIG. 15a, errors are calculated. Several errors are computed including the average TPR (as shown at block 78 of FIGS. 5–8b), the upper right TPR (as shown at block 79), the lower right TPR (as shown at block 80), the lower left TPR (as shown at block 81), and the upper left TPR (as shown at block 82). The TPR is the radial error from the true position defined as:

$$TPR=\text{square root}(x\text{error}^2+y\text{error}^2)$$

In order to obtain the average TPR for the entire 130-element array, the following is computed:

$$\text{Error}X=Xp-Xe4;\ \text{Error}Y=Yp-Ye4$$

$$\text{Average}TPR=\text{square root}(\text{sum of the squares of Error}X+\text{sum of the squares of Error}Y)/130$$

The corner TPRs (as shown at block 79–82 of FIGS. 5–8b) are more straightforward to compute, being the TPRs at the four corners. For example, the lower right hand corner TPR is:

$$TPRllc=\text{square root}(Xe4(0,0)^2+Ye4(0,0)^2)$$

As shown at block 122, graphs of the Registration Simulator are generated. In a preferred embodiment, four plots are generated: (1) marks which show the new location relative to the original location using a "+" for the perfect registration location and a "*" for the new location (e.g., FIGS. 5, 6, 7 and 8a); (2) vectors which show the magnitude of the error (relative TPR) and the direction of the error (e.g., FIG. 8c); (3) contours which show the magnitude of the TPR mapped as contours of similar value much like an elevation map for a mountain range (e.g., FIG. 8b); and (4) combination which shows the vector map overlaid on a contour map (e.g., FIG. 6b). Each map allows insight into the registration patterns. For example the marks plot is something that would be seen after drill at X-ray. The contour plot shows areas of the board that may have poor registration, helps define manufacturing capability, and gives insight into how the circuits should be placed over the panel. The vector plot shows how the error flows over the panel. And, the combination plot allows examination of the flow and the error contours simultaneously.

The marks plot is the plot of (Xe4, Ye4) and overlaying it over the plot of (Xp,Yp). The vector plot involves examining at each (x,y) pair at each of the 130 point locations. For example the vector at the lower left-hand corner would have a vector magnitude of:

Vector magnitude $(llc)$=square root$(Xe4(0,0)\hat{}2+Ye4(0,0)\hat{}2)$

And a direction of:

Vector angle $(llc)$=arctan$(Xe4(0,0)/Ye4(0,0))$

The contour plot is drawing contours at similar TPR levels.

Applications of the Registration Simulator

The registration simulator of the present invention combines the registration error modes and plots the error over the panel surface. By combining the error modes, different registration effects can be quantified and displayed, thereby explaining the seemingly unexplainable errors that occur during registration. Thus, the registration simulator may be used to (1) obtain a general understanding the source of registration errors; (2) predict registration errors, scrap rate, etc. prior to production or during production; and (3) analyze individual or several sources of registration error, by using design of experiments (DOE), in an attempt to reduce overall registration error.

The registration simulator may be executed by using a general purpose computer as shown in FIG. 4b. Resident in memory 144 is software to execute the registration simulator, as shown in Appendix B. Moreover, the processor executes the software instructions from memory 144, in order to generate an output on output device 154.

1. Obtain a General Understanding of Registration Error Source

Through examination of examples of the registration simulator, one observes several trends associated with some of the sources of registration error including: (1) poor registration in all four corners may be caused by X and Y compensation errors; (2) poor registration in all four corners may be caused by a rotation error in combination with either an X or Y offset error; (3) poor registration in half of the panel, but good registration in the other half of the panel may be caused by a compensation error in combination with an offset error; (4) poor registration in half of the panel may be caused by an angle error and an X and Y offset error; (5) poor registration in two corners may be caused by an angle error; and (6) poor registration in one corner may be caused by an angle error, offset error, and compensation error.

From these trends, it is clear that the corners are most likely to have registration problems. In addition, the operator may analyze completed panel or circuit in the midst of production and hypothesize as to the causes of registration error.

2. Predict Registration Errors, Scrap Rate, etc. Prior to and During Production

Using the registration simulator, one has the ability to predict registration errors prior to and during production, which is a valuable tool. Predicting registration errors prior to production allows a manufacturer to price the production of the MLBs accordingly, since the manufacturer has a sense of the difficulty of the order. Moreover, use of the registration simulator allows a manufacturer to reduce the registration errors before production begins by recommending improvements in the printed circuit board fabrication process.

In addition, the registration simulator may contribute to the reduction of errors during production in a variety of ways. First, the registration simulator serves to monitor the amount of registration error in the production. Second, the registration simulator can reduce errors in the production by recommending improvements in the registration process during production.

Figure 15B:
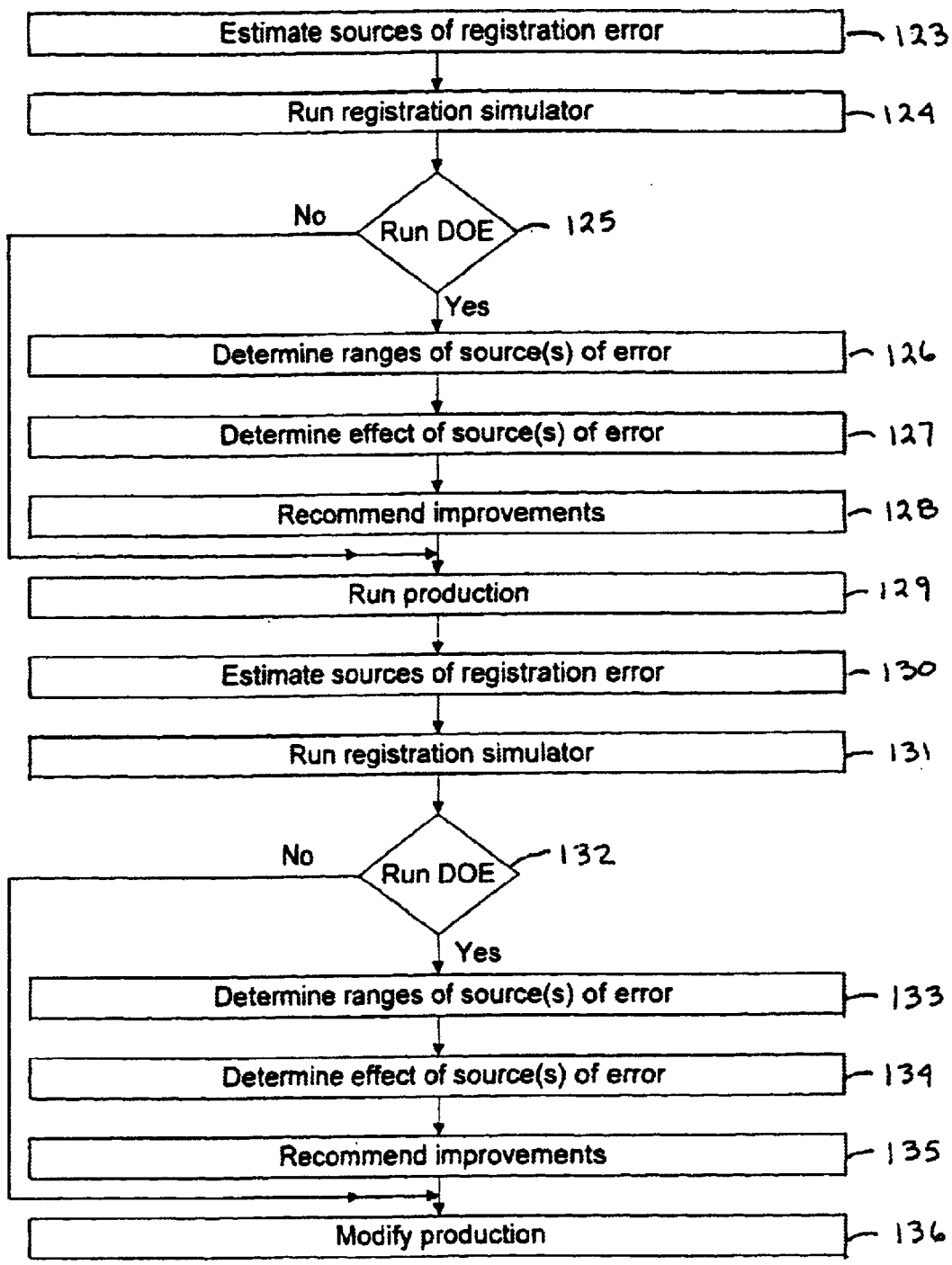
FIG. 15b is a flow chart of an example of the use of the registration simulator prior to and during production.

Referring to FIG. 15b, there is shown a flow chart of an example of the use of the registration simulator prior to and during production. As shown at block 123, the sources of registration error are estimated. Typically, orders for manufacturing of MLBs include factors such as number of cores, circuit layouts, dielectric layers, and other factors necessary to determine compensation error, as discussed previously. In addition, manufacturers of printed circuit boards may determine empirically, prior to production, the other errors which contribute to registration error such as offset, angle and random noise error. The manufacturer may estimate offset, angle and random noise error based on previous history of error for certain process conditions. For example, certain machines under certain process conditions (such as using certain machines; drilling one, two or more panels per spindle; using new drill bits; using fresh artwork, etc.) have previous measurements of offset, angle and random noise errors.

As shown at block 124 of FIG. 15b, based on the estimated sources of registration error, the registration simulator is run. Using the outputs of the registration simulator, including the graphs and the calculations of TPR, the manufacturer can estimate yield under the best and worst case scenarios.

As shown at block 125 of FIG. 15b, the manufacturer may also run a design of experiments (DOE) on the registration simulator in order to reduce registration error. As discussed previously, there may be several sources which contribute to registration error. The manufacturer may thus examine all, some or one of the sources of registration error in the context of DOE in order to determine the effect of process changes on registration error. As shown at block 126, the ranges for the source(s) of registration error are identified. Different errors, such as offset, angle, compensation and random noise error have ranges depending on best case and worst case scenarios. For example, depending on the manufacturing conditions such as using certain machines, drilling one, two or more panels per spindle, or using new drill bits, the random noise error has a range of values. Based on the range(s), the effect of the source(s) of error on overall registration error may be determined. For example, the range of values of the random noise error may be investigated to determine the effect of the random noise error on overall registration error. And, through the analysis of the DOE, one may determine the effect of the source(s) of error, as shown at block 126, by ranking the significance of the errors which contribute to overall registration error. For example, based on the DOE, it may be determined that the random noise error contributes less to overall registration error than compensation error.

As shown at block 128, improvements can be recommended based on the determination of the effect of the source(s) of error. These improvement options include changing a multitude of errors or a single error. For example, one may choose to reduce a multitude of errors including angle error and compensation error, which choose to leave the sources of random noise error unaltered. Based on these improved options, the production is run, as shown at block 129. Alternatively, the manufacturer can iteratively determine yield rates by changing the process conditions and the factors for the MLBs. Through these iterations, the manufacturer can determine, prior to production, the costs involved in producing MLBs with a certain yield under certain process conditions.

During production, the sources of registration error may be estimated, as shown at block 130. These sources of registration error may be obtained based on measurements taken during production. And, these measurements of the production may be taken at random, or they may be taken at periodic intervals. For example, if the primary source of angle and offset error is from the post etch punch machine, the output of the machine may be examined (either at random intervals or at predetermined times) to determine the angle and offset errors. In addition, compensation error may be estimated by examining the boards after lamination. And, if the primary source of random noise error is from the drill machine, the output of the drill machine may be examined to determine random noise error. Based on the measurements, the sources of registration error may be estimated. This estimate can take a variety of forms including a distribution with a mean and a standard deviation.

Based on the measurements of the sources of registration error, the registration simulator may be run, as shown at block 131. By doing "what if" analysis or DOEs on the registration simulator, improvement paths and their associated costs can be analyzed and the best actions implemented that will reduce overall registration error. Further, additional errors can be found by direct comparison to production. For example, the registration simulator may also predict, with a particular DRA, the scrap rate. This estimate provides the manufacturer with a good indicator of the potential output of the production. For example, if the estimated scrap rate is much different from the actual scrap rate, then sources of error, in addition to those input to the registration simulator, are present. The registration simulator may finally predict the distribution of registration error for the production. As discussed previously, one format the sources of error may take is a distribution with a mean and a standard deviation. Thus, for each source of error (offset, angle, compensation and random noise error), there is a distribution. Using a Monte Carlo method, such as disclosed in McQuarrie, Gray, "Building Unbuildable Boards", *Printed Circuit Fabrication*, July 1988, pp. 70–79, which is hereby incorporated by reference, one may generate a distribution of the registration error in the production. Numbers may randomly be chosen from each of the sources of error distributions, input into the registration simulator, and have an output (either an average TPR or a highest TPR, etc.) based on the registration simulator. These outputs form the distribution of the registration error in the production, which may be compared to the actual distribution of registration errors in the production. If the two distributions (estimated and actual) are similar, then the estimates for the sources of error are valid. If the two distributions (estimated and actual) are dissimilar, there are additional sources of error not accounted for in the registration simulator.

As shown at block 132, the manufacturer may also run a design of experiments (DOE) in order to reduce registration error. Similar to running a DOE prior to production, the ranges of the source(s) of error are determined, as shown at block 133, the effect of the sources of error are determined, as shown at block 134, and improvements are recommended, as shown at block 135. These improvements are used to modify the production, as shown at block 136.

EXAMPLE 1

Figure 16:
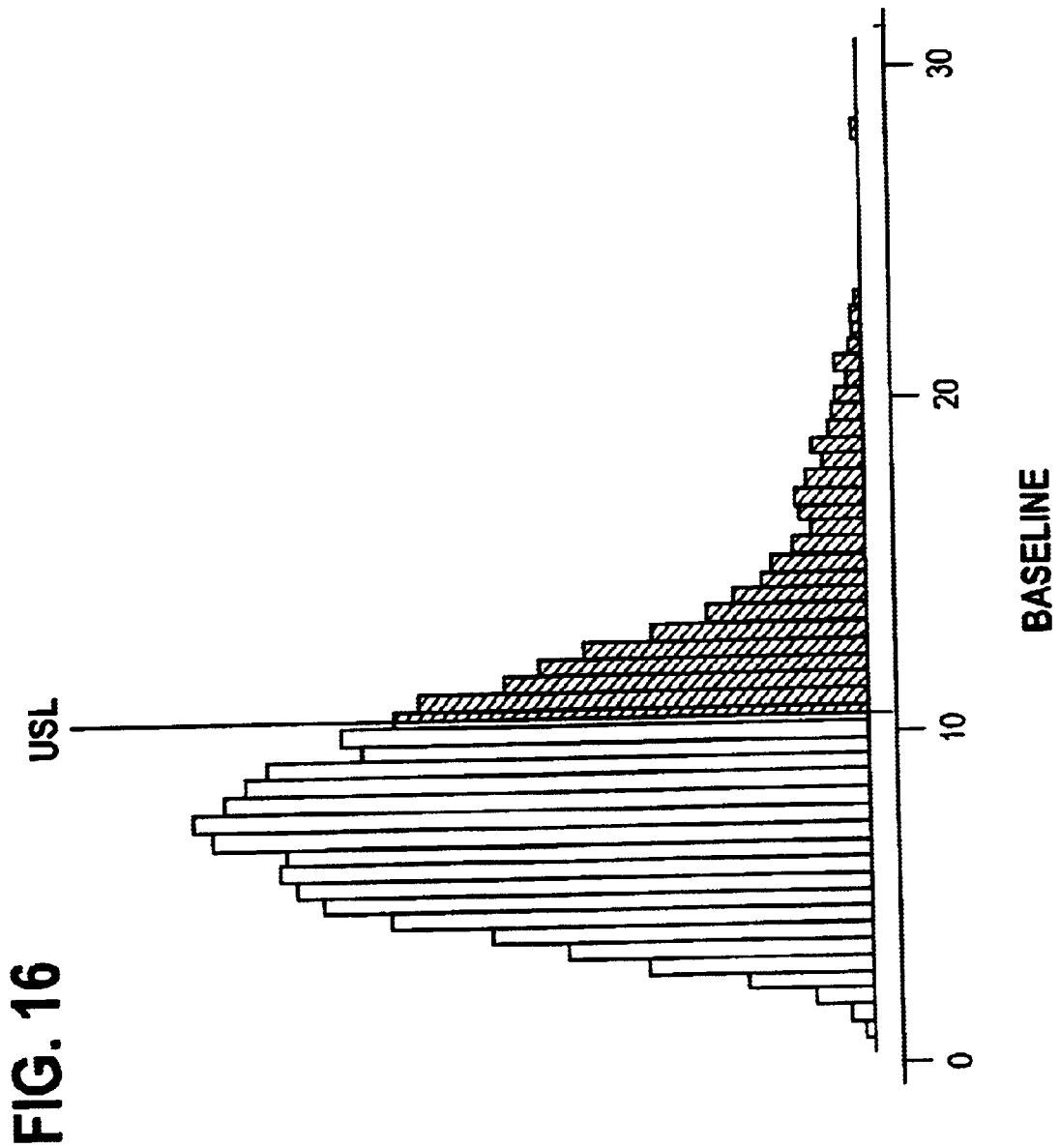
FIG. 16 is a graph of the baseline measurement results as a histogram.
Figure 17:
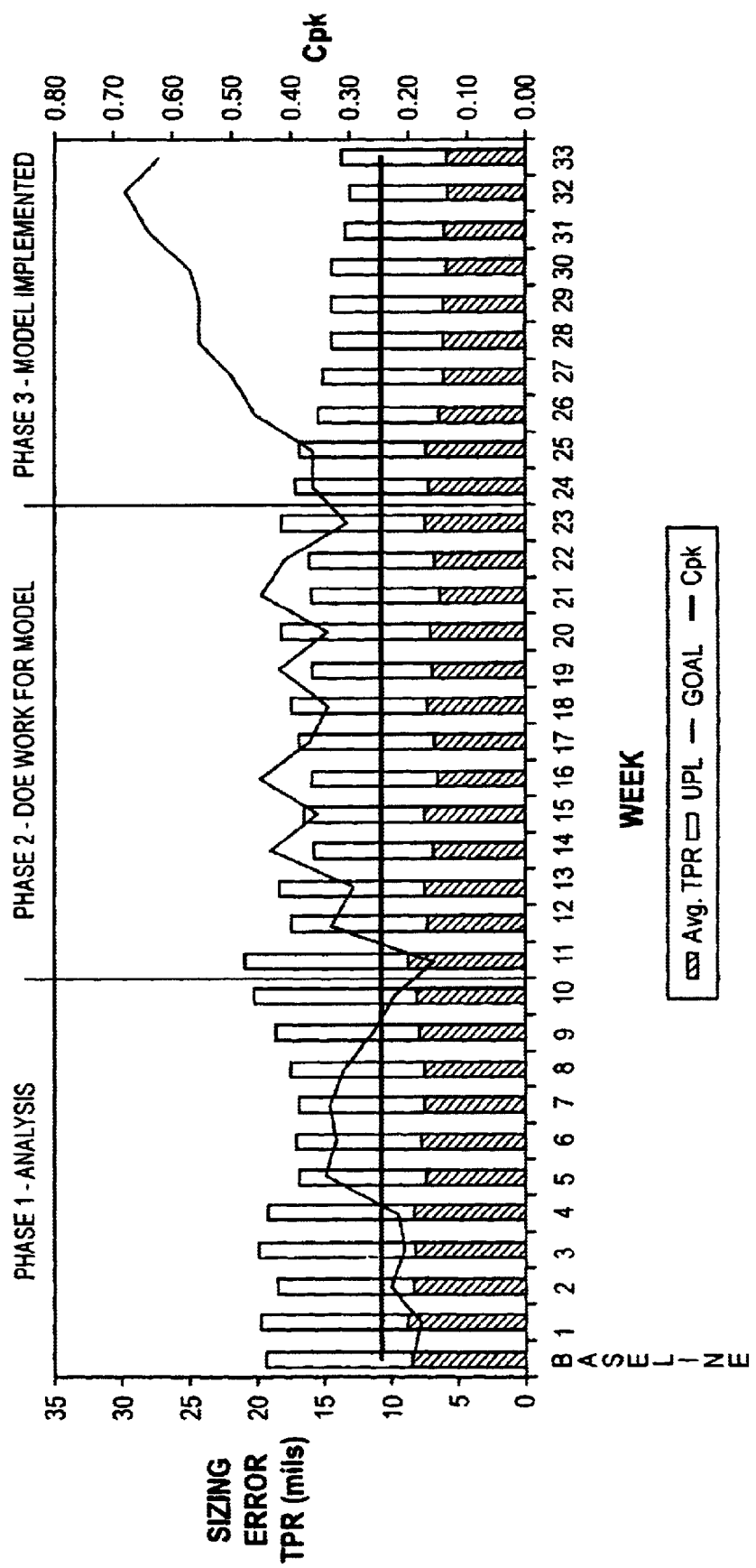
FIG. 17 is a histogram of the results of experiments conducted, including showing a history of the worst case TPR.

One example of a use of the compensation model is shown in FIGS. 16 and 17. FIG. 16 shows the baseline measurement results as a histogram. As an initial matter, a well-defined measurement is very important in order to determine improvement. The metric for compensation accuracy is defined as the maximum compensation TPR found between the layers of a multilayer board measured on a Fein Focus x-ray machine with a resolution of 0.1 mils. Referring to FIG. 16, the baseline was a population of 16,000 measured panels collected over a two month time frame (this was a representative fraction of actual production). The Upper Specification Limit (USL) was equal to 10.3 mils, which meant that any measurement greater than that was considered a failure. To put this goal in terms of compensation error, for a 24" by 18" board, 300 ppm of X-compensation error and 400 ppm of Y-compensation error would produce 5.1 mils of compensation error at the corners or 10.2 mils of total compensation TPR, which is an unoptimized compensation error.

A goal example might be to reduce 25% of the variation as defined by the histogram area. In order to quantify improvement, the variable CPK was used. CPK is defined as a capability index for a stable process according to the following equation:

$$Cpk=(USL-\mu)/(3*\sigma)$$

where $\mu$=Mean TPR $\sigma$=Standard Deviation

The goal was to have a maximum TPR population with a Cpk no less than 1 given a 10.3 mil upper specification limit.

Referring to FIG. 17, there is shown a record of a compensation improvement program. In that record is shown a history of the worst case TPR. The results shown in FIG. 16 are shown in FIG. 17 in the first bars and lines indicated by the "baseline" label on the X axis. On the Y axis on the left hand side is the sizing error for the TPR and on the right hand size is the Cpk. Indicated are the average TPR ($\mu$), the upper process limit (UPL) which is the average TPR plus three times the standard deviation ($\sigma$), the goal line which was the maximum TPR below 10.3 mils, and a Cpk calculated from the equation described above. Decreasing heights for the bars indicates improvement and an increasing positive slope for the Cpk likewise indicates improvement.

There are three phases indicated in FIG. 17. Phase 1 consisted of establishing the baseline and analyzing how the compensation process using the sizing matrix worked. Phase 2 consisted of implementing some items found in phase 1 and performing and analyzing the modeling Design of Experiments (DOEs). Phase 3 was the improvement phase realized from implementing the model built in phase 2. What is remarkable about the improvement seen in FIG. 17 was this improvement came from reducing the compensation errors on only three core types. Additional improvement may be gained by analyzing other cores in order to supplement the model.

FIG. 17 shows that improvements using the six sigma approach occur in steps. The nature of the six sigma process—measure, analyze, improve, control—means that results will not be immediate. In fact, it may take weeks or months until the investment in the time and resources pays off. FIG. 17 indicates that it took 26 weeks before significant improvement was realized, but the improvement was sudden when the correct actions were implemented. The ad hoc fire fighting approach may appear to produce results in the short term, but when examined over a long period of time seldom is their real improvement. The six sigma approach does not guarantee finding short cuts for success, but if the proper work is completed, real improvement paths will be found.

EXAMPLE 2

Another tool in the six sigma arsenal is the Failure Modes and Effects Analysis (FMEA). The process analysis has given us some goals:

Improve the angle error, with an axis of rotation about the center, to 0.0084 degrees maximum between cores.

Improve the compensation error in both the X and Y dimension to a maximum of 0.2 mils/inch.

Hold the offset errors to a maximum of +/−1 mil in both the X and Y dimensions.

After other actions have been taken, then consider reducing the drill stack height to 1 panel per spindle.

All of the items listed above represent challenges to any printed circuit board fabricator. For example, keeping the angles and offsets at the levels required for a 6.5 mil DRA is a major challenge. In the post etch punch area alone, this may require several modifications including refurbishing or replacing the die sets, precision table alignment, calibration of the cameras, cleaning or replacing motors and drive shafts, updating PM schedules, purchasing service contracts, purchasing special measurement equipment, a schedule for punch tests, and control charts on important parameters. The number of tasks that come to mind is daunting and not likely to occur without clear project management and support.

In order for improvement to occur, a team composed of plant personnel, engineers, and first line managers would be required with a charter that would champion the goals such as those listed in table 4. A process map and cause and effect diagram would be completed. This would bring all of the issues to the table to identify their location in the process, the outputs they effect, and their contribution to registration error.

After this work has been completed a failure modes and effects analysis (FMEA) can be applied. An example FMEA with post etch punch items is shown in FIG. 18. The FMEA considers each process inputs' severity, occurrence of the item failing, and the ability to detect and control the input within specification. From the FMEA the risk priority number (RPN) is computed. Ranking the RPNs tells the team the actions that need immediate attention. The team then returns to the FMEA and then records the actions to be completed, by whom, and by when. Further the improvement in severity, occurrence, and/or detectability is entered and the projected RPN improvement is computed. The FMEA is the focal point for improvement efforts that can be reviewed by upper management to determine the progress and the success of the project as well as whether there are adequate resources for the important items.

EXAMPLE 3

Figure 19:
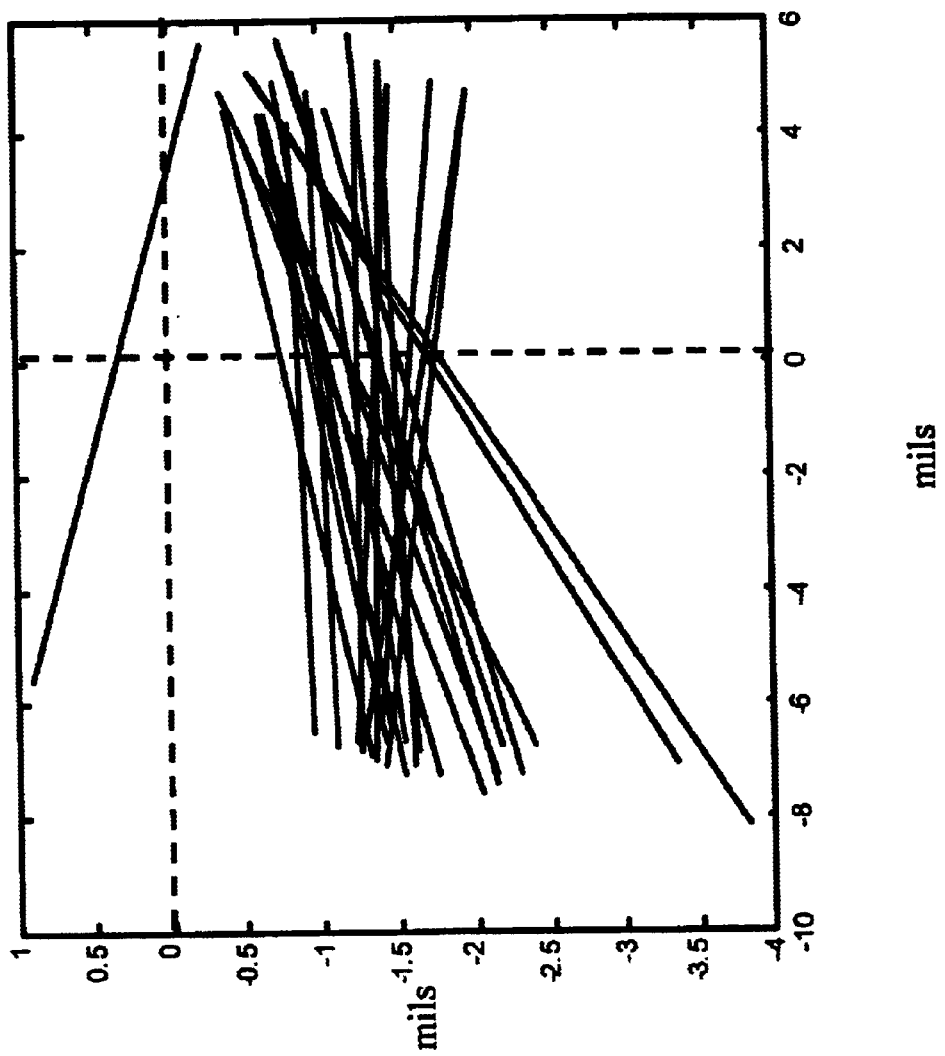
FIG. 19 is production data on 25 inner layer panels at a single post etch punch machine (PEP)

The sources of registration error, including the compensation, angle, offset and random noise error, should be estimated during the production in order to use the registration simulator. To see how this occurs, consider a real world example. FIG. 19 is actual production data on 25 inner layer panels at a single post etch punch machine (PEP). The panel layout was 3 circuits per panel. The board had a tight registration tolerance of 6.5 mil DRA. The cores punched in the figure were 4 mil cores with 1 ounce copper and signal images. A visual optical inspection system was used to measure the results of the punched cores. The intersection of the dashed lines show the correct optimized position that the PEP machine failed to achieve and the actual lines may be analyzed to determine the angle and offset error. For example, the slope of the lines relates to the angle error and the length of the line relates to the amount the material moved.

The worst panel had the following:

0.014 degrees of angle error.

−3 mils of X offset error.

−2.5 mils of Y offset error.

Figure 20:
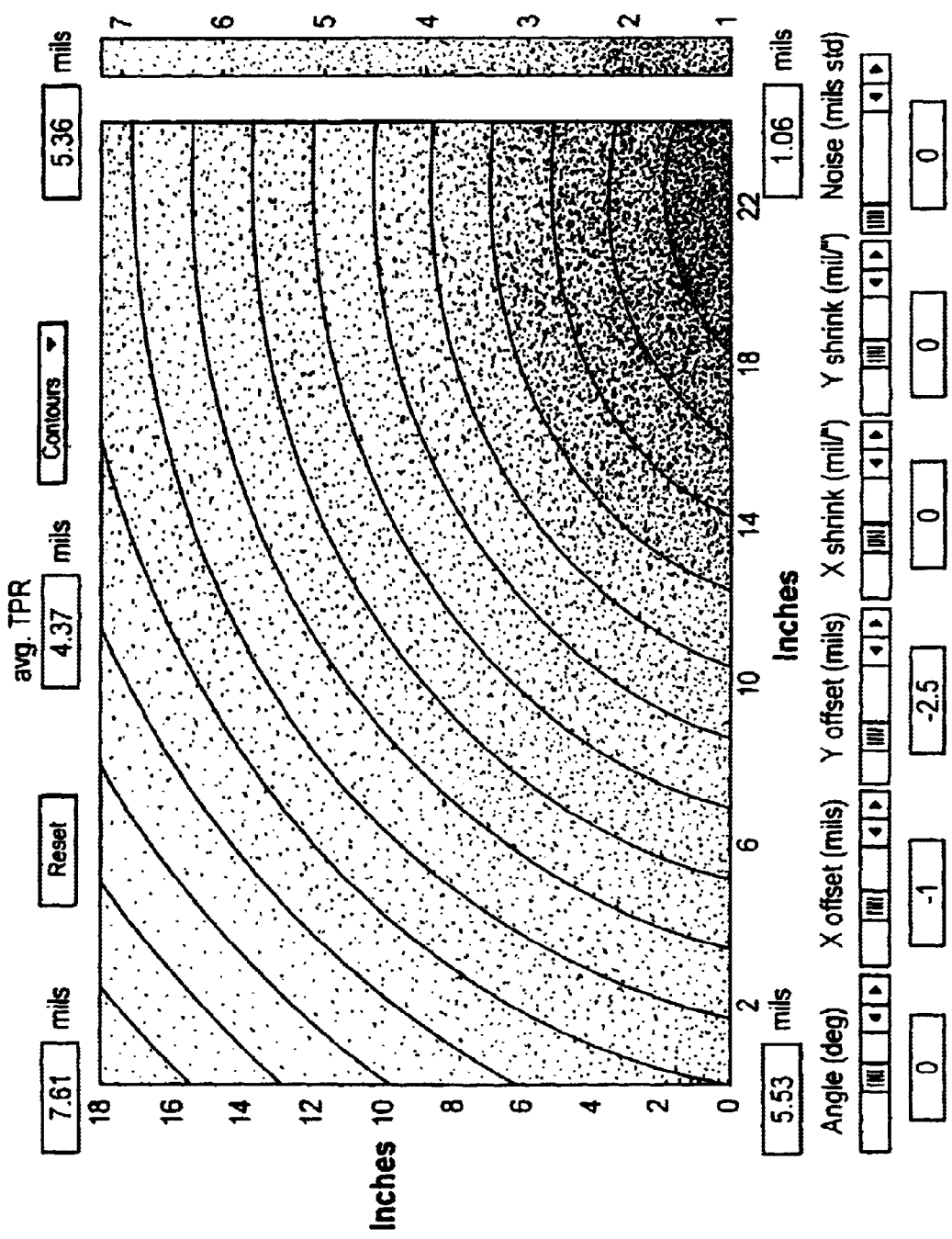
FIG. 20 is a contour plot of the output of the registration simulator showing the results over the panel surface from the combination of registration errors in one example.

For the angle error, the axis of rotation is assumed to be the center of the 18"×24" panel. FIG. 20 shows the result over the panel surface from the combination of these errors. The −1 mil offset shown in the figure was necessary to account for a centered angle error, which consumed 2 mils of positive X offset.

FIG. 20 shows the amount of error relative to the true position. The figure suggests that, with the DRA of 6.5 mils, at least a 66% yield would be possible (2 good circuits out of every 3) with the worst case scenario, provided that there were no other errors. Besides the other errors, there is another challenge. The errors in FIG. 19 shows random, offset and angle errors for the cores. This means that there will be core to core errors where the error between each core will at times be larger than the error of the core from the true position.

Referring to the example shown in FIGS. 19 and 20, an estimate of all of the production errors can be used to estimate final yield. For example, consider these inputs derived from FIG. 19:

On average, the angle between the cores is 0.012 degrees.

The average X offset error is −2 mils.

The average Y offset error is −1.5 mils.

The average X & Y compensation error is 0.33 mils/inch.

The random drilling noise from the small diameter drill bits has a 1 mil standard deviation (2 panels/spindle, new drill bits).

Figure 21:
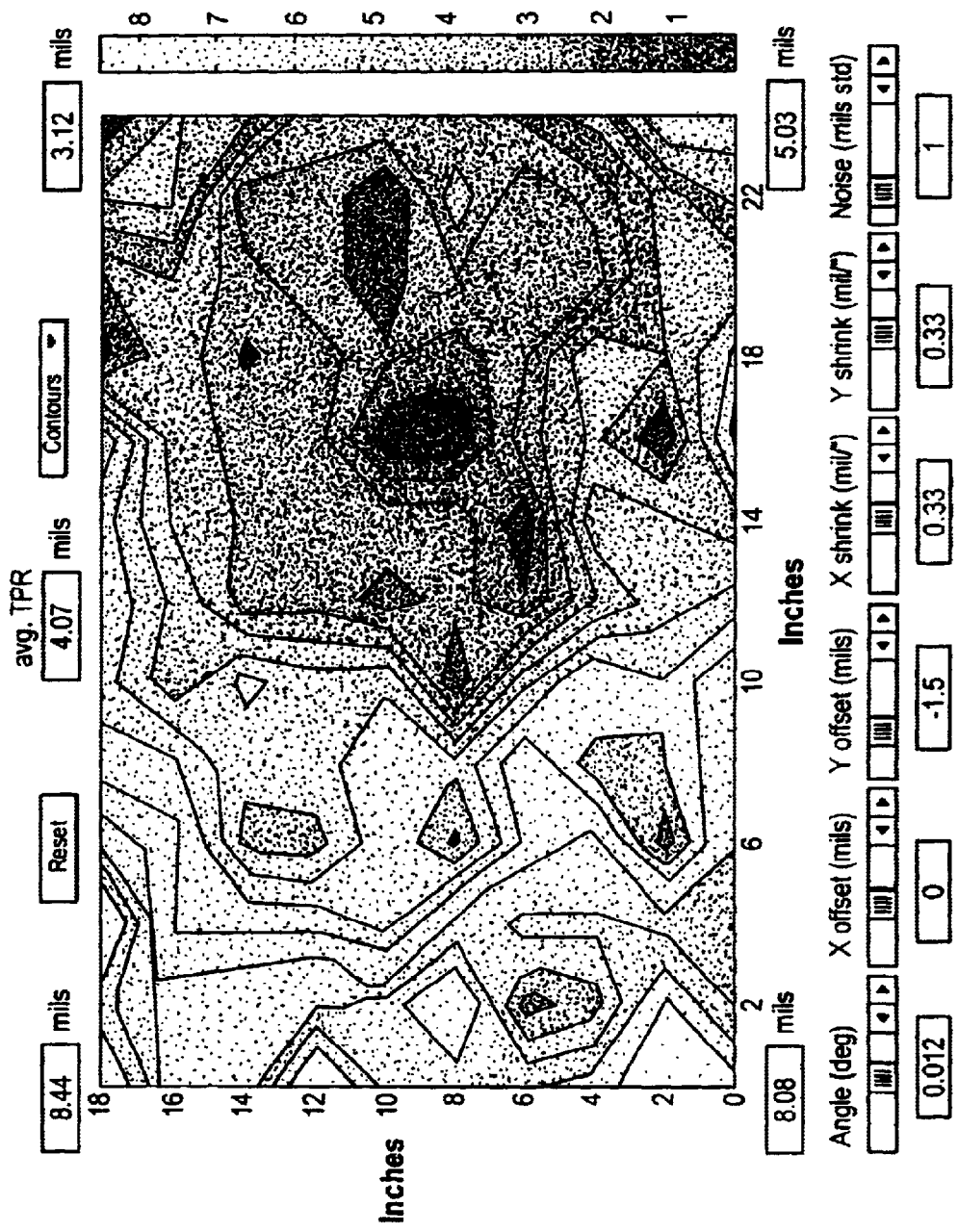
FIG. 21 is a contour plot of the output of the registration simulator showing the results over the panel surface from the combination of registration errors in a second example.

FIG. 21 shows the net result in a contour plot. The dark areas represent good registration and the light areas represent poor registration. The range in registration error over the panel surface is from 0 mils to over 8.4 mils. FIG. 21 shows with a 6.5 mil DRA that on average two circuits out of three will be good or there will be on average a 33% scrap rate. This estimate provides the manufacturer with a good indicator of the potential output of the production.

The actual scrap rate for this job varied from about 25% to 50% for a lot size of 40 panels. It is easy to assume that changes in scrap rate signify special causes. For example, when the scrap rate is 25%, the process may be thought to be improving and when the scrap rate is 50%, additional problems are evident. Knowing the average scrap rate of 33% and the lot size of 40 panels, the 95% confidence interval for the scrap rate based on a binomial distribution is from 18% to 56%. Scrap information by itself is not a sufficient indicator to predict whether the process is getting better or worse. Thus, analyzing seemingly large changes in scrap from one lot is unproductive.

Based on the registration simulator, the manufacturer can identify ways to reduce registration error. For example, FIG. 21 illustrates that yield is a strong function of panel size. Yields could rise dramatically if two circuits per panel on a smaller panel size or on the same panel size (with the added cost of additional material scrap) was the panel layout. To offset the added cost, the improvement in registration error might allow drilling two panels per spindle if only one panel per spindle were to be used on the larger panel size. If the panel size cannot change, the error mode affecting registration needs to be improved.

EXAMPLE 4

A systematic approach using six sigma tools offers a thorough understanding of what the long-term issues are and what can be done in the short term. The approach is:

Process Measurement

Process Analysis

Process Improvement

Process Control

This approach is based on the assumption that the sources of variation can be found and permanent improvements can be implemented and controlled.

Through design of experiments (DOE), a manufacturing shop can analyze and is then minimize the sources of registration error, both from a short-term and long-term perspective.

As can be seen from FIG. 19, process measurement is important in identifying the registration error modes and determining whether the registration errors behave randomly, are associated with a machine, a shift, an operator, the time of the day, week, month, or year. The measurements of the process variables provide the data required for the process analysis. Without data from careful measurements, the analysis is left to opinion and actions that are implemented fail to lead to real improvement.

Consider the previous example with the 18"×24" multi-layer board with 3 circuits per panel and a 6.5 mil DRA. With some data gathering, process analysis, and using the registration simulator, one can explore process improvement options. One way to use the simulator would be to explore different high and low settings one variable at a time. One of the most powerful tools in the six-sigma arsenal is design of experiments (DOE). A better way to explore the possibilities would be with a 32 run fractional factorial that included all two factor interactions. Table 3 shows the settings used in the experiment and FIG. 22 shows the results.

TABLE 3

| Variable Settings for DOE | | | |
| --- | --- | --- | --- |
| Variable | Low setting | High setting | % change |
| Angle | 0.005 deg | 0.012 deg | 58% |
| X offset | 0.5 mil | 1.0 mil | 50% |
| Y offset | 0.5 mil | 1.0 mil | 50% |
| X shrink | 0.2 mil/" | 0.33 mil/" | 39% |
| Y shrink | 0.2 mil/" | 0.33 mil/" | 39% |
| Noise | 0.4 mil std | 1 mil std | 60% |

Figure 22:
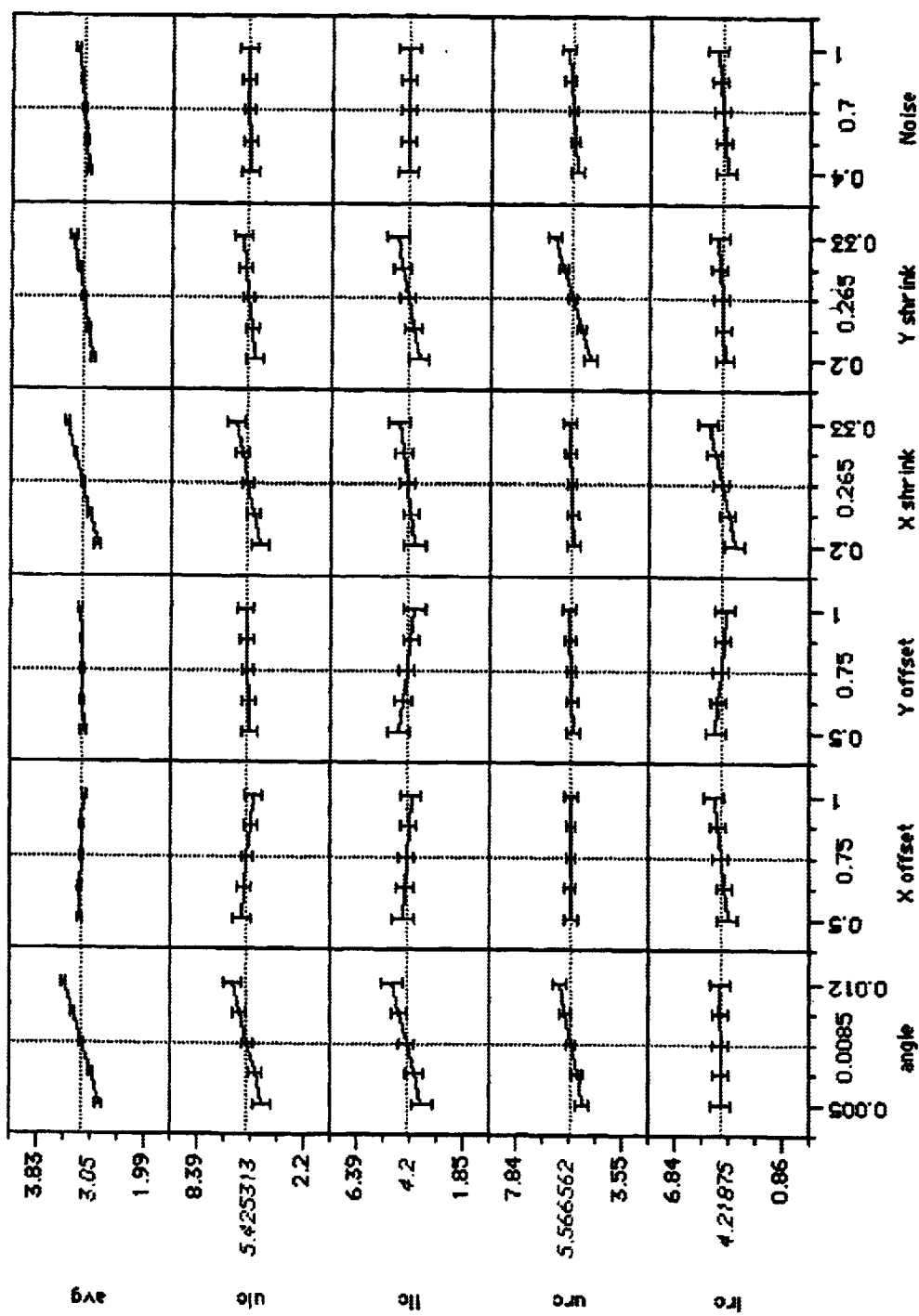
FIG. 22 is the results from the Design of Experiments (DOE) using the registration simulator.

Referring to FIG. 22, there is shown the results from the DOE using the registration simulator. In FIG. 22, going top to bottom by row are the outputs of the average (avg) TPR, the upper left corner (ulc) TPR, the lower left corner (llc) TPR, the upper right corner (urc) TPR, and the lower right corner (lrc) TPR. Going from left to right by column are the inputs of the angle, X offset, Y offset, X shrink, Y shrink, and Noise. From the graphs of FIG. 22, an upward sloping line indicates that the lower settings are better, a downward sloping line indicates that the higher settings are better, and the horizontal lines indicate no effect. The error bars about the line are the 95% confidence interval for the regression.

On a computer, the graphs in FIG. 22 are dynamic and the slope of the lines change with different variable settings because of the two factor interactions. Through the analysis of the DOE, one may rank the significance of the errors which contribute to overall registration error. For example, examining FIG. 22 at its current settings, the order of significant impact is angle, X shrink, Y shrink, and noise. Improvement of offset beyond 1 mil doesn't have a meaningful registration benefit.

Based on this information, one may examine the options in determining which errors to address. These options include changing a multitude of errors or a single error. For example, one may choose to reduce a multitude of errors including angle error and compensation error.

In addition, in the particular example, random error is not the focus of error reduction due to its lesser significance in comparison to angle and compensation error. Therefore, the amount of tolerance for random error is greater (i.e., processing that may require drilling one panel per spindle to achieve a 0.4 mil standard deviation of random noise error is not required; for the moment, the drill stack is kept at two panels per spindle and raising the noise to a 1 mil standard deviation). Allowing random error due to drill noise is a departure from the control every variable method in the special lot case. The six-sigma approach emphasizes variation reduction of the most significant error. In reality it is impossible to control every variable all of the time.

Instead, the focus is on the most meaningful steps that will lead to improvement. The recommended improvements are shown in table 4:

TABLE 4

| Recommended Improvements | | | |
| --- | --- | --- | --- |
| Variable | From | To | % Change |
| Angle | 0.012 deg | 0.0084 deg | 30% |
| X shrink | 0.33 mil/" | 0.2 mil/" | 39% |
| Y shrink | 0.33 mil/" | 0.2 mil/" | 39% |

The result from the registration simulator is an average TPR of 2.67 mils, an upper left corner TPR of 4.4 mils, a lower left corner TPR of 3.2 mils, an upper right corner TPR of 5.0 mils, and a lower right corner TPR of 4.03 mils. Even though all of the TPRs are below the DRA of 6.5 mils, the registration simulator only shows the result from one panel. Since there is random noise, results will vary from run to run (panel to panel).

EXAMPLE 5

Figure 23:
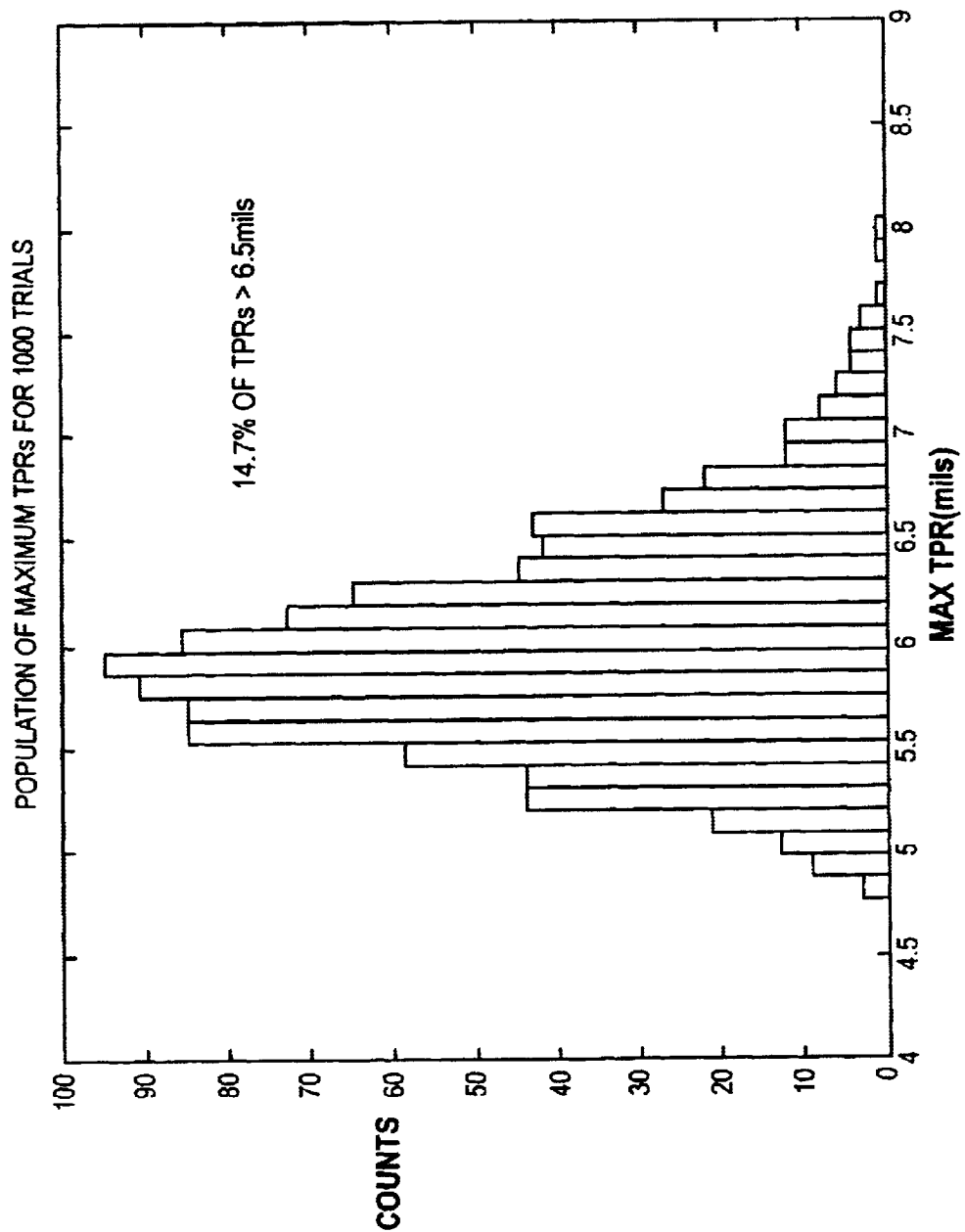
FIG. 23 is a histogram of the maximum TPR results from 1000 simulation runs.

Alternatively, if the focus of the DOE can be the changing of a single source of error. As one example, the source for random noise error may be analyzed by using the registration simulator. FIG. 23 is a histogram of the maximum TPR results from 1000 simulation runs. Each run consisted of taking the maximum TPR value over the 130 locations on the panel surface. Even though 14.7% of the panels had maximum values over a 6.5 mil DRA that doesn't necessarily indicate that there would be 14.7% scraped circuits. If 1000 simulation trials were done with the settings found in FIG. 21, 100% of the panels would have maximum TPR values over 6.5 mils. A better estimate of the scrap rate is 14.7%/3=4.5% projected scrap since 14.7% is the panel yield, but with three circuits per panel, the circuit yield is 4.5%.

Figure 24:
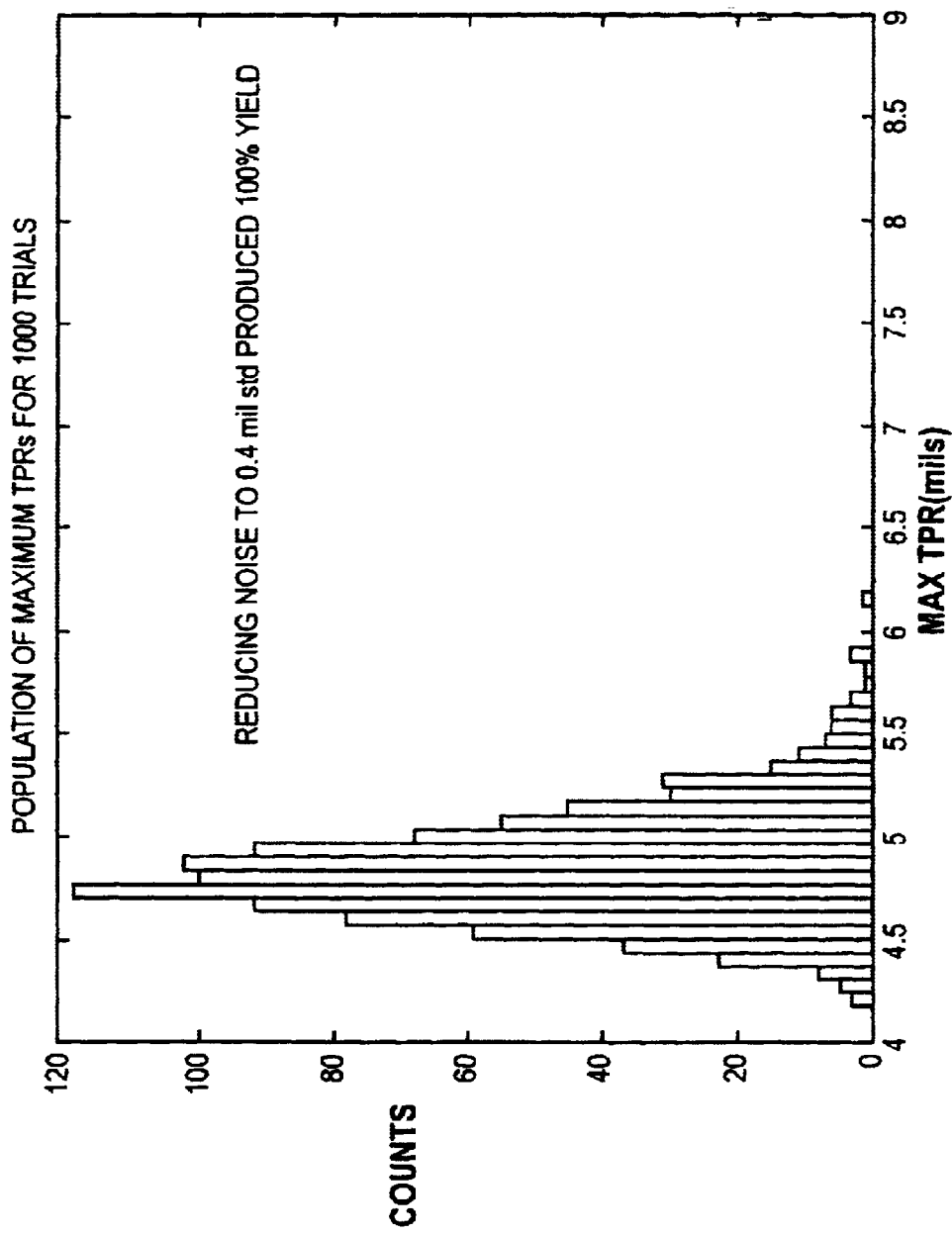
FIG. 24 is a histogram of the maximum TPR results from 1000 simulation trials after modification of processing of the printed circuit boards.

The random noise may be reduced and the effects on overall registration error may be analyzed. For example, if this board is drilled 1 panel per spindle, then the drill wander may be decreased to 0.4 mils standard deviation. FIG. 24 shows the maximum TPR results from 1000 simulation trials under these conditions. FIG. 24 shows that there is less scrap when the stack height was reduced. Based on the results, the operator may analyze whether the increased costs of drilling 1 panel per spindle is offset by the decrease in registration error. In addition, typically improving drilling by reducing stack height is a first move to improving registration yield; however, real improvement from this step will not be beneficial unless the other registration modes have small errors.

It is intended that the foregoing detailed description be regarded as illustrative rather than limiting and that it is understood that the following claims, including all equivalents, are intended to define the scope of the invention.

Appendix A

Consider the following design variables for an 8 layer board confined to four different prepreg styles (1080, 2113, 2116, 7628), 2 plies of prepreg between each core, 3 different core thickness (4 mil, 5 mil, 8 mil), and two different image types (signal, ground). Further, only balanced core thickness and prepreg combinations would be used. In particular, for an 8 layer board, the core 1 thickness= core 2 thickness and the prepreg must follow the same type and order about the centerline of the multilayer construction. This follows standard manufacturing practice. Further, the unbalanced nature of the circuit images is also standard manufacturing practice.

```
Outer Foil Copper
         Prepreg 1 (1080,2113,2116,7628)
         Prepreg 2
                  Layer 2 (S,G)
                                         Core 1 (4,5,8)
                  Layer 3
         Prepreg 3
         Prepreg 4
                  Layer 4
                                         Core 2
                  Layer 5
         Prepreg 4
         Prepreg 3
                  Layer 6
                                         Core 3
                  Layer 7
         Prepreg 2
         Prepreg 1
Outer Foil Copper
```

A variety of dielectric layers may be used. In the example above, the dielectric layer is composed of 2 different prepregs between the layers. Under these conditions there are 64 different image combinations ($2^6$), 256 different prepreg combinations ($2^8$), and 9 different core thickness combinations. The total number of possible combinations is 147,456 (256×64×9).

| Pattern | lyr2 | lyr3 | lyr4 | lyr5 | lyr6 | lyr7 | configuration |
|---------|------|------|------|------|------|------|---------------|
| 111111 | s | s | s | s | s | s | 5 |
| 111112 | s | s | s | s | s | g | 10 |
| 111121 | s | s | s | s | g | s | 10 |
| 111122 | s | s | s | s | g | g | 11 |
| 111211 | s | s | s | g | s | s | 8 |
| 111212 | s | s | s | g | s | g | 12 |
| 111221 | s | s | s | g | g | s | 12 |
| 111222 | s | s | s | g | g | g | 13 |
| 112111 | s | s | g | s | s | s | 8 |
| 112112 | s | s | g | s | s | g | 12 |
| 112121 | s | s | g | s | g | s | 12 |
| 112122 | s | s | g | s | g | g | 13 |
| 112211 | s | s | g | g | s | s | 1 |
| 112212 | s | s | g | g | s | g | 14 |
| 112221 | s | s | g | g | g | s | 14 |
| 112222 | s | s | g | g | g | g | 15 |
| 121111 | s | g | s | s | s | s | 10 |
| 121112 | s | g | s | s | s | g | 3 |
| 121121 | s | g | s | s | g | s | 3 |
| 121122 | s | g | s | s | g | g | 16 |
| 121211 | s | g | s | g | s | s | 17 |
| 121212 | s | g | s | g | s | g | 7 |
| 121221 | s | g | s | g | g | s | 7 |
| 121222 | s | g | s | g | g | g | 16 |
| 122111 | s | g | g | s | s | s | 17 |
| 122112 | s | g | g | s | s | g | 7 |
| 122121 | s | g | g | s | g | s | 7 |
| 122122 | s | g | g | s | g | g | 18 |
| 122211 | s | g | g | g | s | s | 19 |
| 122212 | s | g | g | g | s | g | 4 |
| 122221 | s | g | g | g | g | s | 4 |
| 122222 | s | g | g | g | g | g | 20 |
| 211111 | g | s | s | s | s | s | 10 |
| 211112 | g | s | s | s | s | g | 3 |
| 211121 | g | s | s | s | g | s | 3 |
| 211122 | g | s | s | s | g | g | 16 |
| 211211 | g | s | s | g | s | s | 17 |
| 211212 | g | s | s | g | s | g | 7 |
| 211221 | g | s | s | g | g | s | 7 |
| 211222 | g | s | s | g | g | g | 18 |
| 212111 | g | s | g | s | s | s | 17 |
| 212112 | g | s | g | s | s | g | 7 |
| 212121 | g | s | g | s | g | s | 7 |
| 212122 | g | s | g | s | g | g | 18 |
| 212211 | g | s | g | g | s | s | 14 |
| 212212 | g | s | g | g | s | g | 4 |
| 212221 | g | s | g | g | g | s | 4 |
| 212222 | g | s | g | g | g | g | 20 |
| 221111 | g | g | s | s | s | s | 11 |
| 221112 | g | g | s | s | s | g | 16 |
| 221121 | g | g | s | s | g | s | 16 |
| 221122 | g | g | s | s | g | g | 2 |
| 221211 | g | g | s | g | s | s | 13 |
| 221212 | g | g | s | g | s | g | 18 |
| 221221 | g | g | s | g | g | s | 18 |
| 221222 | g | g | s | g | g | g | 21 |
| 222111 | g | g | g | s | s | s | 13 |
| 222112 | g | g | g | s | s | g | 18 |
| 222121 | g | g | g | s | g | s | 18 |
| 222122 | g | g | g | s | g | g | 21 |
| 222211 | g | g | g | g | s | s | 15 |
| 222212 | g | g | g | g | s | g | 20 |
| 222221 | g | g | g | g | g | s | 20 |
| 222222 | g | g | g | g | g | g | 6 |

If the order of the cores with s/g doesn't matter and the 23 core and the 67 cores can be interchanged, then the combinations is reduced down to 21 configurations. Some examples: sg/sg/gs is the same as gs/gs/gs is the same as gs/sg/sg; gs/gg/gg is the same as gg/gg/sg is the same as gg/gg/gs.

The configurations can be derived from the 4 configurations in the experimental design. The 4 configurations are:

|         | Core 1     | Core 2     | Core 3     |
|---------|------------|------------|------------|
| config1 | ss/gg/ss   | ss         | gg         | ss |
| config2 | gg/ss/gg   | gg         | ss         | gg |
| config3 | gs/ss/sg   | gs         | ss         | sg |
| config4 | gs/gg/sg   | gs         | gg         | sg |
| config5 | ss/ss/ss   | config1    | config3    | config1 |
| config6 | gg/gg/gg   | config2    | config4    | config2 |
| config7 | gs/gs/sg   | avg(c3,c4) | avg(c3,c4) | avg(c3,c4) |
| config8 | ss/gs/ss   | config1    | avg(c3,c4) | config1 |
| config9 | gs/gs/gg   | config2    | avg(c3,c4) | config2 |
| config10| gs/ss/ss   | config1    | config3    | config3 |
| config11| gg/ss/ss   | config1    | config2    | config2 |
| config12| gs/gs/ss   | avg(c3,c4) | avg(c3,c4) | config1 |
| config13| ss/gs/gg   | config1    | avg(c3,c4) | config2 |
| config14| ss/gg/sg   | config1    | config4    | config4 |
| config15| ss/gg/gg   | config1    | config4    | config2 |
| config16| gs/ss/sg   | config3    | config2    | config2 |
| config17| ss/gs/gs   | config1    | avg(c3,c4) | avg(c3,c4) |
| config18| gs/gs/gg   | avg(c3,c4) | avg(c3,c4) | config2 |
| config19| gs/gg/ss   | config4    | config4    | config1 |
| config20| gs/gg/gg   | config4    | config4    | config2 |
| config21| gg/sg/gg   | config2    | config4    | config2 |

We claim:

1. A method for modeling compensation during registration of a printed circuit board, the method comprising the steps of:
   providing a plurality of printed circuit boards with multiple cores which use at least one dielectric layer in between the cores;
   measuring the movement of least one core of each printed circuit board due to fabrication; and
   generating a compensation model based on the core movement and based on the at least one dielectric layer.

2. A method for modeling compensation as claimed in claim 1 wherein the core has an x and a y direction and wherein the step of measuring the movement of at least one core includes measuring the movement in the x and in the y direction.

3. A method for modeling compensation as claimed in claim 2 wherein the printed circuit boards have inner and outer cores and wherein the step of measuring the movement of at least one core includes measuring the movement in the x and in the y direction on the inner cores and the outer cores.

4. A method for modeling compensation as claimed in claim 2 wherein the step of generating a compensation model includes averaging of the measurements of the movement in the x and in the y direction.

5. A method for modeling compensation as claimed in claim 1 wherein the at least one dielectric layer includes a plurality of prepregs and wherein the compensation model is based on the measuring of movement of at least one core of the printed circuit boards and based on the prepregs.

6. A method for modeling compensation as claimed in claim 1 wherein the at least one dielectric layer includes a plurality of prepregs with different resin percentages and wherein the compensation model is based on the measuring of the movement of at least one core of the printed circuit boards and based on the prepregs with different resin percentages.

7. A method for modeling compensation as claimed in claim 1 wherein the core is rectangular in shape with four corners and wherein the step of measuring the movement of at least one core includes measuring the movement on the four corners of the core.

8. A method for modeling compensation as claimed in claim 1 wherein the step of generating a compensation model includes generating a table based on the experiments.

9. A method for modeling compensation as claimed in claim 1 wherein the step of generating a compensation model includes generating an equation with a series of coefficients.

10. A method for modeling compensation as claimed in claim 1 wherein the step of generating a compensation model includes generating a graph of the movement of the cores.

11. A method for modeling compensation as claimed in claim 1 wherein the printed circuit boards have circuits as layers on the cores and wherein the compensation model is based on the measuring of the cores of the printed circuit boards, the dielectric layers, and the circuits.

12. A method for modeling compensation as claimed in claim 11 wherein the circuits are selected from a group consisting of a signal, a ground, and a mixture of a signal and a group.

13. A method for modeling compensation as claimed in claim 1 wherein the step of measuring the cores is at predetermined times and wherein the step of generating the compensation model is based on the core movement, the at least one dielectric layer and the predetermined times.

14. A method for modeling compensation as claimed in claim 1 wherein the at least one dielectric layer may be selected from several types of dielectric layer and wherein the compensation model is based on the type of dielectric layer.

15. A method for modeling compensation as claimed in claim 14 wherein the types of dielectric layers include types of prepreg.

16. A method for modeling compensation as claimed in claim 1 wherein a core is in between a first dielectric and a second dielectric,
   wherein the first dielectric is of a different type than the second dielectric, and
   wherein the compensation model is based on the first and second dielectric.

17. A method for modeling compensation as claimed in claim 1 wherein the dielectric layer includes a bonding material, and
   wherein the compensation model is based on the bonding material.

18. A method for modeling compensation as claimed in claim 17 wherein the compensation model is based on an amount of bonding material.

19. A method for modeling compensation as claimed in claim 17 wherein the bonding material is a resin and wherein the compensation model is based on a percentage of resin in the dielectric layer.

20. A method for modeling compensation as claimed in claim 1 wherein the dielectric layer is formed based on a number of plies of a dielectric material.

21. A method for modeling compensation as claimed in claim 20 wherein the dielectric material is prepreg.

22. A method for modeling compensation as claimed in claim 1 wherein the printed circuit board is cured, and
   wherein the compensation model is based on the curing of the printed circuit board.

23. A method for modeling compensation as claimed in claim 22 wherein the curing of the printed circuit board may be performed at a high or a low rate and
   wherein the compensation model is based on whether the curing of the printed is performed at a high or a low rate.

24. A method for modeling compensation as claimed in claim 1 wherein the core includes a circuit, and wherein the compensation model is based on the circuit.

25. A method for modeling compensation as claimed in claim 1 wherein at least one of the cores has a first side and a second side;
  wherein the first side and the second side have circuits; and
  wherein the compensation model is based on the circuits on the first side and the second side.

26. A method for modeling compensation as claimed in claim 1 wherein the cores have a first side and a second side;
  wherein a first core has circuits on its first side and second side;
  wherein a second core has circuits on its first side and second side;
  wherein one of the circuits on the first core is separated from one of the circuits on the second core by a dielectric layer, and
  wherein the compensation model is based on the circuits on the first core and the second core.

27. A method for modeling compensation during registration of a printed circuit board, the method comprising the steps of:
  providing printed circuit boards with multiple cores with dielectric layers in between the cores, the cores having positions in the printed circuit boards;
  measuring the movement of the cores due to fabrication of the printed circuit boards; and
  generating a compensation model based on the core movement and based on the position of the cores in the printed circuit board.

28. A method for modeling compensation as claimed in claim 27 wherein the positions include outer cores and inner cores and wherein the step of generating a compensation model includes generating the compensation model based on whether the core is an outer or an inner core.

29. A method for modeling compensation as claimed in claim 27 wherein the compensation model is further based on the dielectric layers in between the cores.

30. A method for modeling compensation during registration of a printed circuit board, the method comprising the steps of;
  providing printed circuit boards having at least a first core and a second core, with circuit layouts on at least one side of the first core and on at least one side of the second core;
  measuring the cores of the printed circuit boards after fabrication in order to measure movement of each core; and
  generating a compensation model based on the measuring of the cores of the printed circuit boards and based on the circuit layouts on at least one side of the first core and on at least one side of the second core.

31. A method for modeling compensation as claimed in claim 30 wherein the circuit layout is selected from a group consisting of a signal a ground, and a mixture of a signal and a ground.

32. A method for modeling compensation as claimed in claim 30 wherein the circuit layouts are of certain types and wherein the compensation model is based on the types of circuit layouts.

33. A method for modeling compensation as claimed in claim 30 wherein the circuit layouts includes conductive material and wherein the compensation model is based on amounts of conductive material in the circuit layouts.

34. A method for modeling compensation as claimed in claim 30 wherein the circuit layouts include conductive material with a thickness and wherein the compensation model is based on the thickness of conductive material.

35. A method for reducing compensation error during processing of a multilayer printed circuit board having multiple cores, circuits on the cores and dielectric layers in between the circuits, the method comprising the steps of:
  identifying at least one characteristic of the multilayer printed circuit board selected from the group consisting of position of the core in the multilayer printed circuit board, the dielectric layer, and circuits on adjacent cores;
  generating at least one compensation factor based on the at least one characteristic from a compensation model; and
  modifying the circuits based on the at least one compensation factor.

36. A method for reducing compensation error as claimed in claim 35 wherein the at least one characteristic includes the type of dielectric layers.

37. A method for reducing compensation error as claimed in claim 36 wherein the at least one characteristic include types of prepreg.

38. A method for reducing compensation error as claimed in claim 35 wherein a core is in between a first dielectric and a second dielectric,
  wherein the first dielectric is of a different type than the second dielectric, and
  wherein the compensation factor is based on the first and second dielectric.

39. A method for reducing compensation error as claimed in claim 35 wherein the dielectric layer includes a bonding material, and
  wherein the compensation factor is based on the bonding material.

40. A method for reducing compensation error as claimed in claim 39 wherein the compensation factor is based on an amount of bonding material.

41. A method for reducing compensation error as claimed in claim 39 wherein the bonding material is a resin and wherein the compensation factor is based on a percentage of resin in the dielectric layer.

42. A method for reducing compensation error as claimed in claim 35 wherein the multilayer printed circuit board is cure and
  wherein the compensation factor is based on the curing of the multilayer printed circuit board.

43. A method for reducing compensation error as claimed in claim 42 wherein the curing of the printed circuit board may be performed at a high or a low rate and
  wherein the compensation factor is based on whether the curing of the printed is performed at a high or a low rate.

44. A method for reducing compensation error as claimed in claim 35 wherein the position include an outer core and inner core, and
  wherein the compensation factor is based on whether the core is an outer or an inner core.

45. A method for reducing compensation error as claimed in claim 35 wherein the circuits on the adjacent cores are of certain types, and
  wherein the compensation factor is based on the types of circuit layouts.

46. A method for reducing compensation error as claimed in claim 35 wherein the circuits on the adjacent cores include conductive material, and wherein the compensation factor is based on amounts of conductive material in the circuits.

47. A method for reducing compensation error as claimed in claim 35 wherein the circuits on the adjacent cores include conductive material with a thickness, and wherein the compensation factor is based on the thickness of conductive material.

48. A method for reducing compensation error as claimed in claim 35 wherein at least one of the cores has a first side and a second side;

wherein the first side and the second side have circuits; and wherein the compensation factor is based on the circuits on the first side and the second side.

49. A method for reducing compensation error as claimed in claim 35 wherein the cores have a first side and a second side;

wherein a fist core has circuits on its first side and second side;

wherein a second core has circuits on its first side and second side;

wherein one of the circuits on the first core is separated from one of the circuits on the second core by a dielectric layer; and wherein the compensation factor is based on the circuits on the first core and the second core.

50. A device for simulating compensation errors in a multilayer printed circuit board having at least one dielectric layer, multiple cores, circuit configurations on the multiple cores, the device comprising:

a processor, a memory device electrically connected to the processor, the memory device including compensation error data comprising X and Y error measurements based on at least one characteristic of the multilayer printed circuit board selected from the group consisting of the at least one dielectric layer, position of the core in the stack, the circuit configurations on the multiple cores, assembly of the multilayer printed circuit board, and interaction between the core and the dielectric layer, and an output device for outputting at least a portion of the compensation error data to simulate compensation error.

51. The device of claim 50 wherein the memory device includes a matrix of compensation error data.

52. The device of claim 50 wherein the output device is a display.

53. The device of claim 52 wherein the display outputs a graphical representation of the compensation error data.

54. The device of claim 50 wherein the at least one dielectric layer may be selected from several types of dielectric layers.

55. The device of claim 50 wherein the at least one dielectric layer includes a bonding material, and wherein the compensation error data is based on the bonding material.

56. The device of claim 55 wherein the compensation error data is based on an amount of bonding material.

57. The device of claim 56 wherein the bonding material is a resin and wherein the compensation error data is based on a percentage of resin in the dielectric layer.

58. The device of claim 50 wherein the position of the core in the stack may be selected from an inner or an outer core.

59. The device of claim 50 wherein the circuit configurations on the multiple cores is based on whether the circuit is a signal, a ground, and a mixture of a signal and a ground.

60. The device of claim 50 wherein the circuit includes conductive material and wherein the circuit configurations on the multiple cores is based on the amount of conductive material.

61. A method of simulating errors during registration of a printed circuit board, the method comprising the steps of:

compiling at least a plurality of points on a layer in the multilayer printed circuit board;

modifying the position of the plurality of points based on an offset model, an angle model, a compensation model and a random noise model in order to create a modified position of the plurality of points; and outputting a comparison of the position of the plurality of points with the modified position of the plurality of points.

62. A method of simulating errors during registration as claimed in claim 61 wherein the step of outputting a comparison includes graphing the position of the plurality of points and the modified position of the plurality of points.

63. A method of simulating errors during registration of a printed circuit board, the method comprising the steps of:

determining true positions necessary to achieve perfect registration;

identifying at least two sources of errors which occur during registration;

combining the at least two sources of errors which occur during registration;

comparing the combining of the at least two sources of errors with the true positions wherein the step of comparing the combining with the true positions includes graphing positions corresponding to the combining of the at least two sources of errors and graphing the true positions.

64. A method of simulating errors during registration of a printed circuit board as claimed in claim 63 wherein the at least two sources of error are selected from the group consisting of offset error, angle error, compensation error and random noise.

65. A method of simulating errors during registration of a printed circuit board as claimed in claim 63 wherein the at least sources of error include compensation error, offset error and angle error.

* * * * *